United States Patent [19]
Egusa et al.

[11] Patent Number: 5,343,050
[45] Date of Patent: Aug. 30, 1994

[54] ORGANIC ELECTROLUMINESCENT DEVICE WITH LOW BARRIER HEIGHT

[75] Inventors: Syun Egusa; Yoko Watanabe, both of Yokohama, Japan

[73] Assignee: Kabushiki Kaisha Toshiba, Kawasaki, Japan

[21] Appl. No.: 884

[22] Filed: Jan. 5, 1993

[30] Foreign Application Priority Data

| Jan. 7, 1992 | [JP] | Japan | 4-001016 |
| Mar. 27, 1992 | [JP] | Japan | 4-068959 |
| Mar. 27, 1992 | [JP] | Japan | 4-071638 |
| Jul. 17, 1992 | [JP] | Japan | 4-190353 |

[51] Int. Cl.$^5$ ............... H01L 29/28; H01L 33/00
[52] U.S. Cl. ........................ 257/40; 257/103; 313/504; 313/507; 313/509
[58] Field of Search ............ 257/40, 103; 313/504, 313/507, 509

[56] References Cited

U.S. PATENT DOCUMENTS

| 4,720,432 | 1/1988 | VanSlyke et al. | 257/40 |
| 5,093,691 | 3/1992 | Utsugi et al. | 257/103 |
| 5,093,698 | 3/1992 | Egusa | 257/40 |
| 5,105,233 | 4/1992 | Egusa | 257/40 |
| 5,126,214 | 6/1992 | Tokailin et al. | 313/504 |
| 5,151,629 | 9/1992 | VanSlyke | 313/504 |

FOREIGN PATENT DOCUMENTS

| 57-51781 | 3/1982 | Japan . |
| 61-62580 | 3/1986 | Japan . |
| 62-222669 | 9/1987 | Japan | 257/40 |
| 03151667 | 6/1991 | Japan | 257/40 |

OTHER PUBLICATIONS

Applied Physics Letters, vol. 56, p. 799, C. Adachi, et al., Sep. 4, 1984, "Blue Light–Emitting Organic Electroluminescent Devices."

Primary Examiner—Rolf Hille
Assistant Examiner—Mahshid Saadat
Attorney, Agent, or Firm—Oblon, Spivak, McClelland, Maier & Neustadt

[57] ABSTRACT

There is disclosed an organic electroluminescent device, comprising a multilayered structure of an organic film for electron injection, and an organic film for hole injection, at least one of which consists of a plurality of layers, and an organic film serving as a light-emitting layer interposed therebetween, a first electrode for electron injection formed on the side of the organic film for electron injection of the multilayered structure, and a second electrode for hole injection formed on the side of the organic film for hole injection of the multilayered structure, wherein a barrier height against electron injection at each interface between layers present from the first electrode to the organic film serving as the light-emitting layer is not more than 0.6 eV, and a barrier height against hole injection at each interface between layers present from the second electrode to the organic film serving as the light-emitting layer is not more than 0.6 eV.

10 Claims, 17 Drawing Sheets

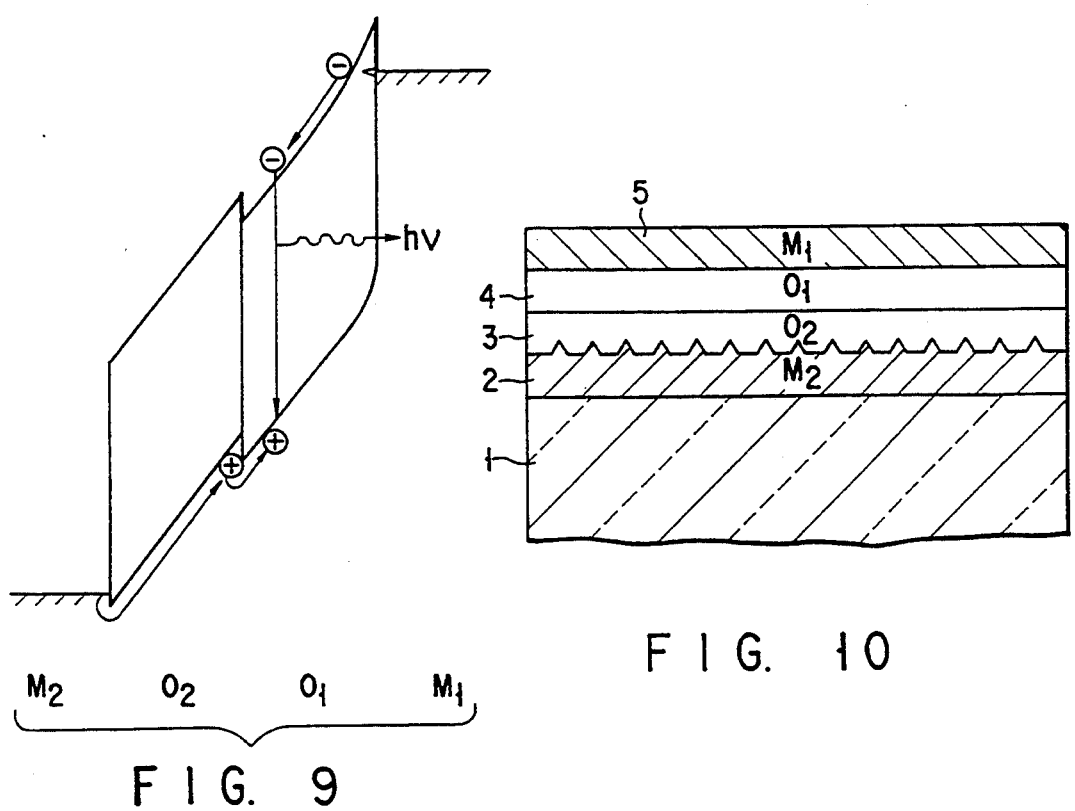
FIG. 9
FIG. 10
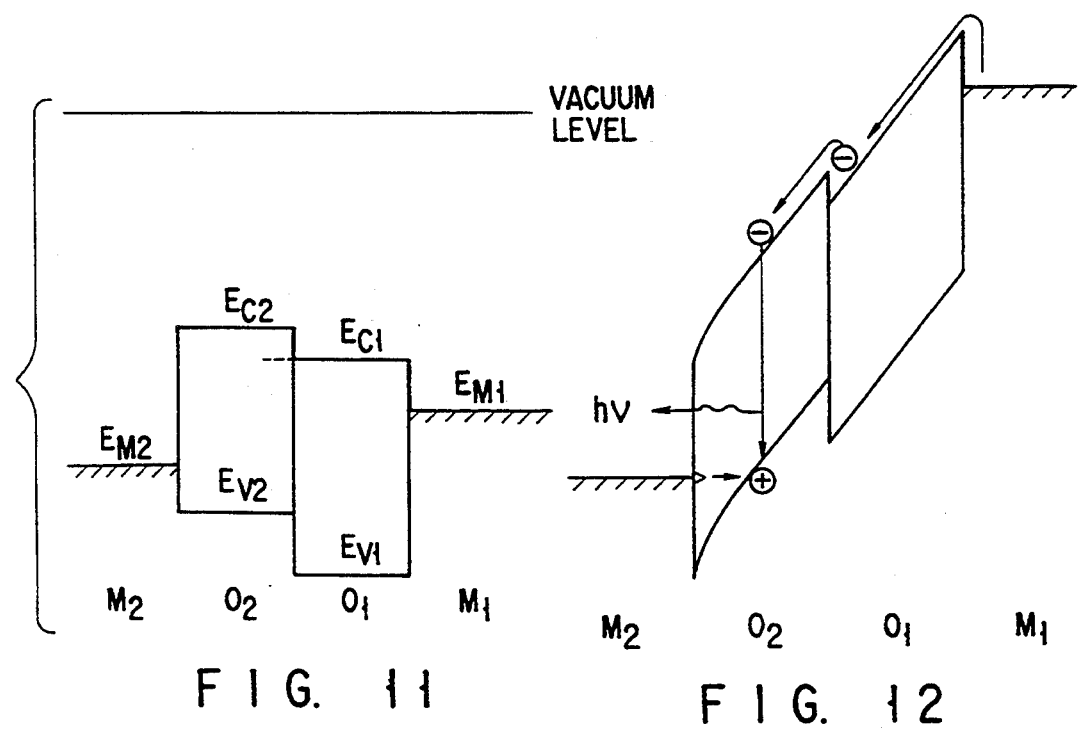
FIG. 11
FIG. 12

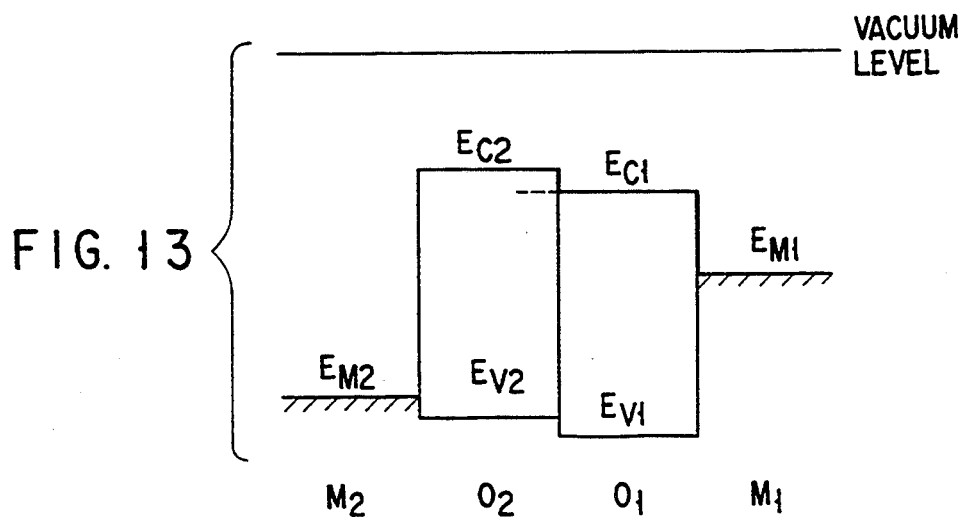
FIG. 13
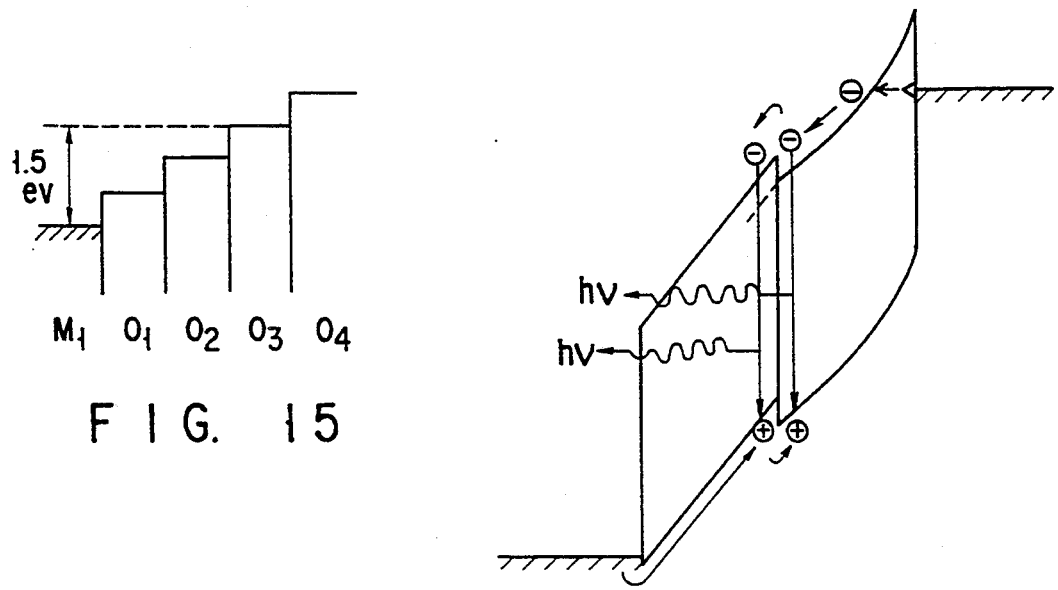
FIG. 15
FIG. 14
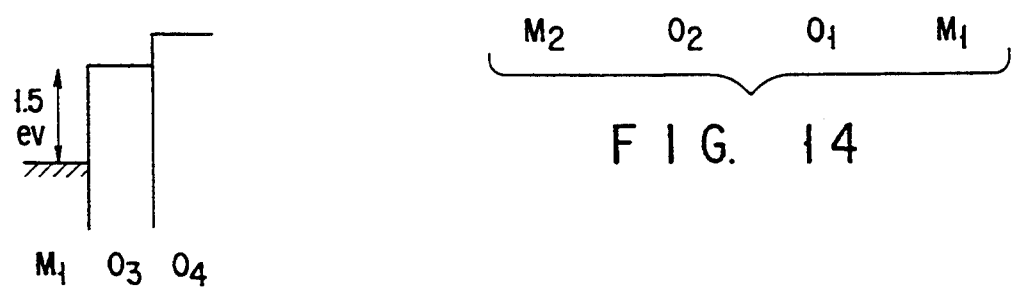
FIG. 16

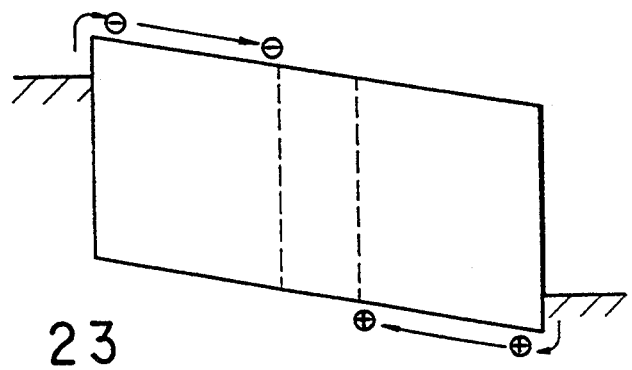
F I G. 23
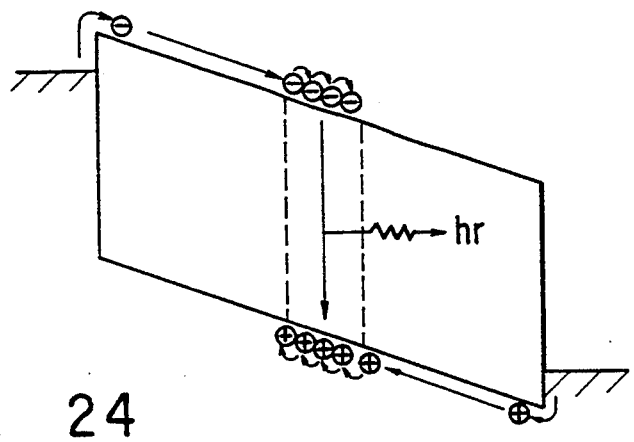
F I G. 24
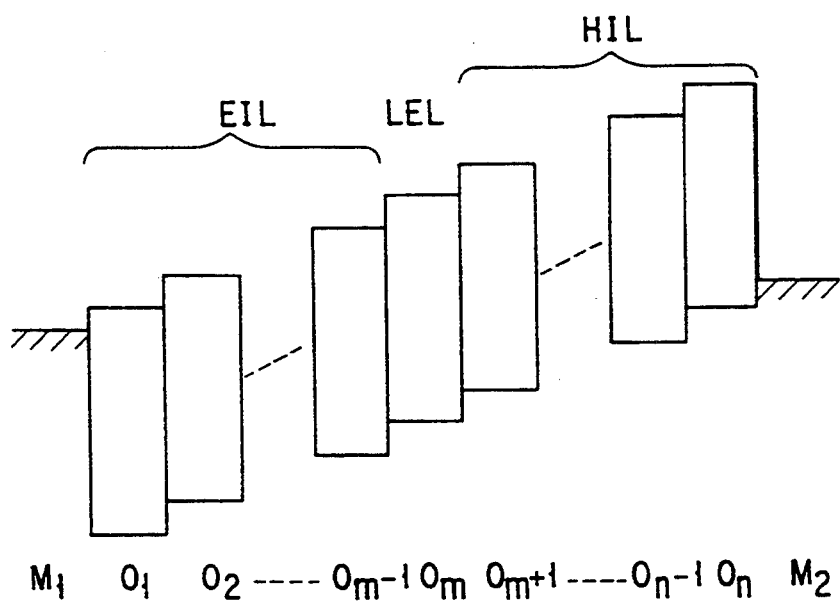
F I G. 25

$m_1\ m_2 m_1 m_2 m_1 m_2 m_1 m_2 m_1 m_2 m_1$

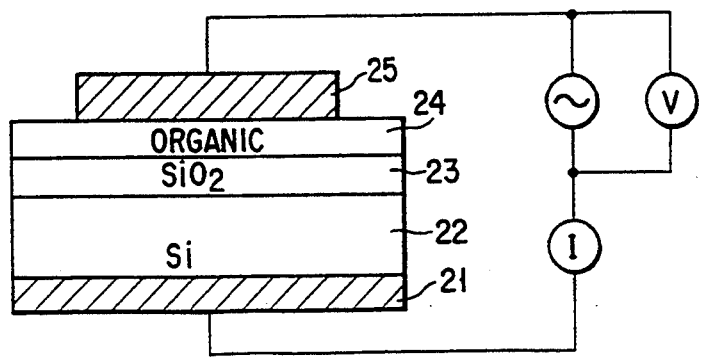
FIG. 29A
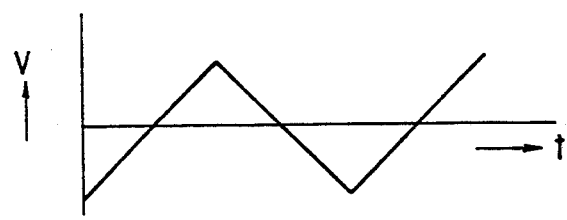
FIG. 29B
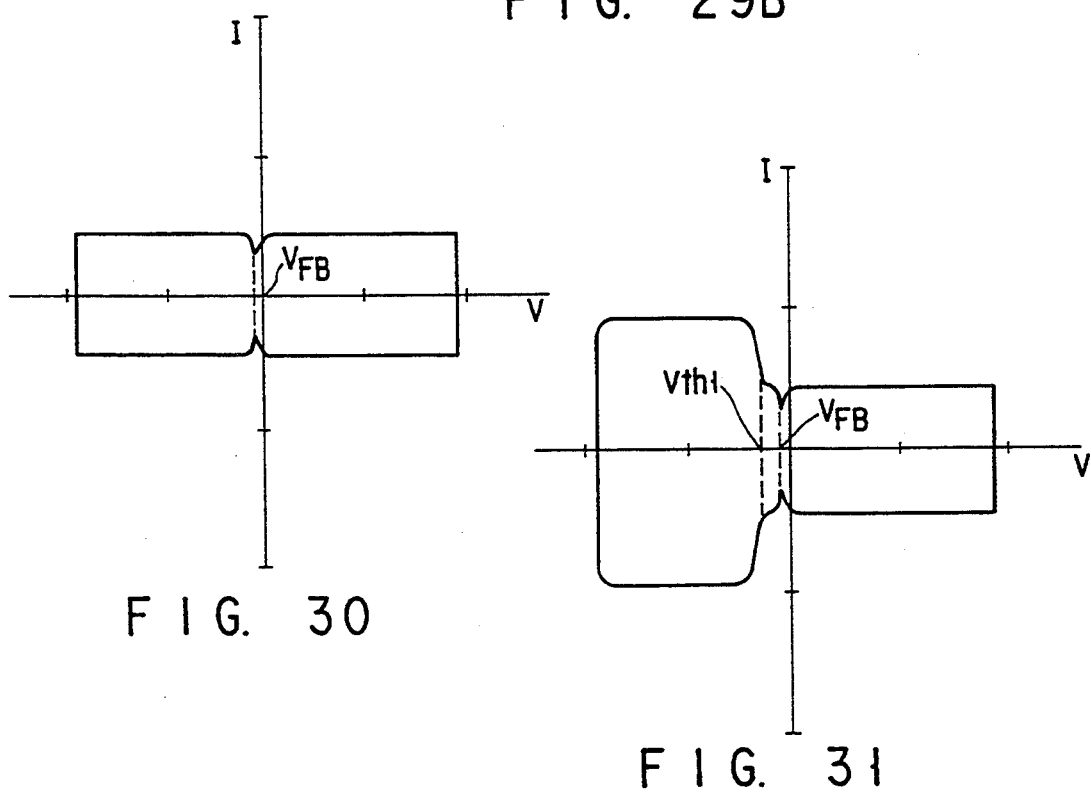
FIG. 30
FIG. 31

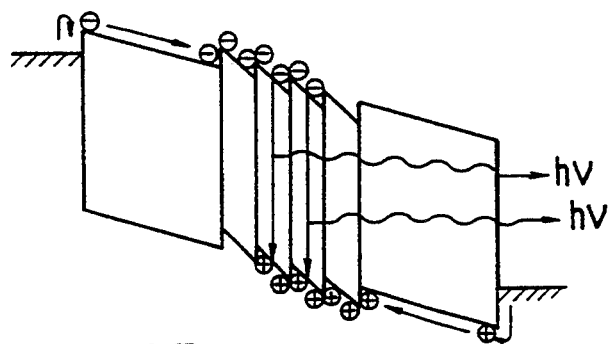
F I G. 43
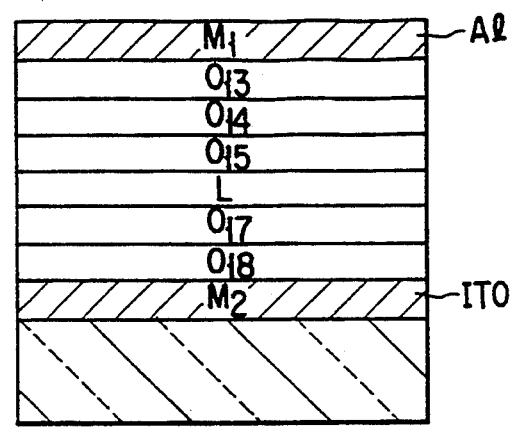
F I G. 44
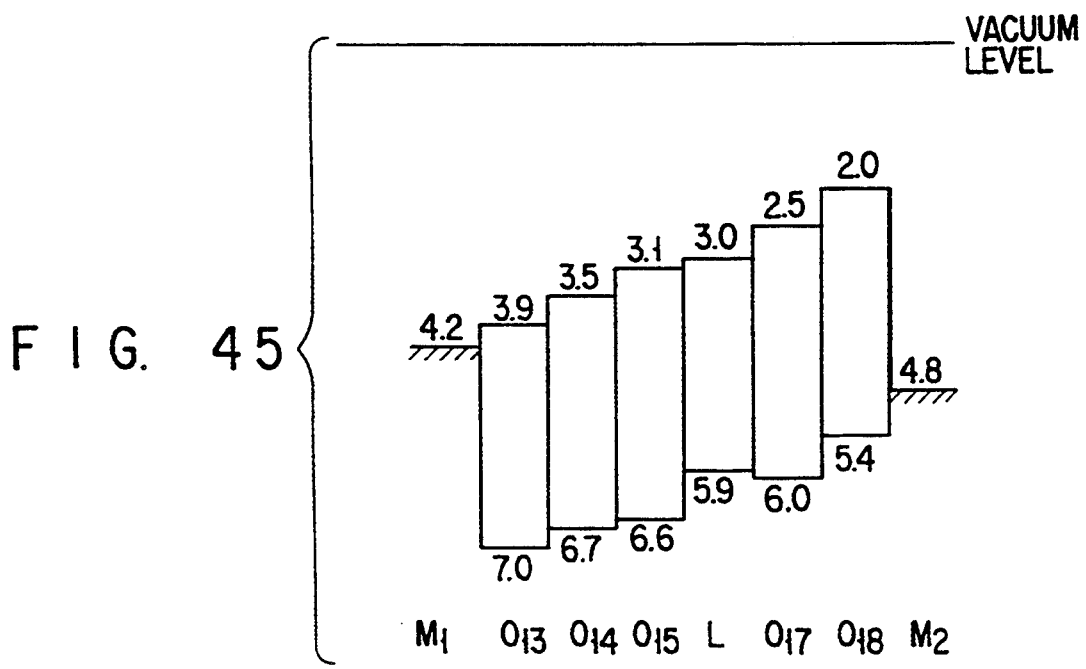
F I G. 45

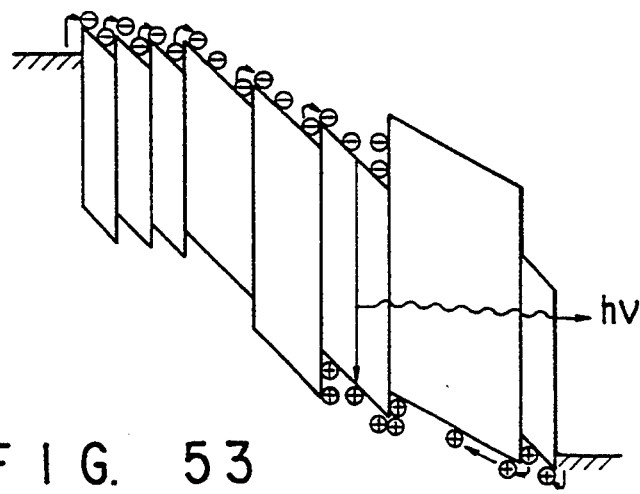
F I G. 53
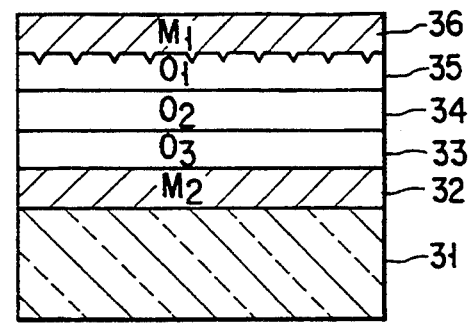
F I G. 54
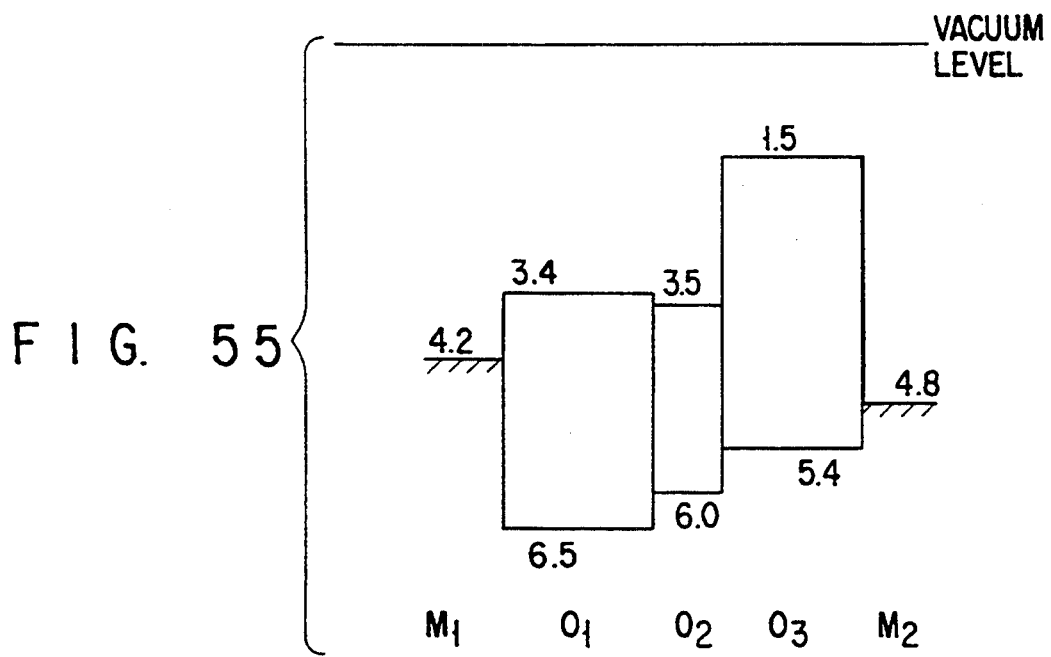
F I G. 55

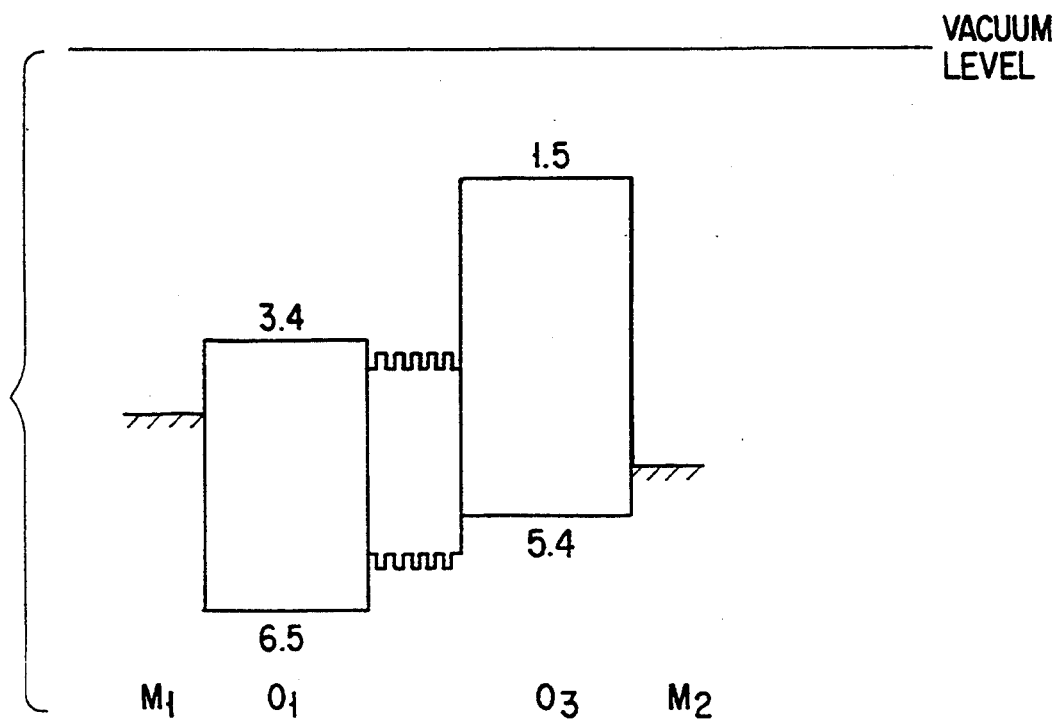
F I G. 58
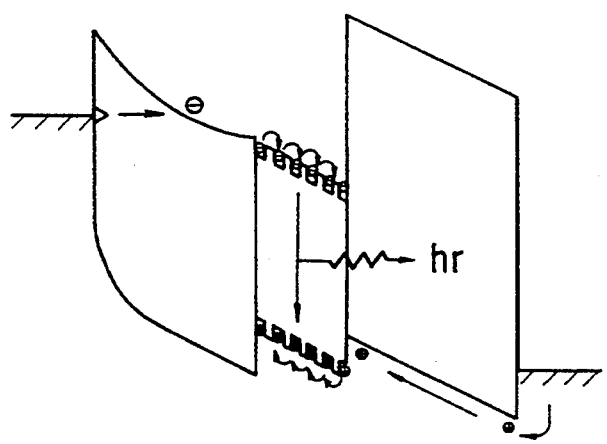
F I G. 59

ORGANIC ELECTROLUMINESCENT DEVICE WITH LOW BARRIER HEIGHT

BACKGROUND OF THE INVENTION

1. Field of the Invention

The present invention relates to an electroluminescent device (EL device) using an organic film containing an organic coloring material.

2. Description of the Related Art

In recent years, the research and development of organic EL devices used as display and illumination devices have flourished. For example, Shogo Saito, the Kyushu University, reported an EL device having an organic two-layered structure using metal electrode/aromatic coloring material/polythiophene/metal electrode (J.J. Appl. Phys., 25, L773, 1986). In this device, however, the thickness of the organic film is 1 μm or more, and a voltage applied to the device is as high as 100 V or more. To the contrary, C. W. Tang et al., Eastman Kodak, reported an EL device having an organic two-layered structure of Mg-Ag/Alq$_3$./diamine/ITO (Appl. Phys. Lett., 51, 913, 1987). According to this report, the thickness of the organic film is set to be 100 nm or less to drive the device at a voltage of 10 V or less, thereby obtaining a device having a practically sufficient luminance. The above EL devices have the following characteristic features. An electron injection coloring material is combined with a hole injection coloring material to obtain an organic two-layered structure. The thickness of the organic film is minimized, a metal electrode having a low work function is used for electron injection, and an organic material formed by vacuum deposition or sublimation is selected to prevent electrical defects in fabrication of the EL device. In addition, Shogo Saito, the Kyushu University, proposed a device having an organic three-layered structure of electron injection layer/light-emitting layer/hole injection layer. In this structure, high-luminance emission can be obtained by employing an organic material having a high photoluminescence as a light-emitting layer (J.J. Appl. Phys., 27, L269, 1988).

C. Adachi, T. Tsutsui, and S. Saito (Appl. Phys. Lett., 56, 799 (1990)) proposed a device having an organic three-layered structure of Mg·Ag/electron transport film/light-emitting film/hole transport film/ITO. According to this report, when phenylbenzoxadiazole (PBD), dimethyltetraphenylbenzidine (TAD), and tetraphenylbutadiene molecules were respectively used for the electron transport film, the hole transport film, and the light-emitting film. At a drive voltage of 10 V and a current density of 100 mA/cm$^2$, emission having a luminance of 700 cd/m$^2$ was obtained. However, when another light-emitting film with lower photoluminescent efficiency is used, the luminance is greatly decreased and the emission wavelength is sometimes shifted to a longer wavelengthes.

Regarding the luminance required for a practical usage, organic EL devices have almost been satisfied. However, many technical problems are left unsolved in luminous efficiency, device life time, and device fabrication process. The luminous efficacy defined as the ratio of emission photo densities to electric charge carriers is a maximum of 1% at present and is generally about 0.1%. A low luminous efficiency indicates that a current which does not contribute to emission flows across the electrodes. This current causes a decrease in device life time because the Joule heat generated deforms the layered device structure and sometimes decomposes the organic layers. Therefore, in order to obtain a practical organic EL device, demand has arisen for increasing the luminous efficiency from at least several % to about 10%.

In order to increase the luminous efficiency of the organic EL device, the device structure and the electrical characteristics of materials used must be optimized. However, only the qualitative characterization for them are available at present. Electron (or hole) transportability, electron (or hole) injection properties, electron donor properties, electron acceptor properties, and emission properties of the oranic films are key factors affecting the device performances. Therefore, the optimal conditions for designing the device structure are not yet sufficiently established.

In order to arrange a full color display using organic EL devices, three-colored EL devices of red, green, and blue (RGB) are required. As is well known, it is difficult to achieve blue emission with a wavelength shorter than 470 nm (2.6 eV). This is partly because the wide optical band gap is susceptible to influences of impurities in the EL device. For this reason, even if blue emission is obtained, its luminous efficiency and luminance are low. In addition, unexpected long-wavelength emission which may be caused by indirect transition from an impurity level is observed, and its color purity is not so high. This problem will be described in detail below.

According to the above definitions, the conventional organic EL device has a basic structure in which an anode (second electrode), a second organic film consisting of hole injection molecules, a first organic film consisting of electron injection molecules, and a cathode (first electrode) are sequentially stacked. In this structure, assume a device for realizing blue emission (2.6 eV). It is known that the maximum energy of emission of an organic material is shifted to a low energy from the band gap (absorption end) by about 0.5 eV (Stokes shift). When this is taken into consideration, a material having a band gap of 3.0 eV or more is preferably used to obtain blue emission.

An electrode having as a large work function as possible is used for the second electrode. An ITO transparent electrode has a work function of 4.8 eV. An electrode having as a small work function as possible to facilitate electron injection is used for the first electrode. For example, an Al electrode has a work function of 4.2 eV.

In a conventional device, a material which is easily subjected to electron injection from the first electrode (Al) is used as the first organic film. Thus, the material having a high electron affinity in respect of an energy level, i.e., a conduction band level of 3.8 eV or more is selected. On the other hand, a material which is easily subjected to hole injection from the second electrode (ITO) is used as the second organic film. Thus, the material having a low ionization potential in respect of an energy level, i.e., a valence band level of 5.4 eV or less is selected. When the band gap of an organic film is 3 eV, the conduction band level of the second organic film is 2.4 eV or less, and the valence band level of the first organic film is 6.8 eV or more.

A junction of this device in a flat band state is shown in FIG. 1. In this device, the junction barrier of an interface of two organic films has a value exceeding 1.0 eV on both the conduction and valence band sides. In this case, when stronger donor molecules which tend to be injected with holes and stronger acceptor molecules which tend to be injected with electrons are used, i.e., when molecules having a low ionization potential and molecules having a high electron affinity are used, the junction barrier is increased.

In such a device, when a positive bias is applied to the second electrode, an operation shown in FIGS. 2 and 3 is ideally performed. More specifically, electrons are injected from the first electrode to the first organic film and are stored at the interface between the first and second organic films. Meanwhile, holes are injected from the second electrode to the second organic film and are stored at an interface of the second and first organic films. The electrons and the holes form an electrical double layer through the interface of the organic films. A strong electric field is induced in the electrical double layer, so that the electrons or positive holes tend to be tunnel-injected. As a result, the electrons are tunnel-injected to the second organic film and are recombined with the positive holes in the second organic film, thereby emitting light. Meanwhile, the positive holes are tunnel-injected into the first organic film and are recombined with the electrons in the first organic film, thereby emitting light. If the device is assumed to be operated on the basis of this ideal principle, an emission wavelength is determined by the band gaps of the first and second organic films. Even if the Stokes shift is taken into consideration, emission in the blue range having the central energy of about 2.7 eV is assumed to be obtained.

However, in the device manufactured by the state-of-the-art process and having the junction in FIG. 1, electroluminescence occurs in the red region of 2.0 eV or less because a structural disturbance is found to occur at the interface of the organic films in the device manufactured by the state-of-the-art process. This will be described below.

Assume that a first organic film is deposited on a second organic film. In a deposition apparatus, molecules constituting the first organic film are bombarded against the surface of the second organic film at high speed. As a result, as shown in FIG. 4, the molecules constituting the first organic film are diffused in the second organic film. The diffusion depth may reach several 10 nm. As shown in FIG. 5, the structure of the second organic film is disturbed upon bombardment of the electrons thereagainst, and an intermediate layer, in which the molecules constituting the second organic film are mixed with those constituting the first organic film at almost the same concentration, may be formed. As shown in FIG. 6, when these phenomena occur, a new level (to be referred to as a charge transfer (CT) level hereinafter) caused by the conduction band level of the molecules constituting the first organic film is formed in the second organic film. At this time, the electrons injected from the first electrode to the first organic film are not stored at the interface between the organic films but are injected in the second organic film through the CT level, and are recombined with the holes in the valence band of the second organic film. More specifically, assume that the rate of electrons injected through the interface of the organic films is defined as $k_{inj}$, and that a recombination rate caused by transition from the CT level is defined as $k_{CT}$. When the junction barrier has a value exceeding 0.6 eV as in the conventional device, an injection probability caused by the thermal excitation process is greatly decreased to make $k_{inj} < < k_{CT}$.

Since the recombination energy is about 2.0 eV or less, only long-wavelength emission is obtained in this device. In addition, when stronger donor molecules and stronger acceptor molecules are used, the position of the CT level comes close to the valence band of the second organic film, so that emission is shifted to a longer wavelength. As a result, the blue emission EL device described above cannot be realized. In addition, since a CT emission spectrum is generally broad so as to have a half value width of 0.4 eV, and a color mixture with emission caused by recombination of the tunnel-injected electrons and positive holes also occurs, the color purity is greatly decreased. In order to prevent this CT emission, it is preferable to prevent diffusion of molecules during stacking of the organic films. It is, however, very difficult to realize this in accordance with the state-of-the-art process.

Even in the absence of diffusion of molecules during stacking of organic films, when the conduction band of the first organic film is close to the valence band of the second organic film, the electrons and holes stored at the junction interface of the first and second organic films may be indirectly recombined through the junction interface. At this time, the emission wavelength corresponds to an energy difference between the conduction band of the first organic film and the valence band of the second organic film. In this case, long-wavelength emission occurs, and emission having a wavelength distribution determined by the band gaps of the first and second organic films cannot be observed.

As described above, in the conventional organic EL devices, electrical junction conditions and structural conditions of the thin films at the interface are influenced by a variety of factors, it is difficult to manufacture an organic EL device which can be ideally operated. That is, in the conventional organic EL devices, since emission based on the above-mentioned indirect recombination occurs in addition to the emission having a wavelength determined by the band gaps of the first and second organic films, the color purity and hence the luminous efficiency are decreased accordingly.

SUMMARY OF THE INVENTION

It is an object of the present invention to provide an organic EL device capable of solving the conventional problems described above, performing an ideal operation, and obtaining desired emission with a high luminous efficacy.

An organic EL device according to the present invention comprises a multilayered structure of first and second organic films, in which said first organic film serves as a light-emitting layer, a first electrode for electron injection formed on a first organic film side of the multilayered structure, and a second electrode for hole injection formed on a second organic film side of the multilayered structure, wherein a relation $E_{V1} - E_{V2} \leq 0.6$ eV is satisfied where $E_{V1}$ and $E_{V2}$ are energy differences of valence bands of the first and second organic films from a vacuum level, and at least an interface of an organic film and an electrode with a higher junction barrier has such an interface structure that carriers can be tunnel-injected due to the decrease in a barrier thickness when a voltage is applied.

Another organic EL device according to the present invention comprises a multilayered structure of first and second organic films, in which the second organic film serves as a light-emitting layer, a first electrode for electron injection formed on a first organic film side of the multilayered structure, and a second electrode for hole injection formed on a second organic film side of the multilayered structure, wherein a relation $E_{C1} - E_{C2} \leq 0.6$ eV is satisfied where $E_{C1}$ and $E_{C2}$ are energy differences of conduction bands of the first and second organic films from a vacuum level, and at least an interface of an organic film and an electrode with a higher junction barrier has such an interface structure that carriers can be tunnel-injected due to the decrease in a barrier thickness when a voltage is applied.

Still another organic EL device according to the present invention comprises a multilayered structure of an organic film for electron injection and an organic film for hole injection, at least one of which consists of a plurality of layers, and an organic film serving as a light-emitting layer interposed therebetween, a first electrode for electron injection formed on the side of the organic film for electron injection of the multilayered structure, and a second electrode for hole injection formed on the side of the organic film for hole injection of the multilayered structure, wherein a barrier height against electron injection at each interface of layers present from the first electrode to the organic film serving as the light-emitting layer is not more than 0.6 eV, and a barrier height against hole injection at each interface of layers present from the second electrode to the organic film serving as the light-emitting layer is not more than 0.6 eV.

The energy difference from the vacuum level of the valence band of each organic film is equal to the ionization potential of this organic film, and the energy difference from the vacuum level of the valence band of each organic film is equal to the electron affinity of this organic film.

BRIEF DESCRIPTION OF THE DRAWINGS

FIG. 9 is a band diagram for explaining the principle of operation in the organic EL device shown in FIG. 7;

FIG. 10 is a sectional view showing another structure of an organic EL device according to the present invention;

FIG. 11 is a band diagram showing a junction state at a flat band bias in the organic EL device shown in FIG. 10;

FIG. 12 is a band diagram for explaining the principle of operation in the organic EL device shown in FIG. 10;

FIG. 13 is a band diagram showing a junction state at a flat band bias in still another organic EL device according to the present invention;

FIG. 14 is a band diagram for explaining the principle of operation of the organic EL device shown in FIG. 13;

FIG. 15 is a flat band diagram partially showing a junction state in a multilayered organic EL device according to the present invention;

FIG. 16 is a flat band diagram partially showing a junction state in a conventional organic EL device;

FIG. 23 is a band diagram for explaining the principle of operation when a low bias voltage is applied to the device in FIG. 21;

FIG. 24 is a band diagram for explaining the principle of operation when a high bias voltage is applied to the device in FIG. 21;

FIG. 25 is a band diagram at a flat band bias in still another organic EL device according to the present invention;

FIG. 29A is a sectional view of a device used in a measurement by a displacement current method, and FIG. 29B is a wave form diagram of a voltage applied in the displacement current method;

FIG. 30 shows a displacement current detected by the displacement current method;

FIG. 31 shows another displacement current detected by the displacement current method;

FIG. 43 is a band diagram for explaining the principle of operation in the device in FIG. 41;

FIG. 44 is a sectional view showing the structure of the organic EL device of Example 28 in the present invention;

FIG. 45 is a band diagram at a flat band bias in the device in FIG. 44;

FIG. 53 is a band diagram for explaining the principle of operation in the device in FIG. 51;

FIG. 54 is a sectional view showing the organic EL device of Example 36 in the present invention;

FIG. 55 is a band diagram at a flat band bias in the organic EL device in FIG. 54;

FIG. 58 is a band diagram at a flat band bias in the organic EL device in FIG. 57; and FIG. 59 is a band diagram for explaining the principle of operation in the device in FIG. 57.

DETAILED DESCRIPTION OF THE PREFERRED EMBODIMENTS

Figure 1:
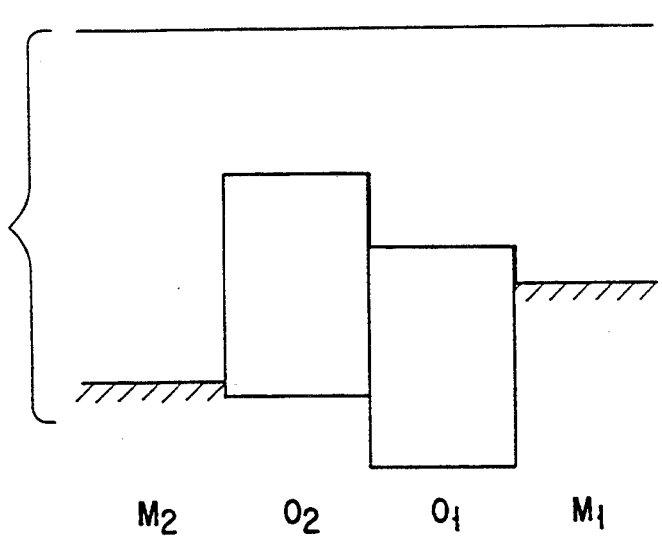
FIG. 1 is a band diagram showing a junction state at a flat band bias in a conventional organic EL device using strong acceptor molecules and strong donor molecules as the first and second organic films.
Figure 2:
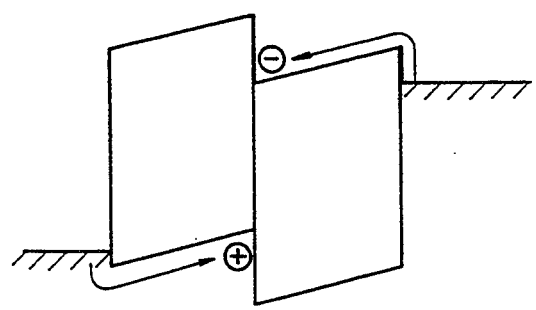
FIG. 2 is a band diagram for explaining the principle of operation when a low bias voltage is applied to the device in FIG. 1.
Figure 3:
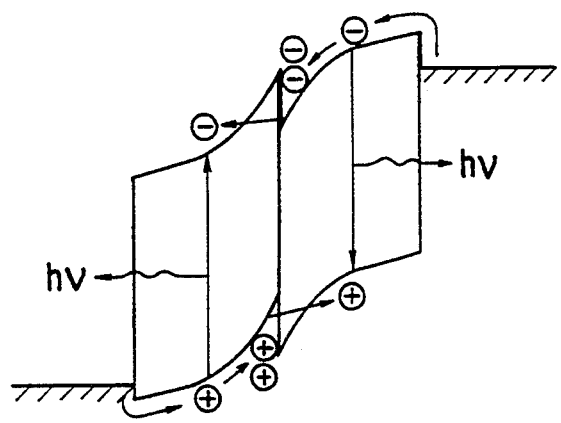
FIG. 3 is a band diagram for explaining the principle of operation when a high bias voltage is applied to the device in FIG. 1.
Figure 4:
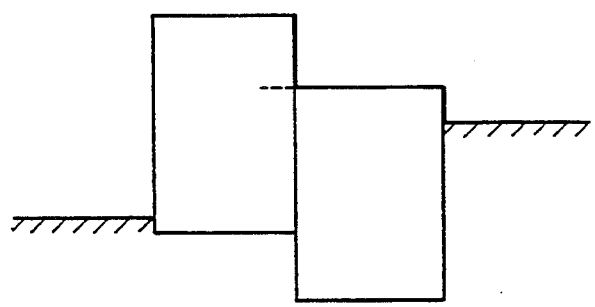
FIG. 4 is a band diagram showing a state at a flat band bias in which a CT level is formed in a conventional organic EL device.
Figure 5:
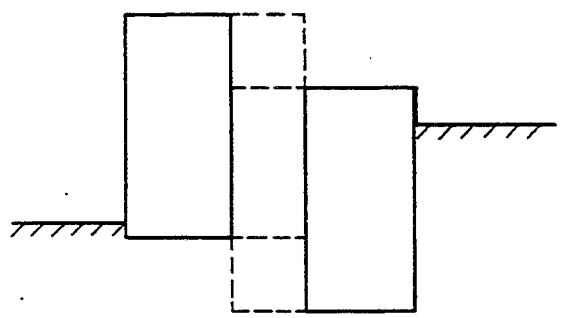
FIG. 5 is a band diagram showing a state at a flat band bias in which an intermediate layer is formed in a conventional organic EL device.
Figure 6:
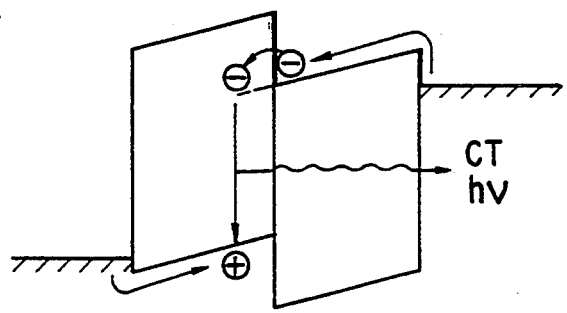
FIG. 6 is a band diagram showing the principle of operation when CT emission is generated in FIG. 4 or 5.
Figure 7:
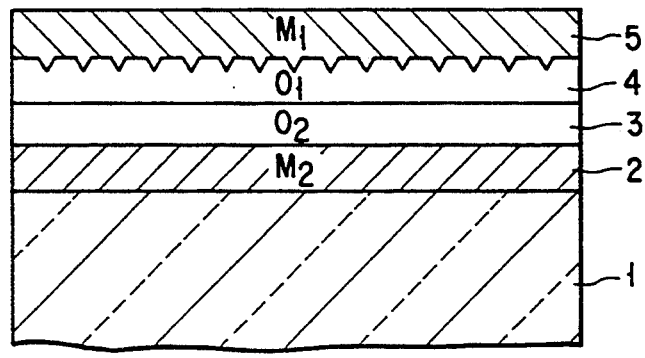
FIG. 7 is a sectional view showing a structure of an organic EL device to the present invention.

FIG. 7 is a sectional view showing a structure of an organic EL device according to the present invention. This device has a structure in which a second electrode ($M_2$) 2, a second organic film ($O_2$) 3, a first organic film ($O_1$) 4, and a first electrode ($M_1$) 5 are sequentially formed on a glass substrate 1. This device satisfies a relation $E_{V1} - E_{V2} \leq 0.6$ eV where $E_{V1}$ and $E_{V2}$ are energy differences of the valence bands of the first and second organic films from the vacuum level. The first electrode 5 serves as a field emission electrode having a filament-like projection to tunnel-inject the electrons to the first organic film 4 by applying a low voltage.

Figure 8:
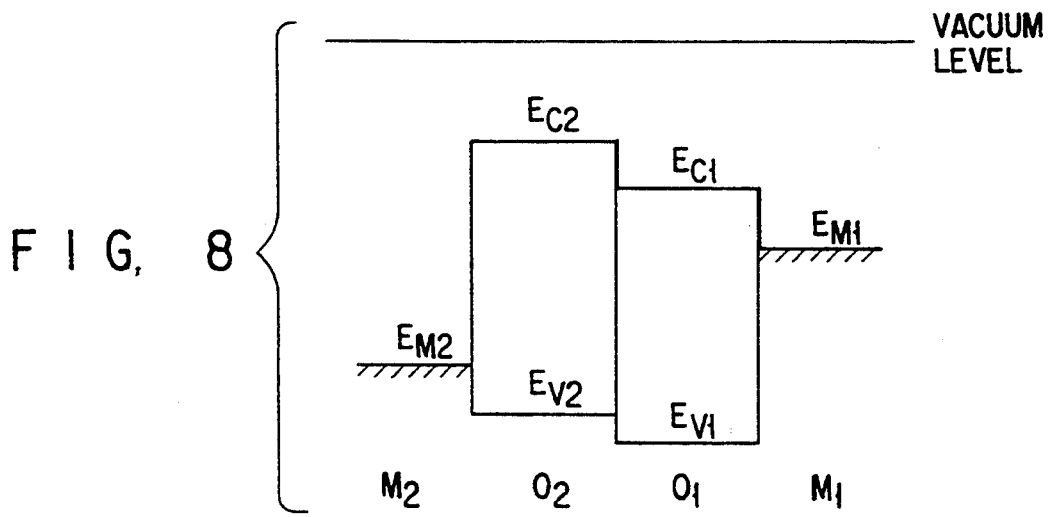
FIG. 8 is a band diagram showing a junction state at a flat band bias in the organic EL device in FIG. 7.

FIG. 8 is a band diagram at a flat band bias of the organic EL device in FIG. 7. The principle of operation of this device will be described with reference to FIG. 9. When a bias voltage is applied to the device such that the second electrode becomes positive, the electrons are tunnel-injected from the first electrode to the first organic film and are stored at the interface between the first and second organic films. At almost the same time, the holes are injected from the second electrode to the valence band of the second organic film. Since the barrier height at the interface between the second organic film and the first organic film is 0.6 eV or less with respect to hole injection, the holes are further thermally excited and injected in the first organic film. As a result, these holes are recombined with the electrons already present in the conduction band of the first organic film, thereby emitting light. At this time, the emission spectrum is originated from direct transition of organic molecules constituting the first organic film.

FIG. 10 is a sectional view showing another structure of an organic EL device according to the present invention. This device has a structure in which a second electrode ($M_2$) 2, a second organic film ($O_2$) 3, a first organic film ($O_1$) 4, and a first electrode ($M_1$) 5 are sequentially formed on a glass substrate 1. This device satisfies a relation $E_{C1} - E_{C2} 0.6$ eV where $E_{C1}$ and $E_{C2}$ are energy differences of the conduction bands of the first and second organic films from the vacuum level. The second electrode 2 serves as a field emission electrode having a filament-like projection to tunnel-inject the holes to the second organic film 3 by applying allow voltage.

FIG. 11 is a band diagram at a flat band bias of the organic EL device in FIG. 10. The principle of operation of this device will be described with reference to FIG. 12. When a bias voltage is applied to the device such that the second electrode becomes positive, the holes are tunnel-injected from the second electrode to the second organic film and are stored at the interface between the first and second organic films. At almost the same time, the electrons are injected from the first electrode to the conduction band of the first organic film. Since the barrier height at the interface between the second organic film and the first organic film is 0.6 eV or less with respect to electron injection, the electrons are further thermally excited and injected in the second organic film. As a result, these electrons are recombined with the holes already present in the valence band of the second organic film, thereby emitting light. At this time, the emission spectrum is originated from direct transition of organic molecules constituting the second organic film.

FIG. 13 is a band diagram at a flat band bias of an organic EL device which satisfies both $E_{V1} - E_{V2} \leq 0.6$ eV and $E_{C1} - E_{C2} \leq 0.6$ eV. The principle of operation of this device will be described with reference to FIG. 14. When a bias voltage is applied to this device such that the second electrode becomes positive, the electrons are tunnel-injected from the first electrode to the first organic film. At almost the same time, the holes are injected from the second electrode to the valence band of the second organic film. In this device, since the barrier height at the interface between the first organic film and the second organic film is 0.6 eV or less with respect to both hole injection and electron injection.

Therefore, the holes can be injected in the first organic film and recombined with the electrons already present in the conduction band of the first organic film, as well as the electrons can be injected in the second organic film and recombined with the holes already present in the valence band of the second organic film. Thus, in this device, any one of the first and second organic films can serve as a light-emitting layer.

According to the present invention, even if the structure of the interface between the first and second organic film is disturbed due to the problem caused by the process in the above organic EL device, since the barrier height at the interface between the first and second organic films is as low as 0.6 eV with respect to the hole or electron injection, the holes or electrons tend to be thermally excited and injected through the interface between the first and second organic films. There is a high probability that the holes or electrons are injected in the first or second organic film and are then recombined to emit a light. That is, in the organic EL device according to the present invention, the organic film serving as the light-emitting layer has electrical characteristics similar to those of the organic film which forms a junction with the light-emitting layer, thereby decreasing the junction barrier height therebetween. The carrier injection rate ($k_{inj}$) is much higher than the intermolecular recombination rate ($k_{CT}$) (i.e., $k_{inj} >> k_{CT}$). As a result, carriers are easily injected due to the thermal excitation process or the like, the efficiency of injection and recombination of the electrons and positive holes in the light-emitting film can be improved. Desired emission corresponding to the band gap of the light-emitting film is obtained. At the same time, a light-emitting device having a high luminance and a high luminous efficiency can be realized.

Further, in the present invention, a third organic film may be formed between the organic film serving as the light-emitting layer and the adjacent electrode. Supposed that the third organic film is formed between the first organic film and the first electrode, it is preferable to satisfy a relation $E_{C3}-E_{C2} \leq 0.6$ eV where $E_{C3}$ is energy difference of the conduction band of the third organic film from the vacuum level. Supposed that the third organic film is formed between the second organic film and the second electrode, it is preferable to satisfy a relation $E_{V2}-E_{V3} \leq 0.6$ eV where $E_{V3}$ is energy difference of the valence band of the third organic film from the vacuum level.

A combination of organic molecules used for the first and second organic films according to the present invention is not limited to any specific one if a barrier junction is formed at an interface between the first and second organic films and condition $E_{V1}-E_{V2} \leq 0.6$ eV or $E_{C1}-E_{C2} \leq 0.6$ eV is satisfied. For example, a combination of weak donor molecules and strong donor molecules, a combination of strong acceptor molecules and weak acceptor molecules, and a combination of weak acceptor molecules and weak donor molecules may be exemplified. To form a barrier junction at the interface between the first and second organic films, $E_{V1}$, $E_{V2}$, $E_{C1}$, and $E_{C2}$ preferably satisfy conditions $E_{V1} > E_{V2}$ and $E_{C1} > E_{C2}$. The acceptor and donor molecules are determined by electron affinity and ionization potential values of the organic molecules, respectively. An organic molecule having an electron affinity $E_C$ of 1.5 eV or more corresponds to an acceptor molecule, and an organic molecule having an ionization potential $E_V$ of 7.1 eV or less corresponds to a donor molecule. According to the present invention, a weak acceptor molecule and a weak donor molecule indicate an organic molecule having the electron affinity $E_C$ of 1.5 to 3.0 eV and an organic molecule having an ionization potential $E_V$ of 5.6 to 7.1 eV, respectively. A strong acceptor molecule and a strong donor molecule indicate acceptor and donor molecules except for the above molecules.

Examples of the combination of organic molecules used for the first and second organic films in the organic EL device according to the present invention are summarized in Table 1.

TABLE 1

|    | First Organic Film | Second Organic Film |
|----|--------------------|---------------------|
| 1  | ⊙BBOT              | PPCP                |
| 2  | IXD-S6             | ⊙PPCP               |
| 3  | OXD-S1             | ⊙PPCP               |
| 4  | OXD-F1             | ⊙PPCP               |
| 5  | OXD-7              | ⊙PPCP               |
| 6  | ⊙BBOT              | PBBO                |
| 7  | ⊙OXD-S6            | ⊙PBBO               |
| 8  | OXD-S1             | ⊙PBBO               |
| 9  | OXD-F1             | ⊙PBBO               |
| 10 | OXD-7              | ⊙PBBO               |
| 11 | ⊙DNIBPC            | PBBO                |
| 12 | ⊙PBBO              | DIAMINE             |
| 13 | PBBO               | ⊙OXD-8              |
| 14 | PBBO               | ⊙PPCP               |
| 15 | ⊙OXD-S1            | ⊙OXD-7              |
| 16 | ⊙BBOT              | OXD-7               |
| 17 | ⊙DNIBPC            | OXD-7               |
| 18 | ⊙BBOT              | OXD-S1              |
| 19 | ⊙DNIBPC            | OXD-S1              |
| 20 | DNIBPC             | ⊙BBOT               |

In Table 1, compounds represented by abbreviations represent the following compounds (C1) to (C10), and compounds each marked with ⊙ constitute light-emitting layer.

PPCP

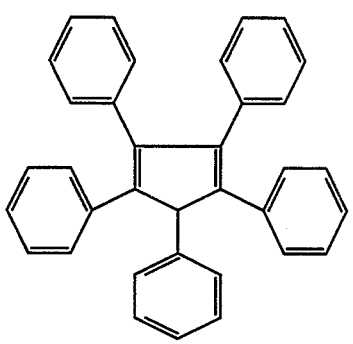

(C1)

PBBO (C2)
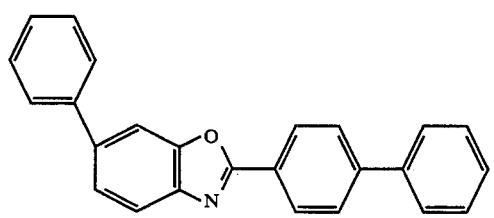
OXD-7 (C3)
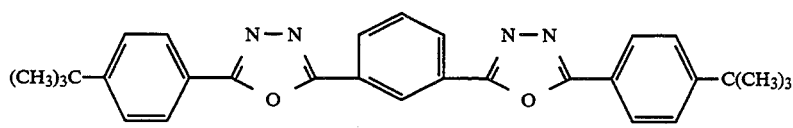
OXD-F1 (C4)
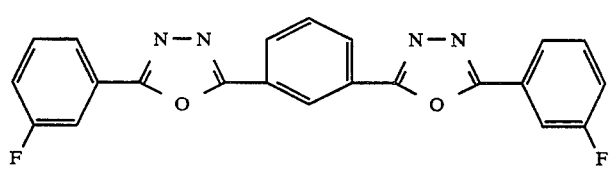
OXD-S1 (C5)
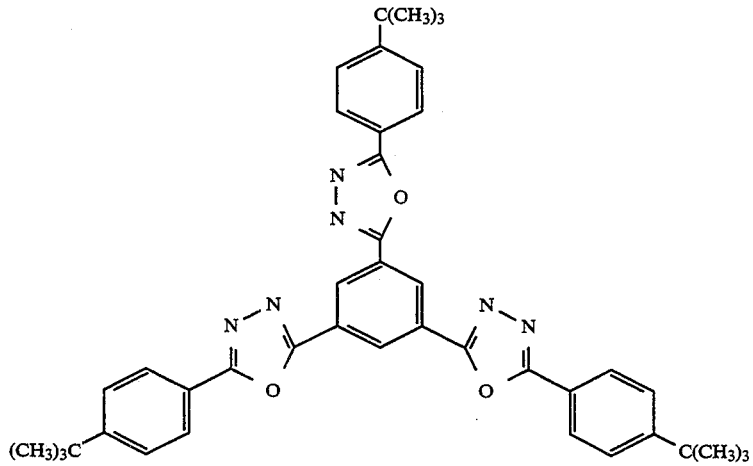
OXD-S6 (C6)
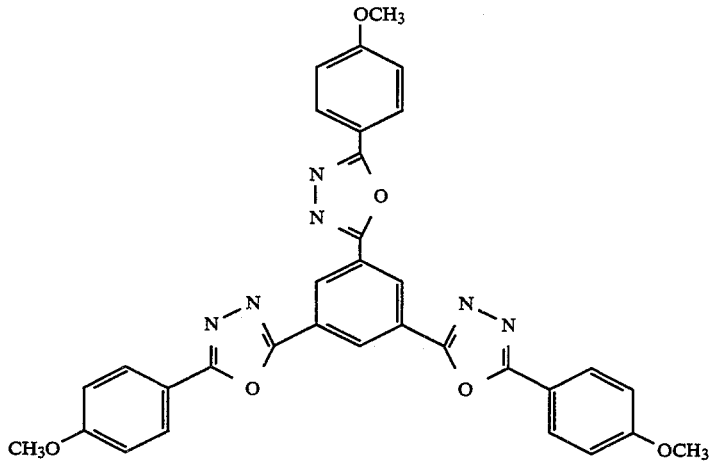
BBOT (C7)
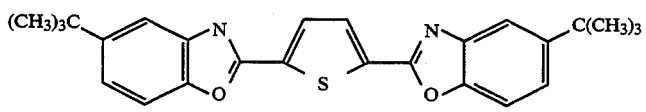

-continued

DNIBPC (C8)

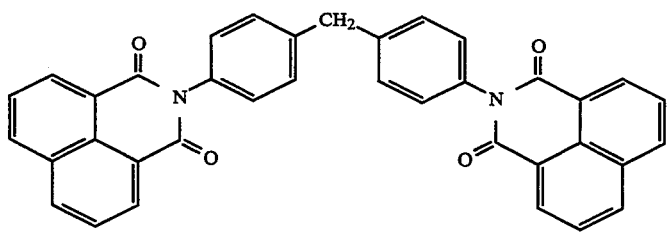

DIAMINE (C9)

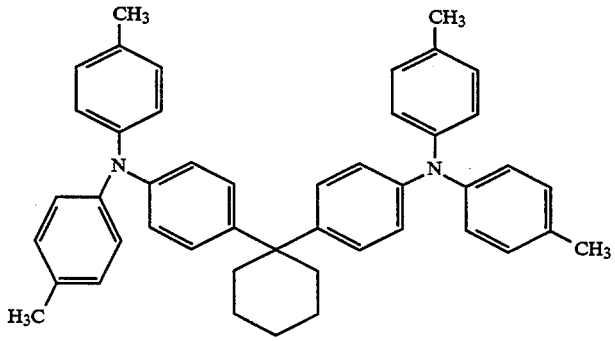

OXD-8 (C10)

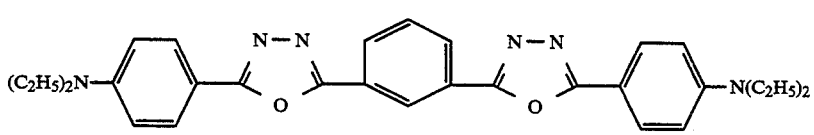

Of the first and second organic films according to the present invention, organic molecules having a light-emitting property are used for at least an organic film serving as a light-emitting layer. In this case, since the emission wavelength distribution is determined by the band gap of the organic film serving as the light-emitting layer, the organic molecules are selected in accordance with a desired emission wavelength distribution. For example, to realize blue emission, light-emitting organic molecules are selected such that the band gap of the organic film serving as the light-emitting layer is 2.6 eV or more, and preferably 3.0 eV or more.

Practical light-emitting organic molecules are as follows. Examples of the acceptor molecule are molecules having a cyano group, a dicyanomethine group, a cyanocarbonylmethine group, a quinoide group, an oxazole group, and an acid anhydride group. The donor molecule is a molecule having polycyclic aromatic hydrocarbon atoms and particularly having a hetero atom. Optimal examples of the donor molecule are molecules each having at least one of an aniline group, a triphenylamine group, a triphenylmethane group, and a group obtained by introducing an appropriate substituent group (e.g., an alkyl group or an alkoxyl group) in each of the above groups.

According to the present invention, a material having as a small work function $E_{M1}$ as possible is used for the first electrode. More specifically, examples of the material having a small work function $E_{M1}$ are Al, Mg, and a rare earth element, each of which has the work function $E_{M1}$ of 2.8 to 4.1 eV. A material having as a large work function $E_{M2}$ as possible is used for the second electrode for hole injection. Examples of the material having a large work function $E_{M2}$ are Au, Cu, Pt, Ir, and ITO, each of which has the work function $E_{M2}$ of 4.8 to 5.5 eV.

In the present invention, it is from the following reason that at least an interface of an organic film and an electrode with a higher junction barrier is defined to have such an interface structure that carriers can be tunnel-injected due to the decrease in a barrier thickness when a voltage is applied.

When the explanation will be made supposed that a third organic film is formed neither between the first organic film and the first electrode nor between the second organic film and the second electrode. In this case, to inject the electrons from the first electrode to the conduction band of the first organic film and the holes from the second electrode to the second organic film while a low bias voltage is applied, the following conditions are preferably established:

$$E_{M1} - E_{C1} \leq 1.0 \ eV$$

$$E_{V2} - E_{M2} \leq 1.0 \ eV$$

and more preferably $$E_{M1} - E_{C1} \leq 0.6 \ eV$$

$$E_{V2} - E_{M2} \leq 0.6 \ eV$$

When the number of electrons injected from the first electrode to the conduction band of the first organic film is largely different from the number of holes injected from the second electrode to the valence band of the second organic film, the luminous efficacy of the organic EL device is greatly decreased accordingly, so that the following condition is still more preferably established:

$$|(E_{M1}-E_{C1})-(E_{V2}-E_{M2})| \leq 0.3 \, eV$$

In the organic EL device according to the present invention, it is difficult to satisfy both conditions $E_{M1}-E_{C1} \leq 1.0$ eV and $E_{V2}-E_{M2} \leq 1.0$ eV, and particularly conditions $E_{M1}-E_{C1} \leq 0.6$ eV and $E_{V2}-E_{M2} \leq 0.6$ eV. When these conditions are not satisfied, a high bias voltage must be applied to inject the electrons from the first electrode to the conduction band of the first organic film and the holes from the second electrode to the valence band of the second organic film.

To the contrary, according to the present invention, carriers can be tunnel-injected from an electrode to the adjacent organic film due to the decrease in a barrier thickness even when a low voltage is applied by a means such as filament-like projections formed on the surface of an electrode which does not satisfy the above condition. That is, by utilizing the field emission upon concentrating an electric field on the projection, carrier injection by the tunnel effect can be facilitated, thereby decreasing the operating voltage. The filament length preferably falls within the range of 1 to 10 nm.

A method of forming filament-like projections on the surface of an electrode by forming an organic film on the electrode is different from that by forming an electrode on an organic film. According to the former method, filament-like microscopic projections are formed by photolithography on the surface of the electrode. According to the latter method, the morphology of the surface of the organic film is utilized. The structures of the organic films are mainly classified into monocrystalline, polycrystalline, and amorphous structures. Although the surface of an amorphous film is relatively flat, projections are present on the surface of a polycrystalline film. When a metal thin film is formed on the surface of the polycrystalline film, the metal enters gaps between the projections to form a filament structure. To make an organic film into a polycrystalline film, for example, deposition conditions may be controlled. An insulating or semiconducting inorganic oxide such as $Al_2O_3$, $MgO$, $In_2O_3$, $PbO$, or $SnO_2$ having a polycrystalline structure may be formed on an amorphous organic film, and an electrode is formed thereon to obtain the same electrode structure as described above. In this case, the above polycrystalline film need not be formed on the entire surface of the organic film. It is preferable to partially form a polycrystalline film having projections on the organic film.

If $E_{M1}-E_{C1} > 0.6$ eV and $E_{V2}-E_{M2} > 0.6$ eV, then it is difficult to inject both the electrons from the first electrode to the first organic film and the holes from the second electrode to the second organic film. Even in this device, filament-like projections are formed on the surfaces of the first and second electrodes to concentrate the electric field, and the field emission is utilized to facilitate electron injection and hole injection by the tunnel effect, thereby decreasing the operating voltage.

According to the present invention, as a means for decreasing the barrier thickness at the interface between the metal and the organic film, an impurity is intentionally doped in the interface between the metal and the organic film to form an interface level, thereby pinning the Fermi level of the metal. As an impurity, a strong acceptor molecule such as a TCNQ molecule is used to decrease the barrier against electron injection, and a strong donor molecule such as a TTF molecule is used to decrease the barrier against hole injection. Such molecules are made present at only the interface at a high density to cause charge transfer from the metal surface to the molecules forming the junction with each other, thereby fixing the level to the Fermi level of the metal. According to this technique, the metal/organic junction barrier can be reduced to some extent.

An organic EL device having a multilayered structure comprising four or more layers according to the present invention will be described below. This organic EL device comprises a multilayered structure consisting of an organic film for electron injection and an organic film for hole injection, at least one of which consists of a plurality of layers, and an organic film serving as a light-emitting layer interposed therebetween, a first electrode for electron injection formed on the side of the organic film for electron injection of the multilayered structure, and a second electrode for hole injection formed on the side of the organic film for hole injection of the multilayered structure. The barrier height against electron injection at each interface between layers present from the first electrode to the organic film serving as the light-emitting layer is 0.6 eV or less. At the same time, the barrier height against hole injection at each interface between layers present from the second electrode to the organic film serving as the light-emitting layer is 0.6 eV or less.

In this device, any one of the organic film for electron injection and the organic film for hole injection, which is present on the electrode side when viewed from the organic film serving as the light-emitting layer, consists of a plurality of layers. Therefore, four or more organic films including the organic film serving as the light-emitting layer are formed. Also, the plurality of organic films may serve as light-emitting layers. When the band gaps ($E_g$) of the respective organic films are almost equal to each other, the plurality of organic films serve as light-emitting layers. In this case, however, considering that the mobility of the carriers in the organic film is low, an organic film (light-emitting layer) in which electrons are recombined with holes is generally one layer. In particular, if an organic film having a narrow band gap is formed near the central portion of the organic multilayered structure, this organic film can serve as a light-emitting layer. When a total of n organic layers are formed on the second electrode and the first electrode is finally formed by vacuum deposition, an organic film serving as a light-emitting layer is preferably formed on the second electrode side from the central portion of the multilayered structure consisting of organic films so as to eliminated influences of electrode deposition.

Assume an organic EL device according to the present invention has a first electrode, first to nth ($n \geq 4$) organic films, and a second electrode. The relationship between the energy levels of the respective layers will be described below. Work functions of the first and second electrodes are defined as $E_{M1}$ and $EM_2$, energy differences (to be referred to as conduction band levels hereinafter) of the conduction bands of the first to nth layers from the vacuum level are defined as $E_{C1}$ to $E_{Cn}$, and energy differences (to be referred to as valence band levels hereinafter) of the valence bands of the first to nth organic films from the vacuum level are defined as $E_{V1}$ to $E_{Vn}$. The order of layers of the organic film are counted from the first electrode side, and the organic film serving as the light-emitting layer is defined as the kth (1≦k≦n) layer.

The barrier height against electron injection at each interface between layers present from the first electrode for electron injection to the organic film serving as the light-emitting layer is 0.6 eV, which fact can be represented as follows:

$$E_{M1} - E_{C1} \leq 0.6 \, eV \quad (1)$$

$$E_{Cm} - E_{Cm+1} \leq 0.6 \, eV \quad (2)$$

(where m is an integer from 1 to k−1, Note that the case k=1 is excluded).

This barrier height against electron injection is preferably 0.4 eV or less. The value of formula (2) may be negative, that is, any barrier against electron injection is not present. Condition (2) is satisfied or need not be satisfied in each interface between the layers present from the light-emitting layer to the second electrode. For this reason, if the barrier height against electron injection between the kth organic film serving as the light-emitting layer and the (k+1)th organic layer is set to be a value exceeding 0.6 eV, the electrons can be stored in the light-emitting layer.

The barrier height against hole injection at each interface between the layers present from the second electrode for hole injection to the organic film serving as the light-emitting layer is 0.6 eV, which fact is represented as follows:

$$E_{Vn} - E_{M2} \leq 0.6 \, eV \quad (3)$$

$$E_{Vm-1} - E_{Vm} \leq 0.6 \, eV \quad (4)$$

(where m is an integer from k+1 to n. Note that the case k=n is excluded.).

This barrier height against hole injection is more preferably 0.4 eV or less. The value of formula (4) may be positive, that is, any barrier against hole injection is not present. Condition (4) is satisfied or need not be satisfied in each interface between the layers present from the light-emitting layer to the first electrode. Therefore, when the barrier height against hole injection between the kth organic layer serving as the light-emitting layer and the (k−1)th organic layer is set to be a value exceeding 0.6 eV, the holes can be stored in the light-emitting layer.

As described above, in the conventional organic EL device, since a difference ($\Delta E$) between the valence band level (ionization potential) of the organic film serving as the light-emitting layer and the conduction band level (electron affinity) of the organic film forming a junction therewith is small, emission caused by intermolecular transition tends to occur. To the contrary, in the organic EL device according to the present invention which satisfies conditions (1) to (4), the electrical characteristics of the organic film serving as the light-emitting layer are similar to those of the organic film forming a junction therewith, and the difference $\Delta E$ cannot be set small, so that long-wavelength emission caused by intermolecular transition can be prevented.

Further, in the organic EL device according to the present invention, since the organic film has a multilayered structure consisting of four or more layers, efficiency of carrier injection from the electrode to the organic film can be improved as follows.

Assume that a first electrode $M_1$, a first organic film $O_1$, a second organic film $O_2$, a third organic film $O_3$, and a fourth organic film $O_4$ are formed, as shown in FIG. 15, and that a first electrode $M_1$, a third organic film $O_3$, and a fourth organic film $O_4$ are formed, as shown in FIG. 16. Also assume that an energy difference between the valence band level (ionization potential) of the third organic film $O_3$ and the work function of the first electrode $M_1$ is 1.5 eV. Efficiency of electron injection from the first electrode $M_1$ to the third organic film $O_3$ of the structure in FIG. 15 is compared with that in FIG. 16.

In either case, a junction barrier height ($\Delta\Phi e$) against electron injection from the first electrode $M_1$ to the third organic film $O_3$ is given as follows:

$$\Delta\Phi e = E_{C3} - E_{M1} = 1.5 \, eV$$

At this time, when a basic band model which is established in an inorganic semiconductor is taken into consideration, an excitation current density J from the electrode to the organic film is represented as follows in a thermal equilibrium state:

$$J = A^* T^2 \exp(-q\Delta\Phi e / KT) \quad (5)$$

Figure 17:
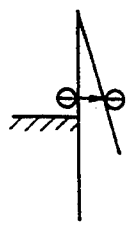
FIG. 17 is a band diagram showing a manner of electron injection from the first electrode to the adjacent organic film in the organic EL device in FIG. 16.

(where $A^*$ is a Richardson constant). When $\Delta\Phi e = 1.5$ eV in a state wherein the first electrode $M_1$ is adjacent to the third organic film $O_3$, as shown in FIG. 16, it is difficult to inject the electrons. In this case, therefore, to inject high-density carriers, by a Schottky effect, or a tunnel effect in a state applied with a high voltage must be considered, as shown in FIG. 17.

Figure 20:
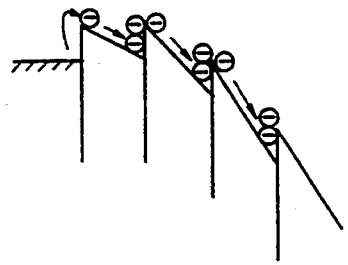
FIG. 20 is a band diagram showing a manner of electron injection from the second organic film to the third organic film in the organic EL device in FIG. 15.
Figure 18:
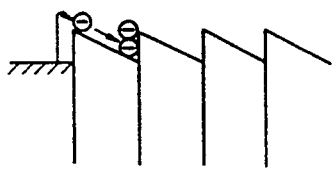
FIG. 18 is a band diagram showing a manner of electron injection from the first electrode to the first organic film in the organic EL device in FIG. 15.
Figure 19:
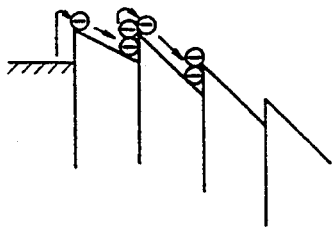
FIG. 19 is a band diagram showing a manner of electron injection from the first organic film to the second organic film in the organic EL device in FIG. 15.

On the other hand, when the barrier height against electron injection is divided into several steps, as shown in FIG. 15, since the junction barrier between the first electrode and the first organic film is considerably low, electrons can be injected at a relatively low voltage. The electrons are stored at the interface between the first organic film and the second organic film (FIG. 18). The pseudo Fermi level of the first organic film almost coincides with the work function of the first electrode, and the first organic film can be regarded as an electrode for electron injection. Thereafter, the voltage higher than that required for electron injection is applied to the organic films except for the first organic film. Since the barrier against electron injection between the first organic film and the second organic film is also low, the stored electrons can be injected in the second organic film although the voltage is not considerably increased. The injected electrons are stored at the interface between the second organic film and the third organic film (FIG. 19). Since the second organic film is also regarded as the electrode for electron injection, the stored electrons can be injected in the third organic film (FIG. 20) without much increasing the voltage. In this manner, the structure in FIG. 15 has higher efficiency of electron injection to the third organic film than that in FIG. 16. The same discussion can apply to hole injection. Therefore, the organic EL device according to the present invention can be efficiently operated at a lower voltage than that applied to the conventional device.

The organic EL device according to the present invention can improve carrier recombination efficiency. That is, since the carrier mobility is high and the mean free path is long in an inorganic semiconductor, there is a high probability of causing the electrons and holes to flow to opposite electrodes before they are recombined with each other. On the other hand, in the organic films constituting the organic EL device according to the present invention, the carrier mobility is low and the mean free path is short. In addition, since the injected electrons and positive holes are stored at the interfaces of a number of organic films at a high density, i.e., since space-charge layers are formed, the electrons or holes are prevented from flowing to the corresponding opposite electrode. For this reason, the electrons and holes are selectively recombined in the organic film in the region where the space-charge layers overlap each other, thereby improving recombination efficiency.

In the conventional organic EL device, a metal having a low work function, such as Al or Mg is used as the first electrode. However, such a metal is chemically unstable. If the metal is left in air for a long period of time, a current does not flow through the electrode because the electrode is oxidized, thereby shortening the life time of the device. To the contrary, in the organic EL device according to the present invention, when the number of layers of the organic film is increased while conditions (1) to (4) are satisfied, a material having a high conduction band level (electron affinity) can be used as the first organic film, and a metal having a high work function (e.g., Cu, Au, Ag, or Pt) can be used as the first electrode. Since such a metal is chemically stable, the life time of the device can be prolonged.

In addition, in the organic EL device according to the present invention, the barrier heights against electron injection present from the organic film serving as the light-emitting layer to the second electrode and the barrier heights against hole injection present from the organic film serving as the light-emitting layer to the first electrode are not specifically defined, as described above. Therefore, if a relatively high barrier against electron injection is present between the organic film serving as the light-emitting layer and the organic film adjacent on the second electrode side, the barrier against electron injection between organic films present from this organic film to the second electrode is very low or may be absent. In other words, the conduction band level (electron affinity) of the organic film on the second electrode side may be high. For example, the band gap of this organic film may be narrower than that of the organic film serving as the light-emitting layer. Similarly, if a relatively high barrier against positive injection is present between the organic film serving as the light-emitting layer and the organic film adjacent thereto on the first electrode side, the barrier against hole injection between organic films present from this organic film to the first electrode can be very low or need not be present. In other words, the valence band level (ionization potential) of the organic film on the first electrode side may be low. For example, the band gap of this organic film may be narrower than that of the organic film serving as the light-emitting layer.

This indicates that a material having a narrow band gap can be selected as the first organic film having the strongest acceptor characteristic and adjacent to the first electrode and as the kth organic film having the strongest donor characteristic and adjacent to the second electrode. As described above, since the carrier mobility is low and carriers are stored in the organic film constituting the organic EL device according to the present invention so as to form space-charge layers, the electrons and the holes are selectively recombined in the organic film in the region where the space-charge layers of the electrons and holes overlap each other.

Even if the band gap of the first organic film is narrowed, recombination does not occur because the holes are not present in the valence band of the first organic film. The electrons are injected in a predetermined light-emitting layer. Similarly, even if the band gap of the nth organic layer is narrowed, recombination does not occur because the electrons are not present in the conduction band of the nth layer. The holes are injected in a predetermined light-emitting layer. To the contrary, in an inorganic semiconductor, the carrier distribution is close to an equilibrium state, and recombination between the electrons and holes occurs in a region having the narrowest band gap. Therefore, it is difficult to employ above-mentioned arrangement.

It is generally difficult to increase the band gap in a strong acceptor or donor molecule. As described above, when the band gaps of the first organic layer and the nth organic layer of the organic film can be narrowed, the range of material selection can be widened, and a material which can be easily synthesized can be used.

As described above, in the organic EL device which satisfies conditions (1) to (4), the electrical characteristics of the organic film serving as the light-emitting layer are similar to those of the organic film which forms a junction therewith, and the junction barrier therebetween is low. For this reason, the carrier injection rate ($k_{inj}$) is much higher than the intermolecular recombination rate ($k_{CT}$) ($k_{inj} >> k_{CT}$). As a result, since carriers can be easily injected by a thermal excitation process or the like, the injection/recombination efficiency of the electrons and holes in the light-emitting film is remarkably improved. Desired emission corresponding to the band gap of the light-emitting film can be obtained, and at the same time a light-emitting device having a high luminance and a high efficiency can be realized.

When the band gap of the light-emitting film is set narrower than those of the organic film for electron injection and the organic film for hole injection which are directly forming Junctions with the light-emitting film, and further a barrier height against hole injection between the light-emitting film and the organic film for electron injection and a barrier height against electron injection between the light-emitting film and the organic film for hole injection are set to exceed 0.6 eV, the light-emitting film is specified to improve the recombination efficiency of the electrons and holes. The following conditions are defined in addition to conditions (1) to (4):

$$E_{Ck} - E_{Ck+1} > 0.6 \text{ eV} \qquad (5)$$

$$E_{Vk-1} - E_{Vk} > 0.6 \text{ eV} \qquad (6)$$

Although the electrons injected into the light-emitting film tend to escape from the light-emitting film to the hole injection film, they are blocked due to the presence of the barrier against electron injection at the interface between the light-emitting film and the hole injection film. In addition, although the holes injected in the light-emitting film tend to escape from the light-emitting film to the electron injection film, they are blocked due to the presence of the barrier against hole injection at the interface between the light-emitting film and the electron injection film. As a result, the electrons and the positive holes are confined in the light-emitting film and are highly efficiently recombined with each other.

In the present invention, it may be difficult to select molecules constituting the respective organic layers which satisfy conditions (1) to (4). In this case, it is effective to synthesize organic molecules as a result of combination of two different basic skeletons. The basic skeleton is a main molecular skeleton which dominates electron or hole injection property.

Assume three electron injection organic films, i.e., an (m−1)th film, an mth film, and an (m+1)th film. Of these films, the (m−1)th and (m+1)th films have different basic skeletons, each having electron injection property. Assume that a barrier height against electron injection exceeds 0.6 eV when the (m−1)th and (m+1)th films directly form a junction. In this case, as a molecule constituting the mth organic film, a molecule is synthesized to simultaneously have the basic skeleton of the molecule constituting the (m−1)th organic film and the basic skeleton of the molecule constituting the (m+1)th organic film. When these three different organic molecules are used, the conduction band level of the mth organic film which determines the electron injection characteristic can be set at a level between the (m−1)th organic film and the (m+1)th organic film. As a result, each of the barrier height against electron injection between the (m−1)th film and the mth film and the barrier height against electron injection between the mth film and the (m+1)th film can be set to be 0.6 eV or less. The same technique as described above applies to the hole injection films.

This method will be described in more detail below. Basic skeletons having electron injection characteristics are exemplified in an order from a weaker electron injection characteristic, i.e., in an order from a smaller difference between the conduction band and the vacuum level:

Pentacenetetoron (C11), diphenylnaphthalene tetracarboxyimide (C12), alloxazine (C13), perillene tetracarboxyimide (C14), p-vinylcyanoalkyl ester (C15), cyanuic acid (C16), N-phenylnaphthalene dicarboxyimide (C17), piperonal vinylcyanoalkyl ester (C18), PY (C19), OXD (C20), BOX (C21), OX (C22), and HPB (C23).

Two of the skeletons having electron injection characteristics are selected. A molecule having one skeleton having a strong electron injection characteristic is used for the (m−1)th organic film, a molecule having the other having a weak electron injection characteristic is used for the (m+1)th organic film, and a molecule having both the skeletons is used for the mth organic film, thereby designing the organic films satisfying condition (2).

Basic skeletons having hole injection characteristics are exemplified in an order from a weaker hole injection characteristic, i.e., in an order from a smaller difference between the valence band and the vacuum level:

BOX (C21), OX (C22), HPB (C23), PCP, triphenylmethane (C24), tetraphenylmethane (C25), tetraphenylbutadiene (C26), (C27), TPA (C28), dialkylphenylamine (C29), and quinacridone (C30).

Two of the skeletons having hole injection characteristics are selected. A molecule having one skeleton having a weak hole injection characteristic is used for the (m−1)th organic film, a molecule having the other skeleton having a strong hole injection characteristic is used for the (m+1)th organic film, and a molecule having both the skeletons is used for the mth organic film, thereby designing the organic films satisfying condition (4).

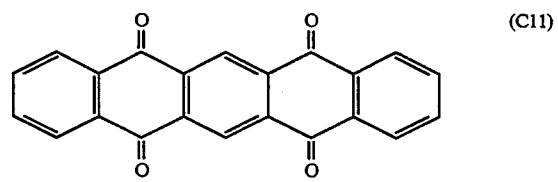
(C11)

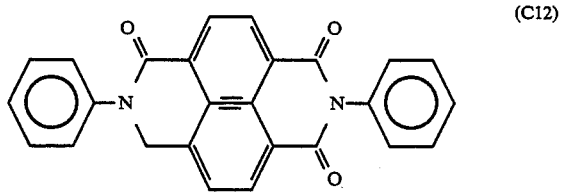
(C12)

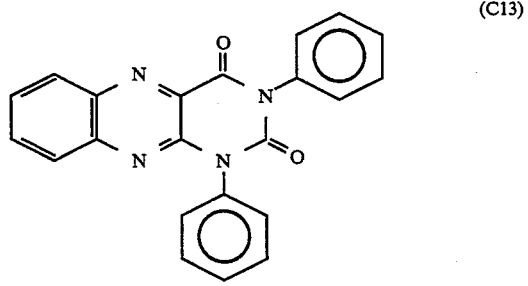
(C13)

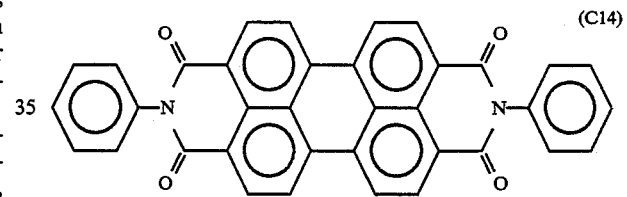
(C14)

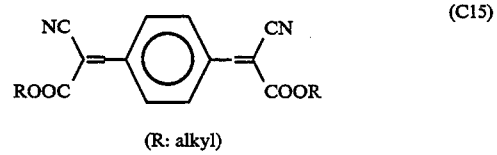
(C15)
(R: alkyl)

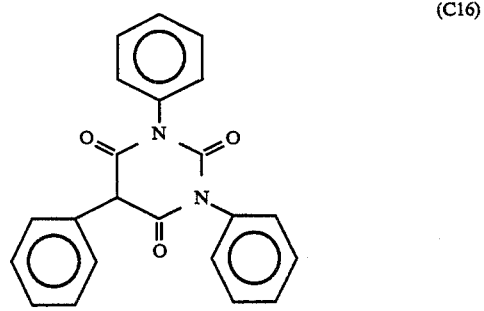
(C16)

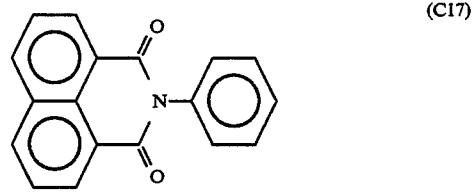
(C17)

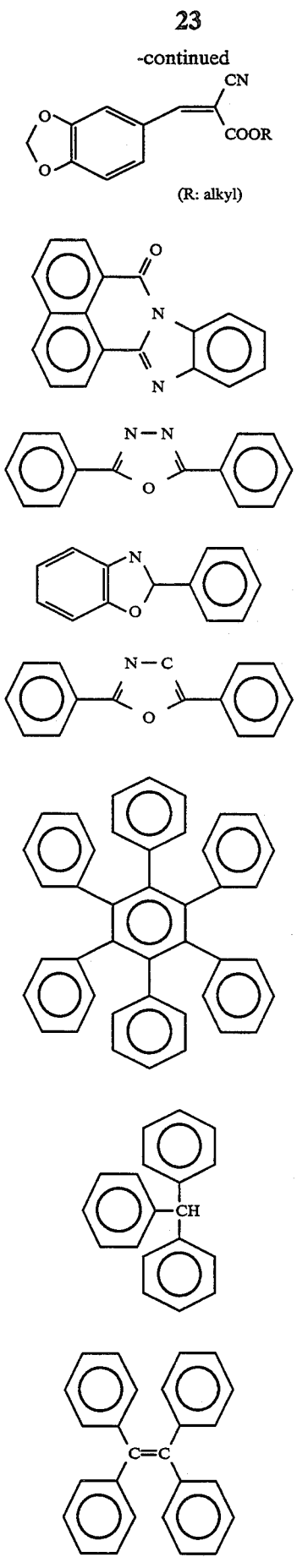

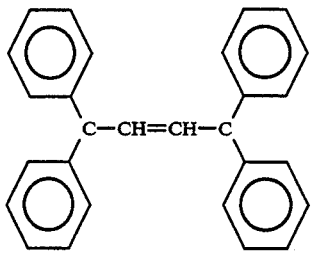
(C26)

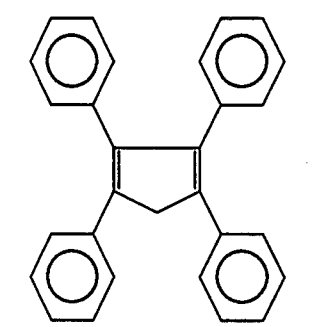
(C27)

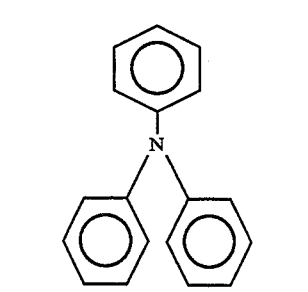
(C28)

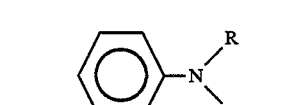
(C29)

(R: alkyl)

(C30)

In order to combine two different basic skeletons, carbon atoms of the two different basic skeletons are directly combined with each other. Alternatively, the two different basic skeletons are combined through —CH₂—, —O—, —S—, a benzene ring, a thiophene ring, or a pyrazine ring.

In addition to the combination of one type of basic skeleton and the other type of basic skeleton, two or more skeletons may be used with respect to at least one type of them. Since the organic EL device is a current injection device, it is important to eliminate electrical defects. Therefore, homogeneous organic films with higher thermal stability are required. For this purpose, it is effective to utilize amorphous organic molecules with a high molecular volume, which can be synthesized by, for example, combination of three basic skeletons at the 1-, 3-, and 5-positions of benzene moiety. According to this method, an amorphous organic film tends to be formed, and electrical defects caused by crystallization can be prevented.

In addition to the above methods, as a method of lowering the barrier against electron or hole injection between the two adjacent organic films, two different organic molecules constituting these two adjacent organic films may have identical basic skeletons, one of which has a substituent group for increasing electron or positive hole injection level. Examples of the substituent group for increasing the electron injection characteristic are —CN, —CF$_3$, —F, and —Cl. Examples of the substituent group for increasing the hole injection characteristic are —NR$_2$ (wherein R is an alkyl group) and —OR (wherein R is an alkyl group). By changing the numbers of substituent groups stepwise in units of organic films, the valence or conduction band level can be changed stepwise.

In the organic EL device according to the present invention, a carrier mobility $\mu_{LEL}$ in the light-emitting layer and a carrier mobility $\mu_{CIL}$ in the carrier injection layer preferably satisfy the following condition:

$$\mu_{CIL}/\mu_{LEL} > 10^4$$

In addition, the carrier mobility $\mu_{CIL}$ in the carrier injection layer preferably exceeds $10^{-2}$ cm$^2$/V·sec. The carrier mobility in the organic film can be generally measured in accordance with a TOF (Time Of Flight) method.

The light-emitting layer (LEL) herein indicates an area in which electrons and holes which are injected directly from an electrode or through a carrier injection layer are recombined to emit light. The carrier injection layers (CIL) are classified into an electron injection layer (EIL) and a hole injection layer (HIL). The electron injection layer indicates an area formed between the first electrode and the light-emitting layer, which may consist of a single organic film or a plurality of organic films, to receive the electrons from the first electrode and inject the electrons to the light-emitting layer. The hole injection layer indicates an area formed between the second electrode and the light-emitting layer, which may consists of a single organic film or a plurality of organic films, to receive the holes from the second electrode and inject the holes to the light-emitting layer.

Figure 21:
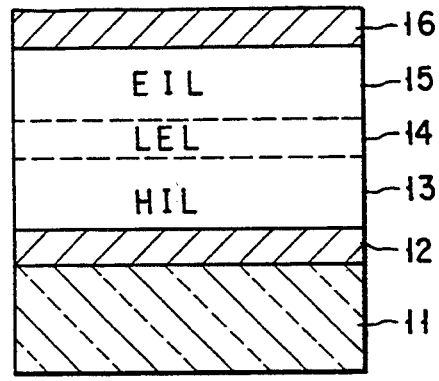
FIG. 21 is a sectional view showing still another structure of an organic EL device according to the present invention.

The general structure of an organic EL device according to the present invention from this view point is shown in FIG. 21. The organic EL device in FIG. 21 comprises a first electrode for electron injection 16, an electron injection layer (EIL) 15, a light-emitting layer (LEL) 14, a hole injection layer (HIL) 13, a second electrode 12 for hole injection, and a glass substrate 11, when viewed from the top. Light is detected on the side of the glass substrate 11.

There may be proposed a two-layered structure consisting of a light-emitting layer and an electron injection layer, or a two-layered structure consisting of a light-emitting layer and a hole injection layer. In an organic EL device having such a two-layered structure or an organic EL device having a three-layered structure consisting of a single hole injection layer, a light-emitting layer and a single electron injection layer, at least an interface of an organic layer and an electrode with a higher injection barrier is made such an interface structure that carriers can be tunnel-injected due to the decrease in a barrier thickness when a voltage is applied, as mentioned above. In addition, when emission wavelengths of R, G, and B components are to be freely designed, the band gaps of the organic films must cover the range of about 3.0 to 3.5 eV at maximum. To inject electrons and holes in the organic films having band gaps falling within the above range, it is preferable that the first electrode must have as a low work function as possible, and that the second electrode preferably must have as a high work function as possible.

Figure 22:
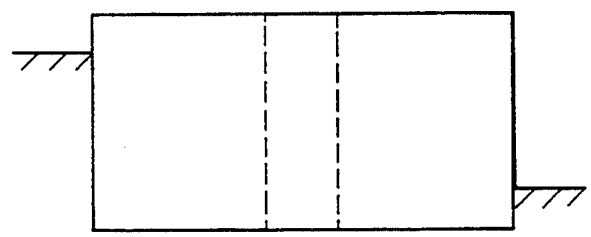
FIG. 22 is a band diagram at a flat band bias in the organic EL device in FIG. 21.

The operation of the organic EL device shown in FIG. 21 will be briefly described with reference to FIGS. 22 to 24. FIG. 22 shows junction states of the organic EL device shown in FIG. 21, and FIG. 23 shows a state in which a negative voltage is applied to the first electrode. At this time, the electrons are injected from the first electrode to the electron injection layer. Since the mobility of the electrons is high in the electron injection layer, the electrons immediately reach the light-emitting layer. Meanwhile, the holes are injected from the second electrode to the hole injection layer. Since the mobility of the holes is high in the hole injection layer, the holes immediately reach the light-emitting layer. When a higher voltage is applied to the device, as shown in FIG. 24, the electrons are stored to form a space-charge layer having a high electron density, and similarly the holes are stored to form a space-charge layer having a high hole density. Recombination occurs between the electrons and the holes in the space-charge layers formed in the light-emitting layer, thereby emitting light from the organic film. Therefore, to improve the recombination efficiency between the electrons and the holes, i.e., to improve the luminous efficiency, the electrons and the holes are preferably confined in the light-emitting layer for a long period of time as possible.

If the carrier residence time in the light-emitting layer is defined as $\mu_{LEL}$ and the carrier residence time in the carrier injection layer is defined as $\tau_{CIL}$, the following condition is established:

$$\tau_{LEL} >> \tau_{CIL}$$

so that the recombination efficiency is improved. Since $\tau = d/\mu \cdot E$ (where d is the film thickness and E is the electric field strength), the above condition can be rewritten as follows:

$$d_{LEL}/\mu_{LEL} >> d_{CIL}/\mu_{CIL}$$

To increase $\tau_{LEL}$, the film thickness $d_{LEL}$ may be increased. However, in an organic EL device, when the film thickness d is increased, a drive voltage for obtaining an effective electric field strength is greatly increased, resulting in an impractical application. The thickness d is generally set to be about $10^{-5}$ cm. According to the present invention, when $\mu_{LEL} < \mu_{CIL}/10^4$, condition $\tau_{LEL} > 10^4 \cdot \tau_{CIL}$ is established, and the recombination efficiency can be improved.

Assume that $\mu_{CIL}$ is set to be less than $10^{-2}$ cm$^2$/V·sec. Since the electric field strength E applied to the device is $10^6$ V/cm, the carrier residence time $\tau_{CIL}$ is estimated to be about $10^{-9}$ sec. In the organic EL device according to the present invention, condition $\tau_{LEL} > 10^4 \cdot \tau_{CIL}$ is established, the carrier residence time is $10^{-5}$ sec or more. On the other hand, the carrier recombination rate in the organic film is generally on the order of $10^{-6}$ sec. Therefore, if the carrier residence time $\tau_{LEL}$ for which the carriers exist in the light-emitting layer is $10^{-5}$ sec or more, a time required by carrier recombination is sufficiently assured. The recombination probability can be increased because the electrons and holes exist in the light-emitting layer at a high density, and the luminous efficiency can be increased. As a result, the thickness of the light-emitting layer can be reduced. In this case, since the device resistance is proportional to a reciprocal of the carrier mobility, the device resistance of at least the carrier injection layer can be reduced, thereby reducing the drive voltage.

To realize such an organic EL device, the mobility of the electrons and the holes in the respective organic films constituting the device can be controlled. Various types of device structures can be proposed in accordance with different control techniques:

(A) a device structure in which a single organic compound is used to set a light-emitting layer as a region having an amorphous structure and a carrier injection layer as a region having a crystalline structure, by utilizing the characteristic that the carrier mobility in an organic film is high in the crystalline structure and is low in the amorphous structure; (B) a device structure in which different types of organic films having different carrier mobilities are stacked; and (C) a device structure in which a light-emitting layer has a band with a continuous potential well structure.

An organic EL device having the device structure (A) will be described in detail below. To manufacture the organic EL device having this device structure, only one type of organic compound is used, and deposition conditions are controlled so that an organic film having a crystalline structure, an organic film (light-emitting layer) having an amorphous structure, and an organic film having a crystalline structure are sequentially stacked. The carrier mobilities of the organic films measured by the TOF method are $10^{-10}$ to $10^{-4}$ cm$^2$/V·sec for the organic film having the amorphous structure, and $10^{-5}$ to $10^2$ cm$^2$/V·sec for the organic film having the crystalline structure. When an appropriate material is selected to obtain the above structure, the above conditions are satisfied.

An organic EL device having the device structure (B) will be described in detail below. This organic EL device has a multilayered structure in which first to nth organic films are sandwiched between a first electrode for electron injection and a second electrode for hole injection from the first electrode side. In this device, a plurality of organic materials having different carrier mobilities are used. Assume that the mth organic film serves as a light-emitting layer. If the electron mobility of the ith organic film is defined as $\mu^e_i$, and the hole mobility of this film is defined as $\mu^h_i$, condition $\mu^e_i/\mu^e_m > 10^4$ (i=1 to m−1) is established for the electron mobility, and condition $\mu^h_i/\mu^h_m > 10^4$ (i=n to m+1) is established for the hole mobility.

Figure 26:
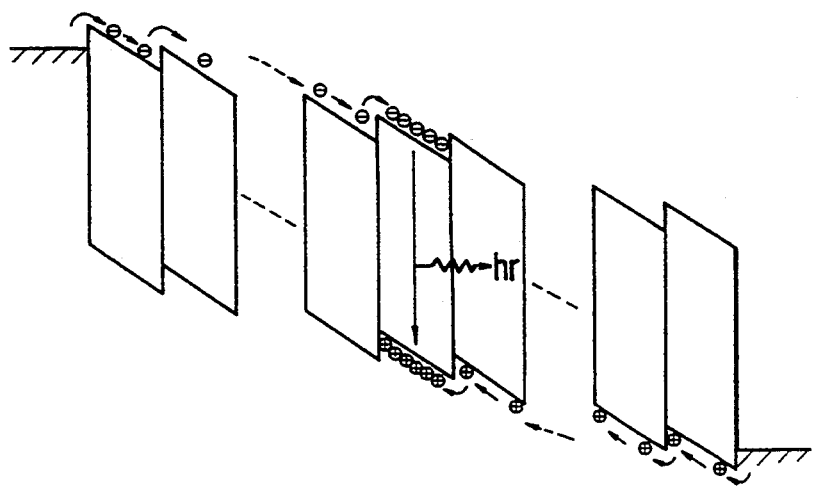
FIG. 26 is a band diagram for explaining the principle of operation in device in FIG. 25.

FIG. 25 shows junction states of this organic EL device. The operation of this organic EL device will be described with reference to FIG. 26. A negative voltage is applied to a first electrode $M_1$. Electrons are sequentially injected from the first electrode $M_1$ to a first organic film $O_1$ and a second organic film $O_2$, and then an mth organic film $O_m$. Since the electron mobility in the mth organic film $O_m$ is low, the electrons are stored in the mth organic film $O_m$, thereby forming a space-charge layer having a high electron density. On the other hand, holes are sequentially injected from a second electrode $M_2$ to an nth organic film $O_n$, an (n−1)th organic film $O_{n-1}$, and then the mth organic film $O_m$. Since the hole mobility in the mth organic film $O_m$ is low, the holes are stored in the mth organic film $O_m$, thereby forming a space-charge layer having a high hole density. Recombination occurs between the space-charge layers of the electrons and holes, which are formed in the mth organic film $O_m$, thereby emitting light. That is, the electrons and the holes which are injected in the mth organic film $O_m$ have a higher rate of recombining than the rate of transferring the electrons and the holes to the adjacent layers, thereby increasing the luminous efficiency.

In addition, in the organic EL device having the device structure (B), if the carrier injection layer is constituted by the organic film having the crystalline structure so as to increase the carrier mobility, the device resistance can be reduced, thereby reducing the drive voltage.

An organic EL device having the structure (C) will be described in detail. In this organic EL device, a light-emitting layer (an mth layer) in the organic EL device, for example, shown in FIG. 25 is constituted by a multilayered structure in which two different organic films $m_1$ and $m_2$ are alternately stacked on each other. If the band gaps of these two different organic films are defined as $E_{gm1}$ and $E_{gm2}$, and energy differences of the valence and conduction bands from the vacuum level are defined as $E_{Vm1}$, $E_{Cm1}$, $E_{Vm2}$, and $E_{Cm2}$, the following conditions are established:

$E_{gm1} < E_{gm2}$
$E_{Cm1} > E_{Cm2}$
$E_{Vm1} < E_{Vm2}$

Figure 27:
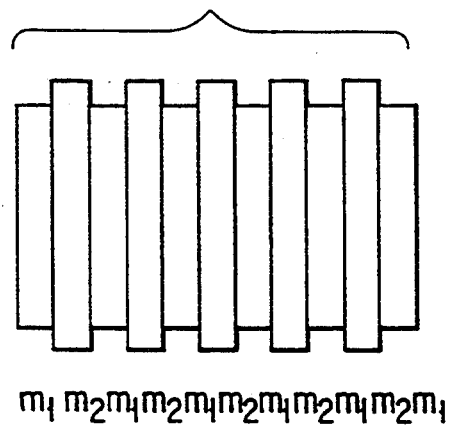
FIG. 27 is a band diagram at a flat band bias in a light-emitting layer constituting still another organic EL device according to the present invention.
Figure 28:
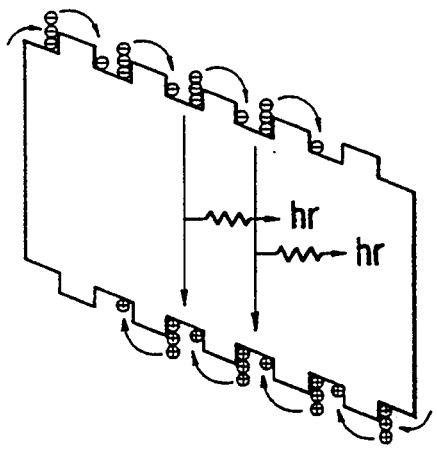
FIG. 28 is a band diagram in a light-emitting layer for expiating the principle of operation in the device in FIG. 27.

The following conditions are preferably established:
$E_{Cm1} - E_{Cm2} \leq 0.4$ eV
$E_{Vm2} - E_{Vm1} \leq 0.4$ eV FIG. 27 shows the junction states of the light-emitting layer of this organic EL device. The principle of operation of this device will be described with reference to FIG. 28. When the two different organic films $m_1$ and $m_2$ are alternately stacked, the valence and conduction bands serve as a band structure in which shallow potential wells are continuous. As in FIG. 25, when the electrons are injected from a first electrode (not shown) to the organic film $m_1$ through first to (m−1)th organic films (not shown), the electrons are stored at a given density in front of the barrier due to the presence of a low barrier against electron injection between the organic film $m_1$ and the adjacent organic film $m_2$. When an electrical field enough to increase the storage density to allow the electrons to move over the barrier is applied, the electrons are injected in the organic film $m_2$. The electrons injected in the organic film $m_2$ are directly injected in the next organic film $m_1$ because no barrier is formed between this organic film $m_2$ and the adjacent organic film $m_1$, thereby storing the electrons again. In this manner, storage sequentially occurs at each of the continuously formed barriers. A space-charge layer of the electrons is formed as a whole. On the other hand, when the holes are injected from a second electrode (not shown) to the organic film $m_1$ through nth to (m+1)th organic films (not shown), the positive holes are stored at a given density in front of the barrier due to the presence of a low barrier against hole injection between the organic film $m_1$ and the adjacent organic film $m_2$. when an electric field enough to increase the storage density to cause the holes to move over the barrier, the holes are injected in the organic film $m_2$. The holes injected in the organic film $m_2$ are directly injected in the next organic film $m_1$ due to the absence of the barrier between the organic film $m_2$ and the adjacent organic film $m_1$, thereby storing the holes again. In this manner, storage sequentially occurs at the continuously formed barriers. A space-charge layer of the holes is formed as a whole. The space-charge layers of the electrons and the holes overlap each other in the organic film $m_1$, thereby causing recombination and emission. At this time, the emission wavelength corresponds to $E_{gm1}$.

Since the low barriers are continuously formed in the light-emitting layer of this organic EL device, the apparent carrier mobility is reduced, and the space-charge layers are formed to effectively recombine the carriers. The carrier mobilities of the two different organic films $m_1$ and $m_2$ need not be low, and films having high carrier mobilities may be used.

In the organic EL device, a method of measuring the magnitudes of energy levels at each junction interface is required to select materials satisfying the above conditions. This method is a displacement current method or an ultraviolet electron spectroscopy to be described below.

FIGS. 29A and 29B are a sectional view of a device used in the displacement current method and a waveform chart of a voltage applied thereto, respectively. In this displacement current method, a device consisting of metal electrode 21/silicon 22/silicon oxide film 23/organic film 24/metal electrode 25 is formed, and a triangular wave voltage is applied to this device. A displacement current of this element at this time is measured. If the capacitance of the device is given as C, the displacement current is represented as $I = C \cdot dV/dt$. If the organic film 24 is omitted from the above device structure, the device serves as a known MOS device, and its capacitance is determined by the silicon oxide film 23. To the contrary, in the presence of the organic film 24, the following displacement current is observed in accordance with comparison between the Fermi level of the organic film 24 and the work function of the metal electrode 25. The work function of the metal electrode 25 is given as $E_M$, the conduction band level of the organic film 24 is given as $E_C$, and the valence band level is given as $E_V$.

(a) $E_M - M_C > 0.6$ eV and $E_V - E_M > 0.6$ eV

In this case, the junction between the metal electrode 25 and the organic film 24 has a high barrier against both the electrons and the holes. Since the organic film 24 is regarded as an insulating film, the device capacitance is a series capacitance of the silicon oxide film 23 and the organic film 24 and has a constant value smaller than that of the MOS device. Therefore, the displacement current obtained upon application of a triangular wave voltage is a small constant value regardless of the magnitude of the voltage, as shown in FIG. 30.

(b) $E_M - E_C \leq 0.6$ eV and $E_V - E_M > 0.6$ eV

In this case, the metal electrode 25 and the organic film 24 form a junction through which the electrons can be easily injected from the metal electrode 25 to the organic film 24. When the triangular wave voltage is applied to the device, the electrons are injected from the metal electrode 25 to the organic film 24 while the metal electrode 25 is set negative. These electrons are stored at the interface between the organic film 24 and the silicon oxide film 23. In this state, the device capacitance has a value determined by the silicon oxide film 23, and the displacement current is increased to the level of the MOS device. On the other hand, when the metal electrode 25 is set positive, the electrons in the organic film 24 flow into the metal electrode 25, and the displacement current is reduced to a small value almost equal to that obtained when the organic film 24 is regarded as an insulator. At this time, if a voltage to cause electron injection is given as $V_{th1}$ and a flat band potential is given as $V_{FB}$, a voltage $V_{th,org}$ applied to the organic film is defined as follows:

$$V_{th,org} = V_{th1}[C_{ox}/(C_{ox}+C_{org})](V_{th1}-V_{FB})$$

(where $C_{org}$ is the capacitance of the organic film 24, and $C_{ox}$ is the capacitance of the silicon oxide film 23). In this case, $V_{th,org}$ approximately corresponds to the barrier height ($E_M - E_C$) against the electron injection from the metal electrode 25 to the organic film 24. If $E_M$ is known, $E_C$ can be obtained by measuring $V_{th1}$ and $V_{FB}$. In addition, if $E_C$ is obtained, the band gap of the organic film 24 can be measured by optical measurement, thereby obtaining $E_V$.

(c) $E_M - E_C > 0.6$ eV and $E_V - E_M \leq 0.6$ eV

Figure 32:
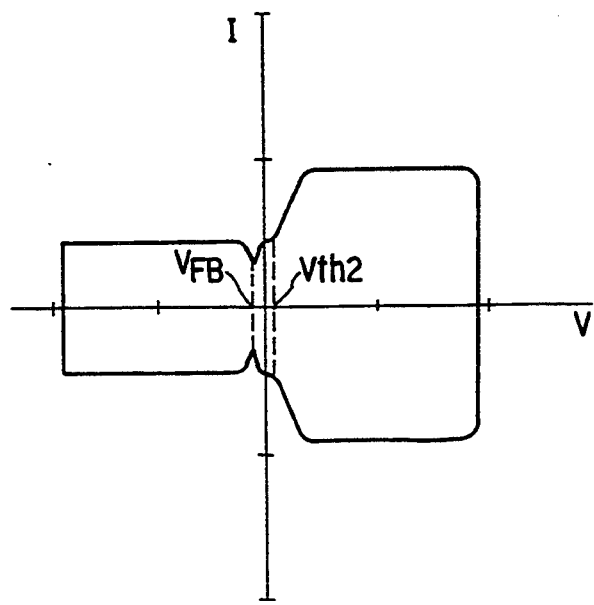
FIG. 32 shows still another displacement current detected by the displacement current method.

In this case, the metal electrode 25 and the organic film 24 form a junction through which the holes can be easily injected from the metal electrode 25 to the organic film 24. When the triangular wave voltage is applied such that the metal electrode 25 is set positive, the holes are injected from the metal electrode 25 to the organic film 24. These holes are stored at the interface between the organic film 24 and the silicon oxide film 23. In this state, the device capacitance has a value determined by the silicon oxide film 23. As shown in FIG. 32, the displacement current is increased to the level of the MOS device. On the other hand, when the metal electrode 25 is set negative, the holes in the organic film 24 flow into the metal electrode 25, and the displacement current is decreased to a value equal to that obtained when the organic film 24 is regarded as an insulator. At this time, $E_V$ is obtained by measuring a voltage to cause hole injection $V_{th2}$ and $V_{FB}$. $E_C$ can also be obtained by measuring the band gap of the organic film 24.

Figure 33:
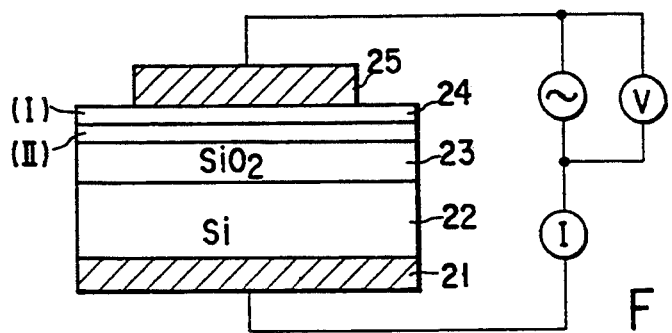
FIG. 33 is a sectional view of another device used in a measurement by a displacement current method.

Whether the junction barrier height at the interface between the organic films is not more than 0.6 eV or not can be examined by the displacement current method. In this case, as shown in FIG. 33, a device structure of metal electrode/silicon/silicon oxide film/organic film (II)/organic film (I)/metal electrode is employed. When a triangular wave voltage is supplied to the device in the same manner as described above, different waveforms are observed depending on the junction barrier at the interface between the organic film (I) and the organic film (II). For the sake of descriptive simplicity, assume that the organic film (I) and the organic film (II) are organic films having electron injection characteristics, respectively.

Figure 34:
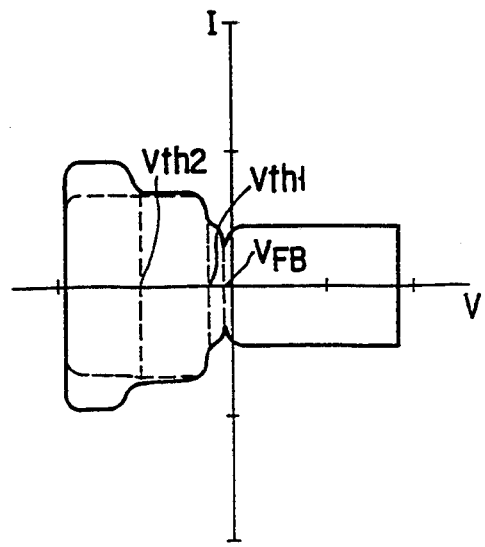
FIG. 34 shows a displacement current detected by the displacement current method in FIG. 33.

When the junction barrier at the interface between the organic film (I) and the organic film (II) exceeds 0.6 eV, electron injection can hardly occur from the organic film (I) to the organic film (II). The resultant displacement current waveform is represented by a broken line in FIG. 34, and the current increases with a negative voltage ($V_{th1}$) at which electron injection occurs from the metal electrode to the organic film (I). However, the current intensity does not reach the MOS device level but becomes constant at an intermediate level.

When the Junction barrier at the interface between the organic film (I) and the organic film (II) is 0.6 eV or less, electron injection occurs from the organic film (I)

to the organic film (II). The resultant displacement current waveform is indicated by the solid line in FIG. 34. The current increases with a negative voltage ($V_{th1}$) at which electron injection from the metal electrode to the organic film (I) occurs. In addition, the current further increases with a negative voltage ($V_{th2}$) at which electron injection from the organic film (I) to the organic film (II) occurs. Therefore, the current intensity reaches the MOS device level.

The barrier against hole injection can be similarly examined.

According to the ultraviolet electron spectroscopy, an organic film is deposited on a metal substrate such as a copper, gold, or stainless substrate to a thickness of about 100 nm to obtain a sample. A hydrogen discharge tube is used as a light source. Light from the light source is spectroscopically analyzed by the vacuum ultraviolet spectroscopy. The sample is irradiated with a many-line spectrum of hydrogen in the wavelength range of 120 to 200 nm, i.e., the energy range of 6 to 10 eV. At this time, photons emitted from the sample on the substrate are received by a spherical electrode, the inner surface of which is coated with graphite or gold. As a result, the valence band level $E_V$ of the organic film with reference to the vacuum level can be obtained. When $E_V$ is obtained, the band gap of the organic film is measured by optical measurement, thereby obtaining the conduction band level $E_C$.

EXAMPLES

Examples of the present invention will be described below.

COMPARATIVE EXAMPLE 1

An organic EL device is obtained by the following method. An ITO film (second electrode) having a sheet resistance of 10 $\Omega/cm^2$ is formed on a glass substrate by a sputtering method. An organic coloring material represented by (C31) is deposited at a rate of 0.5 nm/sec by a vacuum sublimation method, using a vacuum deposition apparatus in which a substrate temperature was kept at 20° C. and a degree of vacuum is about $10^{-6}$ Torr, thereby forming a second organic film having a film thickness of 100 nm. Under the same conditions as described above, an organic coloring material represented by (C32) is deposited by the vacuum sublimation method to form a first organic film having a film thickness of 100 nm. An Al film (first electrode) having a film thickness of 100 nm is formed by the vacuum deposition method. Note that the second organic film and the first organic film which are formed under the above conditions have amorphous structures.

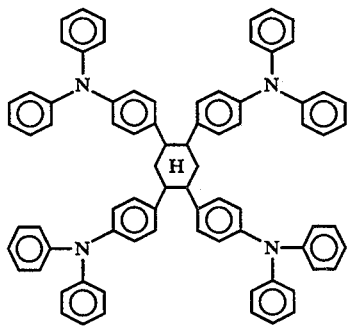
(C31)

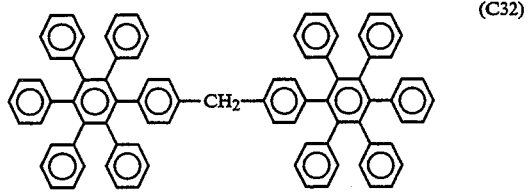
(C32)

Energy differences of the respective layers constituting this device with respect to the vacuum level are confirmed as follows:

$E_{M2}$=4.8 eV
$E_{V2}$=5.0 eV, $E_{C2}$=1.5 eV
$E_{V1}$=5.5 eV, $E_{C1}$=2.0 eV
$E_{M1}$=3.2 eV

When a bias is applied to this device such that the second electrode (ITO electrode) is positive, a current density of 100 mA/cm$^2$ and emission having a luminance of 1,000 cd/m$^2$ are obtained at a voltage of 20 V. At this time, the emission wavelength is 470 nm which corresponds to the band gap of the first organic film.

EXAMPLE 1

Under the same conditions as in Comparative Example 1, i.e., at a substrate temperature of 20° C. and a degree of vacuum of about $10^{-6}$ Torr, the organic coloring material represented by (C31) is deposited at a rate of 0.5 nm/sec by the vacuum sublimation method to form a 80-nm thick second organic film. This second organic film has an amorphous structure. The substrate temperature is increased to 50° C., and the organic coloring material represented by (C32) is deposited at a rate of 0.02 nm/sec to form a 20-nm thick first organic film. This first organic film is observed with a scanning electron microscope and is found to have a polycrystalline structure in which grains each having a diameter of about 20 nm are aggregated. When a first electrode is formed on the first organic film, the metal is filled like a filament in the first organic film to a depth of about 20 nm, thereby forming a field emission electrode. Thus, the organic EL device shown in FIG. 7 is manufactured.

When a bias is applied to the resultant device such that the ITO electrode is positive, a current density of 100 mA/cm$^2$ and emission having a luminance of 1,000 cd/m$^2$ are obtained at a voltage of 15 V lower than that in Comparative Example 1. The emission wavelength is 470 nm, and a blue emission device can be realized.

EXAMPLE 2

Under the same conditions as in Comparative Example 1, i.e., at a substrate temperature of 20° C. and a degree of vacuum of about $10^{-6}$ Torr, a second organic film having a film thickness of 80 nm is formed at a rate of 0.5 nm/sec. A 20-nm thick first organic film is formed on the second organic film, and a 20-nm thick insulating or semiconductive inorganic oxide (e.g., $Al_2O_3$ or MgO) is formed on the amorphous first organic film. When a first electrode is formed on the inorganic oxide, the metal is filled like a filament in the inorganic oxide to form a field emission electrode.

When a bias is applied to the resultant device such that the ITO electrode is positive, emission having a luminance of 1,000 cd/m$^2$ is obtained at a current density of 100 mA/cm$^2$ and a voltage of 15 V lower than that in Comparative Example 1. The emission wavelength is 470 nm, and a blue emission device can be realized.

EXAMPLE 3

A second organic film is formed under the same conditions as in Comparative Example 1, and a first organic film is formed on the second organic film. A photoresist is formed on the first organic film to a film thickness of 50 nm by a spin coating method and is exposed using a photomask having a dot pattern consisting of dots having a pitch of 15 μm and each having a diameter of 5 μm and developed, thereby forming pin holes each having a diameter of 5 μm in the photoresist. When a first electrode is deposited on the resultant resist pattern, the metal is filled like a filament having a diameter of 5 fm in the first organic film.

When a bias is applied to the resultant device such that the ITO electrode is positive, emission having a luminance of 1,000 cd/m$^2$ is obtained at a current density of 100 mA/cm$^2$ and a voltage of 10 V lower than that in Example 2. The emission wavelength is 470 nm, and a blue emission device can be realized.

COMPARATIVE EXAMPLE 2

An organic EL device is obtained by the following method. An ITO film (second electrode) having a sheet resistance of 10 Ω/cm$^2$ is formed on a glass substrate by a sputtering method. An organic coloring material represented by (C33) is deposited at a rate of 0.5 nm/sec by a vacuum sublimation method, using a vacuum deposition apparatus in which a degree of vacuum is about $10^{-6}$ Torr, thereby forming a second organic film having a film thickness of 100 nm. Under the same conditions as described above, an organic coloring material represented by (C34) is deposited by the vacuum sublimation method to form a first organic film having a film thickness of 100 nm. An Mg film (first electrode) having a film thickness of 100 nm is formed by the vacuum deposition method.

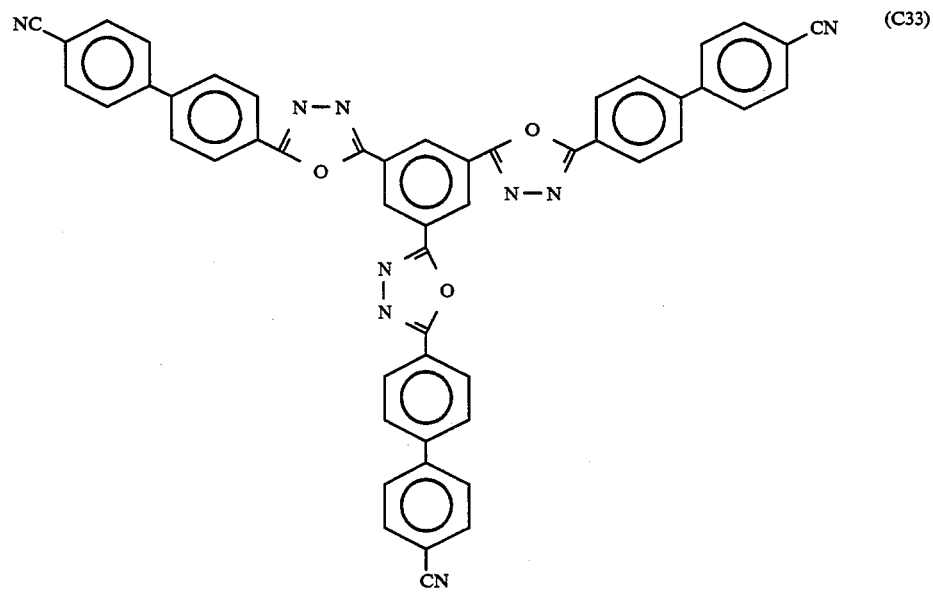

(C33)

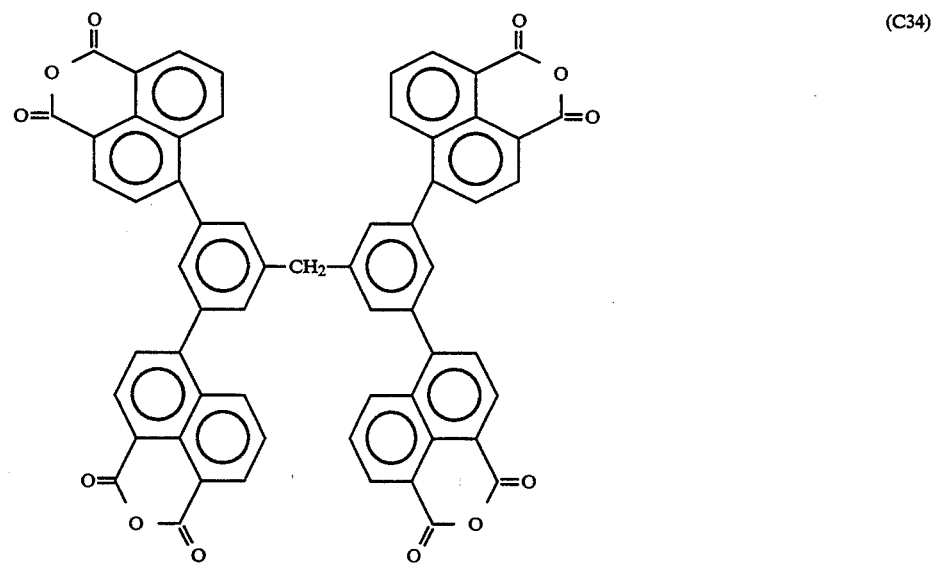

(C34)

Energy differences of the respective layers constituting this device with respect to the vacuum level are confirmed as follows:

$E_{M2}=4.8$ eV
$E_{V2}=6.5$ eV, $E_{C2}=3.5$ eV
$E_{V1}=7.5$ eV, $E_{C1}=4.0$ eV
$E_{M1}=4.8$ eV

When a bias is applied to this device such that the second electrode (ITO electrode) is positive, a current density of 100 mA/cm$^2$ and emission having a luminance of 1,000 cd/m$^2$ are obtained at a voltage of 50 V. At this time, the emission wavelength is 470 nm which corresponds to the band gap of the second organic film.

EXAMPLE 4

Following the same procedures as in Comparative Example 2, an ITO film (second electrode) having a sheet resistance of 10 Ω/cm$^2$ is formed on a glass substrate by a sputtering method. This substrate is dipped in 10 wt % HCl solution for one minute to etch the surface of the substrate, thereby forming projections each having a height of about 100 nm and hence forming a field emission electrode. Thereafter, a 100-nm thick second organic film (C33), a 100-nm thick first organic film (C34), and a 100-nm thick Mg film (first electrode) are sequentially formed following the same procedures as in Comparative Example 2, thereby manufacturing the organic EL device shown in FIG. 10.

When a bias is applied to this device such that the second electrode (ITO electrode) is positive, a current density of 100 mA/cm$^2$ and emission having a luminance of 1,000 cd/m$^2$ are obtained at a voltage of 15 V lower than that of Comparative Example 2. At this time, the emission wavelength is 470 nm which corresponds to the band gap of the second organic film.

EXAMPLE 5

An organic EL device is manufactured by the following method. An ITO film (second electrode) having a sheet resistance of 10 Ω/cm$^2$ is formed to a thickness of 200 nm by a sputtering method on a glass substrate (NA40 available from HOYA) which does not contain an alkali component. Since the ITO film has a polycrystalline structure and projections each having a height of about 20 to 30 nm, it can serve as a field emission electrode without any treatment. However, in order to improve the function of the field emission electrode, the ITO film is electrochemically dissolved. More specifically, an AC power supply is connected between the ITO film and a Pt electrode serving as a counterelectrode, and the resultant structure is dipped in an electrolytic solution. When a current is supplied to this structure, the ITO film is electrochemically etched. As a result, the height of each projection is increased to about 50 nm, thereby obtaining a good field emission electrode.

Organic molecules (PPCP) represented by (C1) are deposited at a high rate of 0.1 nm/sec by a vacuum deposition method while the substrate temperature is kept at 15° C. and a degree of vacuum is set to be about 10$^{-6}$ Torr to form a 100-nm thick second organic film. Subsequently, organic molecules (BBOT) represented by (C7) are deposited at a high deposition rate of 1.0 nm/sec by the vacuum deposition method. When the film thickness reaches 100 nm, the deposition rate is decreased to 0.01 nm/sec, and the organic molecules (BBOT) are additionally deposited to a thickness of 50 nm, thereby forming a first organic film. When the deposition rate is high, the flat organic film having an amorphous structure is formed. On the other hand, when the deposition rate is decreased, the organic film having a polycrystalline structure is formed. A 100-nm thick Mg-Ag film (first electrode) is formed on the first organic film by an EB deposition method, thereby forming an electrode in which the metal is filled like a filament in the organic film.

In the resultant organic EL device, when the valence band levels of the first and second organic films 4 and 3 are given as $E_{V1}$ and $E_{V2}$, condition $E_{V1}-E_{V2} \leq 0.6$ eV is confirmed to be satisfied in accordance with the displacement current method.

When a bias voltage is applied to this device such that the second electrode (ITO electrode) is positive, a current density of 100 mA/cm$^2$ and emission having a luminance of 2,000 cd/m$^2$ are obtained at a voltage of 15 V, thereby achieving blue emission. At this time, the emission peak wavelength is 477 nm which corresponds to the band gap of the second organic film when the Stokes shift is taken into consideration.

EXAMPLES 6–24

Organic EL devices of Examples 6 to 24 are manufactured following the same procedures as in Example 5 except that a substrate temperature is set to be 10° to 30° C., a degree of vacuum is set to be 10$^{-5}$ Torr or less, and organic molecules shown in Table 2 are deposited to form first and second organic films. Organic films marked with ⊙ serve as organic films constituting light-emitting layers in Table 2.

TABLE 2

| Example | First Organic Film | Second Organic Film | Emission peak wavelength (nm) |
|---|---|---|---|
| 6 | OXD-S6 | ⊙PPCP | 447 |
| 7 | OXD-S1 | ⊙PPCP | 448 |
| 8 | OXD-F1 | ⊙PPCP | 444 |
| 9 | OXD-7 | ⊙PPCP | 453 |
| 10 | ⊙BBOT | PBBO | 473 |
| 11 | ⊙OXD-S6 | ⊙PBBO | 430 |
| 12 | OXD-S1 | ⊙PBBO | 437 |
| 13 | OXD-F1 | ⊙PBBO | 447 |
| 14 | OXD-7 | ⊙PBBO | 448 |
| 15 | ⊙DNIBPC | PBBO | 463 |
| 16 | ⊙PBBO | DIAMINE | 453 |
| 17 | PBBO | ⊙OXD-8 | 462 |
| 18 | PBBO | ⊙PPCP | 448 |
| 19 | ⊙OXD-S1 | ⊙OXD-7 | 371 |
| 20 | ⊙BBOT | OXD-7 | 474 |
| 21 | ⊙DNIBPC | OXD-7 | 460 |
| 22 | ⊙BBOT | OXD-S1 | 476 |
| 23 | ⊙DNIBPC | OXD-S1 | 462 |
| 24 | DNIBPC | ⊙BBOT | 482 |

In these organic EL devices, if the valence band levels of the first and second organic films are defined as $E_{V1}$ and $E_{V2}$ and the conduction band levels are defined as $E_{C1}$ and $E_{C2}$, condition $E_{V1}-E_{V2} \leq 0.6$ eV is confirmed to be established for Examples 6 to 9 and 16 to 18, and condition $E_{C1}-E_{C2} \leq 0.6$ eV is confirmed to be established for Examples 10 to 15 and 19 to 24 according to the displacement current method.

In each of these devices, when a bias voltage is applied such that the second electrode is positive, blue emission having a luminance of 1000 to 2000 cd/m$^2$ under a current density of 100 mA/cm$^2$ is obtained from at least one of the first and second organic films at a voltage ranging from 10 to 15 V. At this time, the emission peak wavelength falls within the range of 371 to 482 nm, as shown in Table 2 and corresponds to the band gap of the organic film serving as the light-emitting layer when the Stokes shift is taken into consideration.

COMPARATIVE EXAMPLES 3-6

Organic EL devices of Comparative Examples 3 to 6 are manufactured under the same conditions as in Example 5 such that organic molecules shown in Table 3 are deposited to form first and second organic films. Organic films marked with ⊙ serve as organic films constituting light-emitting layers in Table 3.

TABLE 3

| Comparative Example | First Organic Film | Second Organic Film | Emission peak wavelength (nm) |
|---|---|---|---|
| 1 | DNIBPC | DIAMINE | 616 |
| 2 | BBOT | DIAMINE | 532 |
| 3 | OXD-S6 | DIAMINE | 505 |
| 4 | OXD-S1 | DIAMINE | 499 |

In these organic EL devices, if the valence band levels of the first and second organic films are defined as $E_{V1}$ and $E_{V2}$ and the conduction band levels are defined as $E_{C1}$ and $E_{C2}$, neither condition $E_{V1}-E_{V2} \leq 0.6$ eV nor condition $E_{C1}-E_{C2} \leq 0.6$ eV are confirmed to be satisfied according to the displacement current method.

In each of these devices, when a bias is applied such that the second electrode is positive, emission spectra having peak wavelengths respectively shown in Table 3 are observed. In Table 3, organic molecules used in the first and second organic films have band gaps of 3.1 eV or more. In other words, emission having a wavelength longer than the wavelength determined by the band gap is obtained. Therefore, in each of these devices, CT emission is found to occur due to the CT level formed at the interface between the first and second organic films.

EXAMPLE 25

Figure 35:
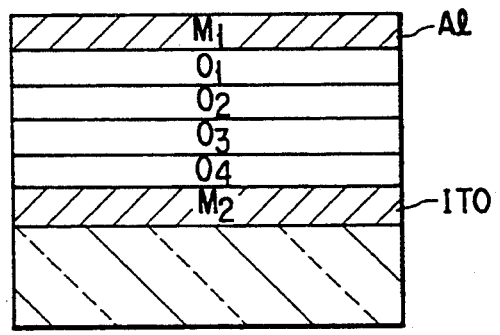
FIG. 35 is a sectional view showing the structure of the organic EL device of Example 25 in the present invention.

An organic EL device shown in FIG. 35 is manufactured in this example. This device comprises an Al electrode ($M_1$) for electron injection, an organic film ($O_1$) consisting of an organic compound represented by (C35), an organic film ($O_2$) consisting of an organic compound represented by (C36), an organic film ($O_3$) consisting of an organic compound represented by (C37), an organic film ($O_4$) consisting of an organic compound represented by (C38), and an ITO electrode ($M_2$) for hole injection, when viewed from the top. Light is detected on the side of the glass substrate.

The ITO electrode is formed by a sputtering method and has a sheet resistance of 10 $\Omega/cm^2$. The respective organic films are sequentially formed at a degree of vacuum of about $10^{-6}$ Torr in accordance with a vacuum sublimation method and have a film thickness of 30 nm. The Al electrode is formed by a vacuum deposition method and has a film thickness of 100 nm.

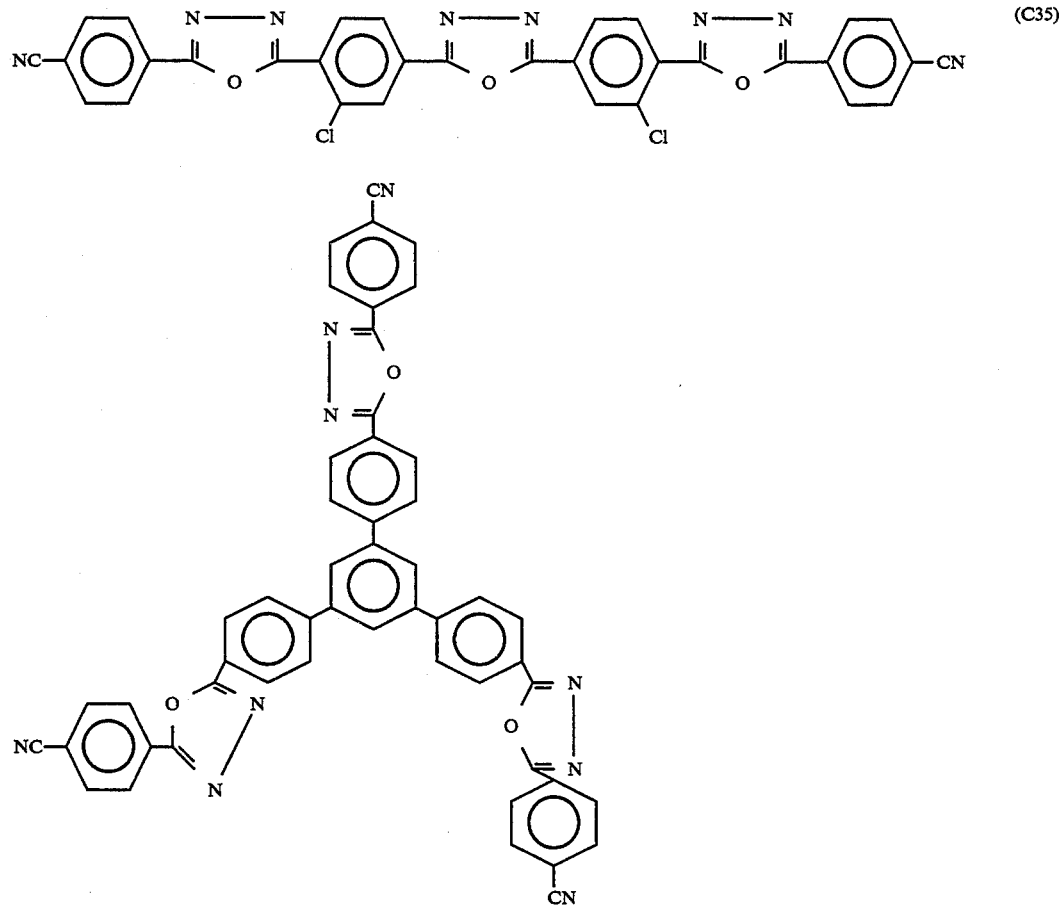

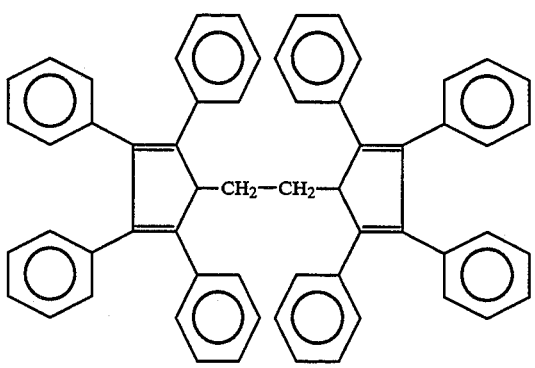
(C37)

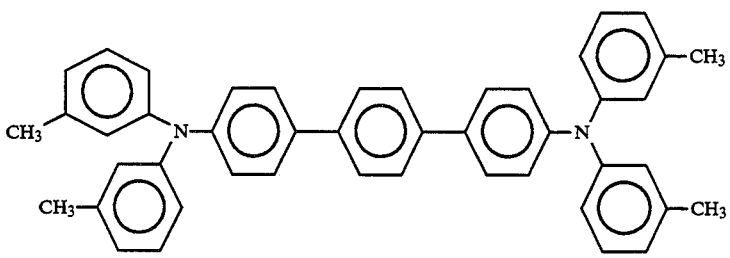
(C38)

The energy differences of the respective layers constituting this device with respect to the vacuum level are confirmed to be the following values in accordance with the displacement current method.

|  | $E_C (E_A)$ | $E_V (I_P)$ | $E_g$ |
| --- | --- | --- | --- |
| Al electrode | $E_{M1} = 4.2$ eV | | |
| $O_1$ | 3.6 eV | 6.6 eV | 3.0 eV |
| $O_2$ | 3.1 eV | 6.1 eV | 3.0 eV |
| $O_3$ | 2.7 eV | 5.7 eV | 3.0 eV |
| $O_4$ | 2.2 eV | 5.2 eV | 3.0 eV |
| ITO electrode | $E_{M2} = 4.8$ eV | | |

Figure 36:
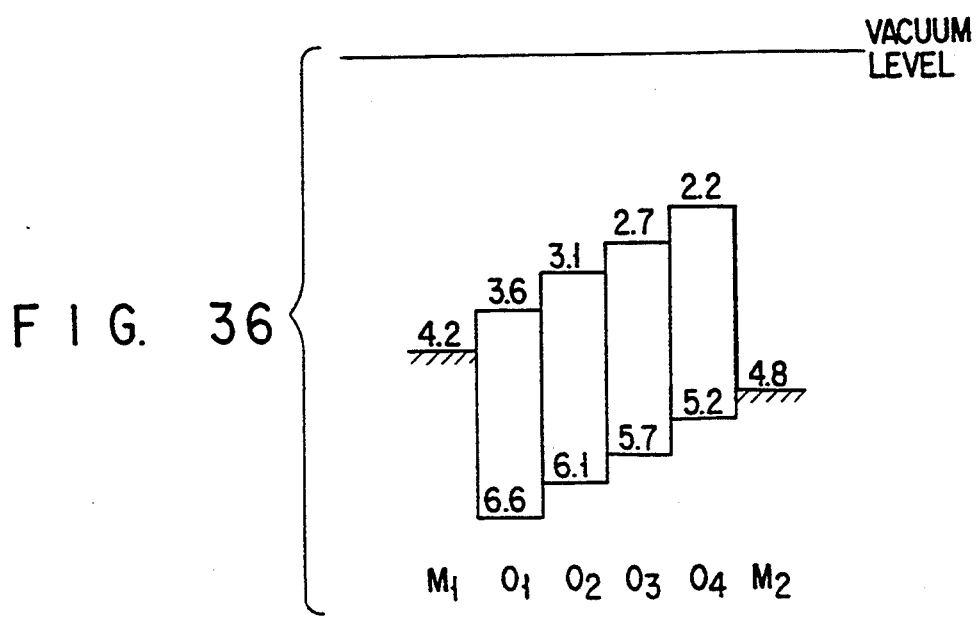
FIG. 36 is a band diagram at a flat band bias in the organic EL device in FIG. 35.
Figure 37:
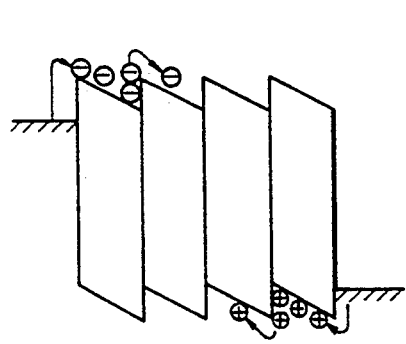
FIG. 37 is a band diagram for explaining the principle of operation when a low bias voltage is applied to the device in FIG. 35.
Figure 38:
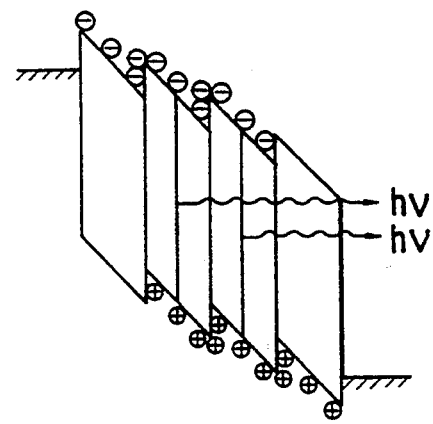
FIG. 38 is a band diagram for explaining the principle of operation when a high bias voltage is applied to the device in FIG. 35.

The flat band diagram obtained when these layers form injections with each other is shown in FIG. 36. This device is operated in accordance with the principle shown in FIGS. 37 and 38. A bias voltage is applied to the device such that the ITO electrode is positive. At this time, the electrons are injected from the Al electrode to the organic film $O_1$. The electrons are subsequently injected into the organic films $O_2$ and $O_3$ while forming space-charge layers. On the other hand, the holes are injected from the ITO electrode to the organic film $O_4$. The holes are injected in the organic films $O_3$ and $O_2$ while forming space-charge layers. The electrons and the holes are recombined in the organic films $O_2$ and $O_3$, thereby emitting light.

In this device, when a bias voltage is applied such that the ITO electrode is positive, a current density of 100 mA/cm² and emission having a luminance of 1,000 cd/cm² are obtained at a voltage of 7 V. At this time, the emission wavelength is 470 nm which corresponds to the band gaps of the organic films $O_2$ and $O_3$. When this device is left in air, the emission luminance is gradually decreased due to oxidation of the Al electrode. In order to maintain the initial characteristics of this device, it must be stored in nitrogen or vacuum. The life time of this device is measured to be about 1,000 hours while being operated at a current density of 10 A/cm².

EXAMPLE 26

Figure 39:
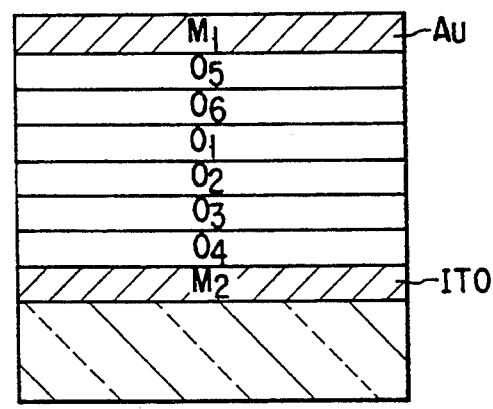
FIG. 39 is a sectional view showing the structure of the organic EL device of Example 26 in the present invention.

An organic EL device shown in FIG. 39 is manufactured in this example. This device comprises an Au electrode ($M_1'$) for electron injection, an organic film ($O_5$) consisting of an organic compound represented by (C39), an organic film ($O_6$) consisting of an organic compound represented by (C40), an organic film ($O_1$) consisting of an organic compound represented by (C35), an organic film ($O_2$) consisting of an organic compound represented by (C36), an organic film ($O_3$) consisting of an organic compound represented by (C37), an organic film ($O_4$) consisting of an organic compound represented by (C38), and an ITO electrode ($M_2$) for hole injection, when viewed from the top. All the layers constituting this organic EL device are formed following the same procedures as in Example 25.

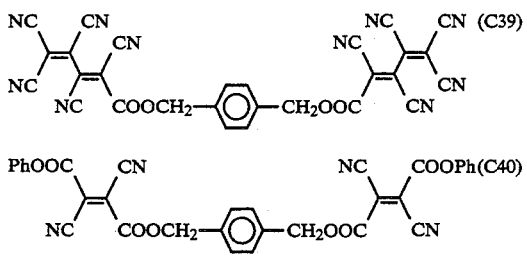

The energy differences of the respective layers constituting this device with respect to the vacuum level are confirmed to be the following values in accordance with the displacement current method.

|  | $E_C (E_A)$ | $E_V (I_P)$ | $E_g$ |
| --- | --- | --- | --- |
| Au electrode | $E_{M1'} = 5.1$ eV | | |
| $O_5$ | 4.5 eV | 7.5 eV | 3.0 eV |
| $O_6$ | 4.0 eV | 7.0 eV | 3.0 eV |
| $O_1$ | 3.6 eV | 6.6 eV | 3.0 eV |
| $O_2$ | 3.1 eV | 6.1 eV | 3.0 eV |

-continued

|  | $E_C(E_A)$ | $E_V(I_P)$ | $E_g$ |
|---|---|---|---|
| O₃ | 2.7 eV | 5.7 eV | 3.0 eV |
| O₄ | 2.2 eV | 5.2 eV | 3.0 eV |
| ITO electrode | $E_{M2}$ = 4.8 eV | | |

Figure 40:
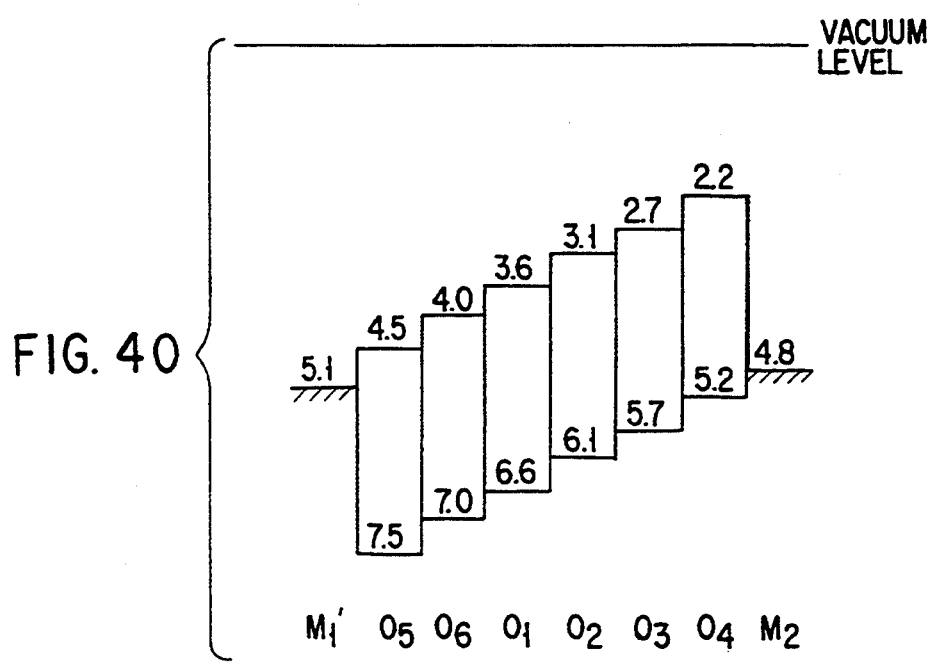
FIG. 40 is a band diagram at a flat band bias in the organic EL device in FIG. 39.

The flat band diagram obtained when these layers form junctions with each other is shown in FIG. 40.

In this device, when a bias voltage is applied such that the ITO electrode is positive, a current density of 50 mA/cm² and emission having a luminance of 500 cd/cm² are obtained at a voltage of 15 V. At this time, the emission wavelength is 470 nm which corresponds to the band gaps of the organic films $O_2$ and $O_3$.

Since the metal (Au) having a high work function is used as the electrode for electron injection, chemical changes in electrode can be prevented to prolong the life time of the device. In practice, even if this device is left in air for one or more month, changes in characteristics are not found. The life time of this device is measured to be about 10,000 hours while being operated at a current density of 10 mA/cm².

EXAMPLE 27

Figure 41:
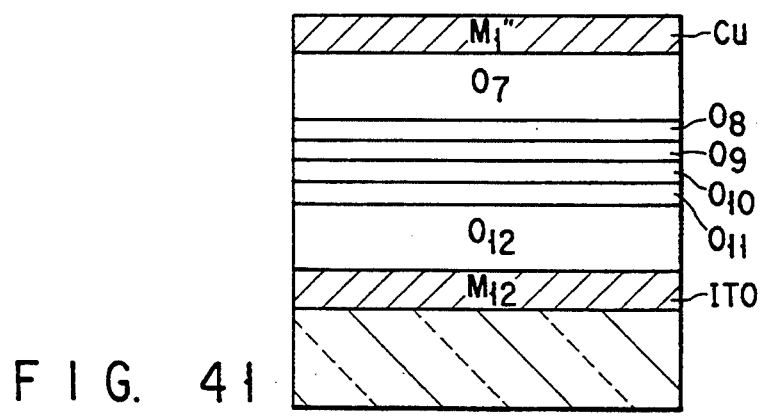
FIG. 41 is a sectional view showing the structure of the organic EL device of Example 27 in the present invention.

An organic EL device shown in FIG. 41 is manufactured in this example. This device comprises a Cu electrode ($M_1''$) for electron injection, an organic film ($O_7$) consisting of an organic compound represented by (C41), an organic film ($O_8$) consisting of an organic compound represented by (C42), an organic film ($O_9$) consisting of an organic compound represented by (C43), an organic film ($O_{10}$) consisting of an organic compound represented by (C44), an organic film ($O_{11}$) consisting of an organic compound represented by (C45), an organic film ($O_{12}$) consisting of an organic compound represented by (C46), and an ITO electrode ($M_2$) for hole injection, when viewed from the top. The thickness of each of the organic films $O_7$ and $O_{12}$ is 150 nm, and the thickness of each of the organic films $O_8$ to $O_{11}$ is 10 nm.

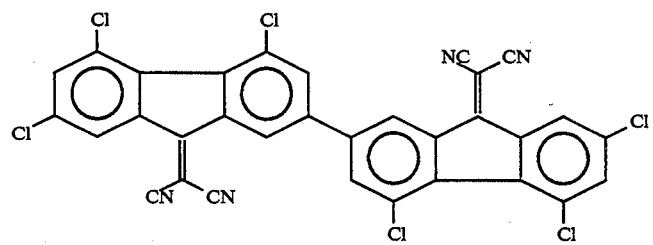

(C41)

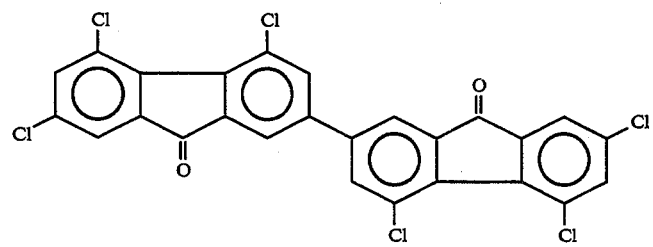

(C42)

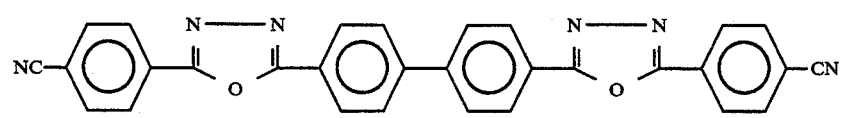

(C43)

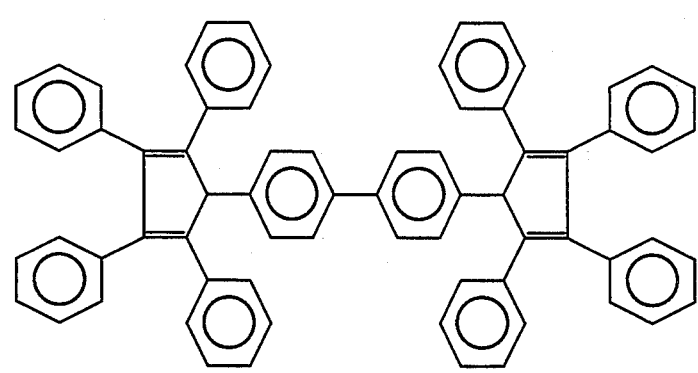

(C44)

(C45)

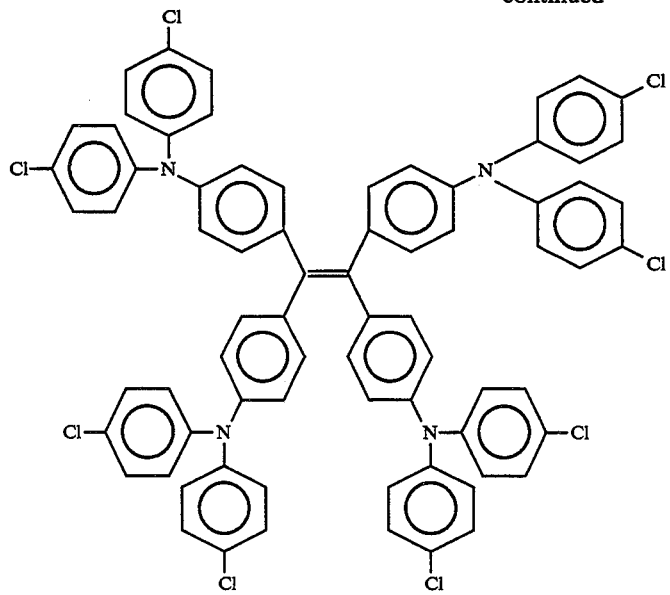

(C46)

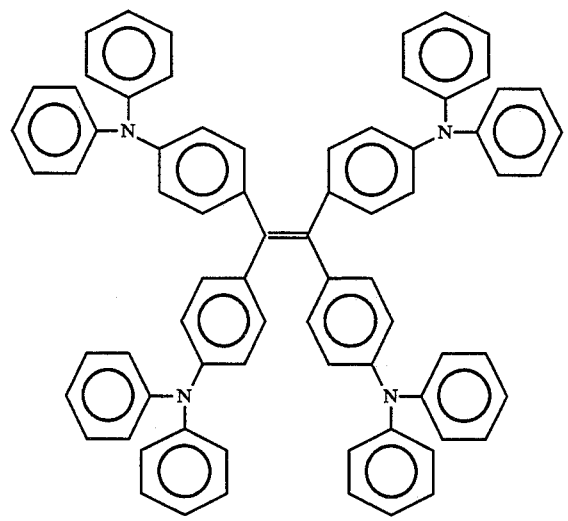

The energy differences of the respective layers constituting this device with respect to the vacuum level are confirmed to be the following values in accordance with the displacement current method.

|  | $E_C (E_A)$ | $E_V (I_P)$ | $E_g$ |
|---|---|---|---|
| Cu electrode | $E_{M1}'' = 4.6$ eV | | |
| $O_7$ | 4.3 eV | 6.8 eV | 2.5 eV |
| $O_8$ | 4.0 eV | 6.5 eV | 2.5 eV |
| $O_9$ | 3.7 eV | 6.2 eV | 2.5 eV |
| $O_{10}$ | 3.4 eV | 5.9 eV | 2.5 eV |
| $O_{11}$ | 3.1 eV | 5.6 eV | 2.5 eV |
| $O_{12}$ | 2.8 eV | 5.3 eV | 2.5 eV |
| ITO electrode | $E_{M2} = 4.8$ eV | | |

Figure 42:
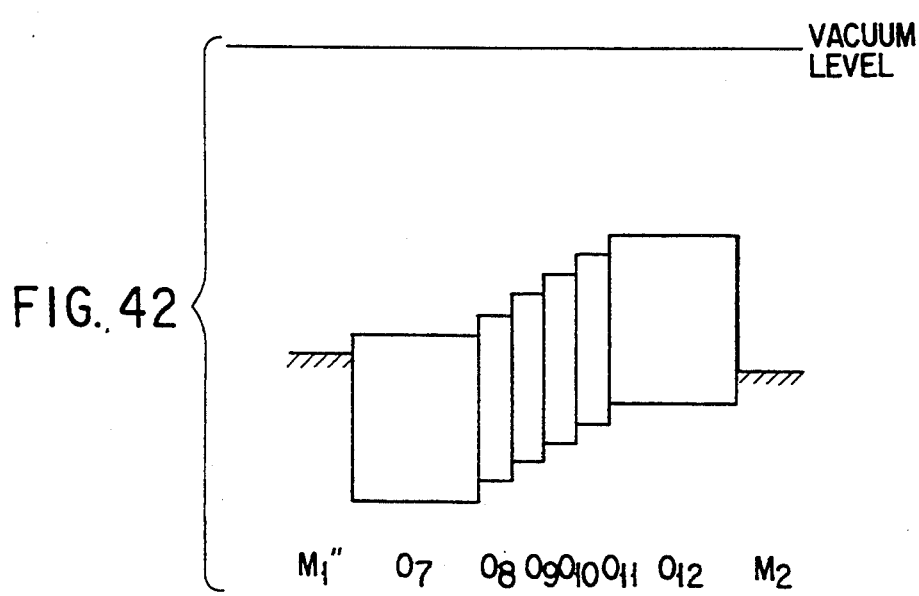
FIG. 42 is a band diagram at flat band bias in the organic EL device in FIG. 41.

The flat band diagram obtained when these layers form junctions with each other is shown in FIG. 42. This device is operated in accordance with the principle shown in FIG. 43.

In this device, since the thickness of the organic film adjacent to the corresponding electrode is large, damage to the organic film in the light-emitting region during formation of the electrode can be prevented. In addition, since the thickness of the organic film in the light-emitting region is small, the space-charge layers of the electrons and the holes can be concentrated in the light-emitting region, thereby improving recombination efficiency.

In this device, when a bias voltage is applied such that the ITO electrode is positive, a current density of 100 mA/cm² and emission having a luminance of 500 cd/cm² are obtained at a voltage of 14 V. At this time, the emission wavelength is 550 nm which corresponds to the band gaps of the central organic films. The life time of this device is measured to be about 5,000 hours while being operated at a current density of 10 mA/cm².

EXAMPLE 28

An organic EL device shown in FIG. 44 is manufactured in this example. This device comprises an Al electrode ($M_1$) for electron injection, an organic film ($O_{13}$) consisting of an organic compound represented by (C47), an organic film ($O_{14}$) consisting of an organic compound represented by (C48), an organic film ($O_{15}$)

consisting of an organic compound represented by (C49), a light-emitting layer (L) consisting of an organic compound represented by (C50), an organic film ($O_{17}$) consisting of an organic compound represented by (C51), an organic film ($O_{18}$) consisting of an organic compound represented by (C52), and an ITO electrode ($M_2$) for hole injection, when viewed from the top. Light is detected on the side of from the glass substrate.

The ITO electrode is formed by a sputtering method and has a sheet resistance of 10 $\Omega/cm^2$. The respective organic films are sequentially formed at a degree of vacuum of about $10^{-6}$ Torr in accordance with a vacuum sublimation method and have a film thickness of 30 nm. The Al electrode is formed by a vacuum deposition method and has a film thickness of 100 nm.

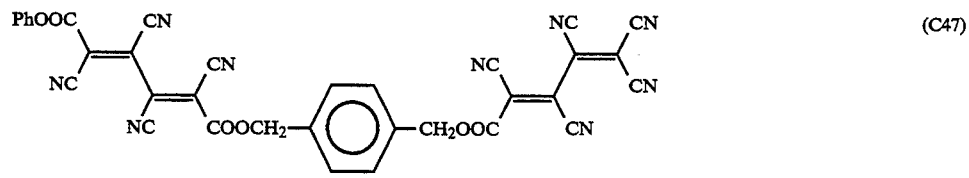

(C47)

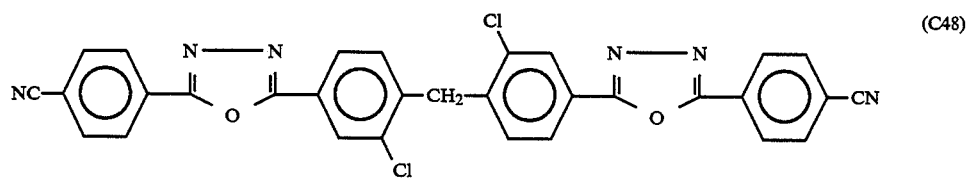

(C48)

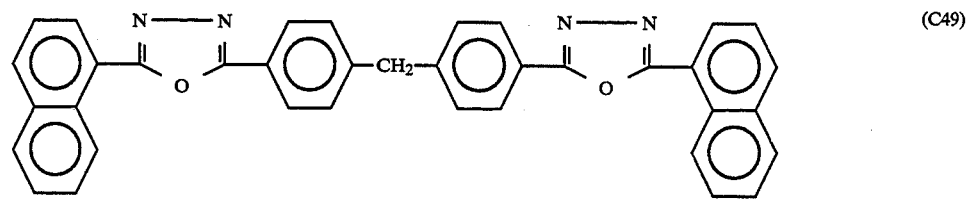

(C49)

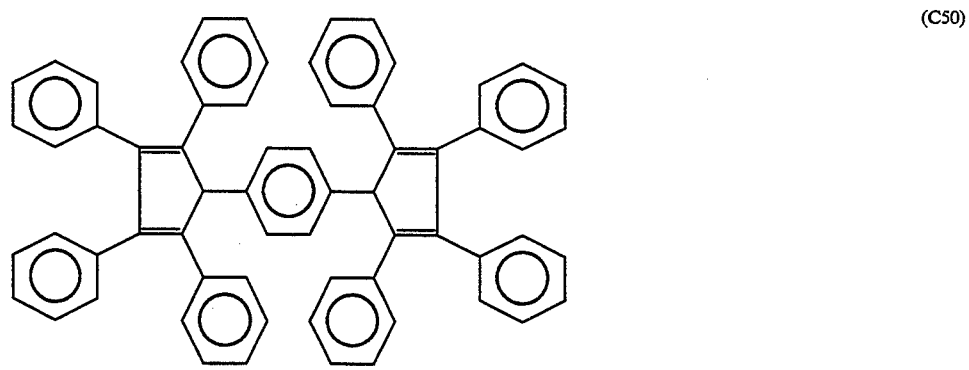

(C50)

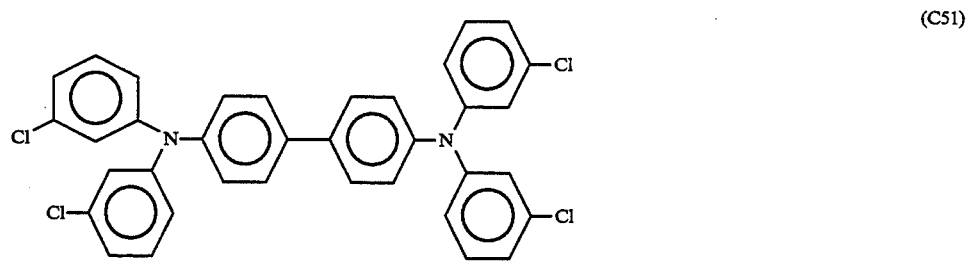

(C51)

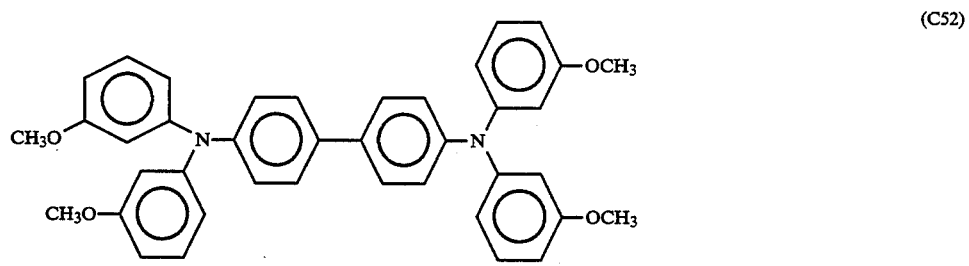

(C52)

The energy differences of the respective layers constituting this device with respect to the vacuum level are confirmed to be the following values in accordance with the displacement current method.

|  | $E_C(E_A)$ | $E_V(I_P)$ | $E_g$ |
| --- | --- | --- | --- |
| Al electrode | $E_{M1} = 4.2$ eV | | |
| $O_{13}$ | 3.9 eV | 7.0 eV | 3.1 eV |
| $O_{14}$ | 3.5 eV | 6.7 eV | 3.2 eV |
| $O_{15}$ | 3.1 eV | 6.6 eV | 3.5 eV |
| L | 3.0 eV | 5.9 eV | 2.9 eV |
| $O_{17}$ | 2.5 eV | 6.0 eV | 3.5 eV |
| $O_{18}$ | 2.0 eV | 5.4 eV | 3.4 eV |
| ITO electrode | $E_{M2} = 4.8$ eV | | |

The band gap of the light-emitting layer is the narrowest. The three organic films are formed on the Al electrode side, and the two organic films are formed on the ITO electrode side. The flat band diagram obtained when these layers form junctions with to each other is shown in FIG. 45.

Figure 46:
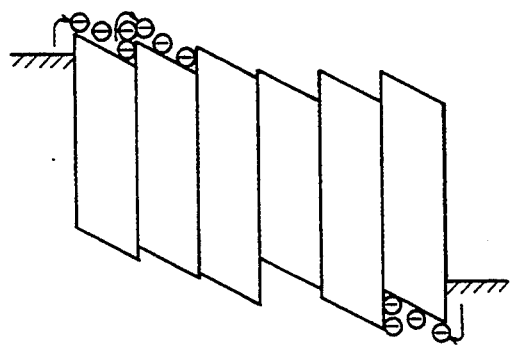
FIG. 46 is a band diagram for explaining the principle of operation when a low bias voltage is applied to the device in FIG. 44.
Figure 47:
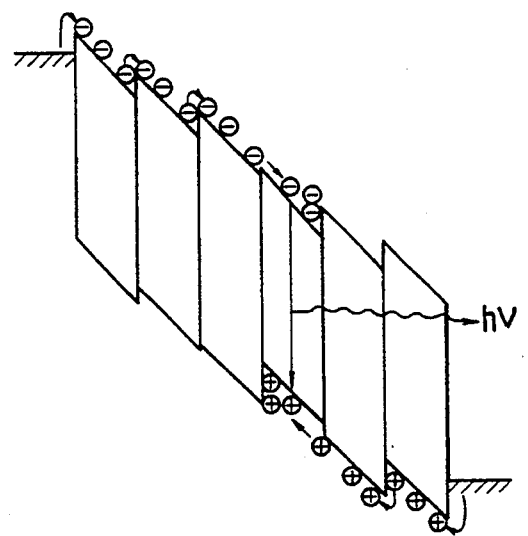
FIG. 47 is a band diagram for explaining the principle of operation when a high bias voltage is applied to the device in FIG. 44.

This device is operated in accordance with the principle shown in FIGS. 46 and 47. A bias voltage is applied to the device such that the ITO electrode is positive. At this time, the electrons are injected from the Al electrode to the organic film $O_{13}$. The electrons are subsequently injected into the organic films $O_{14}$ and $O_{15}$ while forming space-charge layers. At this time, since the harrier against electron injection between the adjacent organic films is low, electron injection can be performed without degrading the efficiency. The electrons injected in the organic film $O_{15}$ are injected in the light-emitting layer beyond the low barrier. However, since the barrier between the light-emitting layer L and the organic film $O_{17}$ is high, the electrons are stored in the light-emitting film L. On the other hand, the holes are injected from the ITO electrode to the organic film $O_{18}$. The holes are injected in the organic films $O_{17}$ while forming a space-charge layer. The holes injected in the organic films 017 are injected in the light-emitting layer beyond the low barrier and recombined with the stored electrons, thereby emitting light.

In this device, when a bias voltage is applied such that the ITO electrode is positive, emission having a luminance of 1,000 cd/cm$^2$ is obtained at a voltage of 5 V and a current density of 30 mA/cm$^2$. At this time, the emission wavelength is 480 nm which corresponds to the band gap of the light-emitting layer L. When this device is left in air, the emission luminance is gradually decreased due to oxidation of the electrode. In order to maintain the initial characteristics of this device, it must be stored in nitrogen or vacuum. The life time of this device is measured to be about 1,000 hours while being operated at a current density of 10 mA/cm$^2$.

EXAMPLE 29

Figure 48:
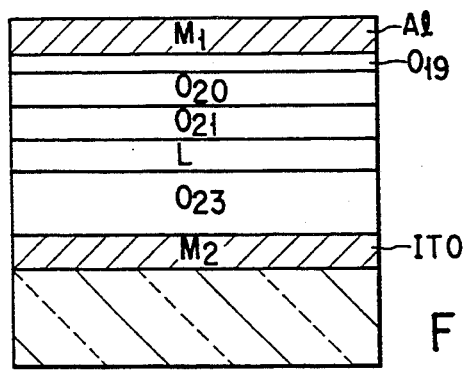
FIG. 48 is a sectional view showing the structure of the organic EL device of Example 29 in the present invention.

An organic EL device shown in FIG. 48 is manufactured in this example. This device comprises an Al electrode ($M_1$) for electron injection, an organic film ($O_{19}$) consisting of an organic compound represented by (C53), an organic film ($O_{20}$) consisting of an organic compound represented by (C54), an organic film ($O_{21}$) consisting of an organic compound represented by (C55), a light-emitting layer (L) consisting of an organic compound represented by (C56), an organic film ($O_{23}$) consisting of an organic compound represented by (C57), and an ITO electrode ($M_2$) for hole injection, when viewed from the top. The thickness of the organic film $O_{19}$ is 5 nm, the thickness of each of the organic film $O_{20}$, the organic film $O_{21}$, and the light-emitting layer L' is 30 nm, and the thickness of the organic film $O_{23}$ is 60 nm.

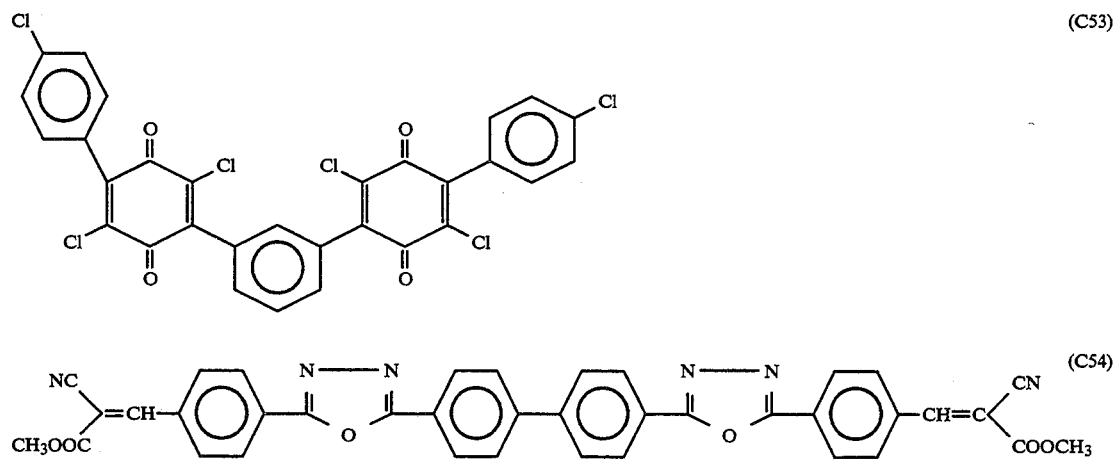

-continued

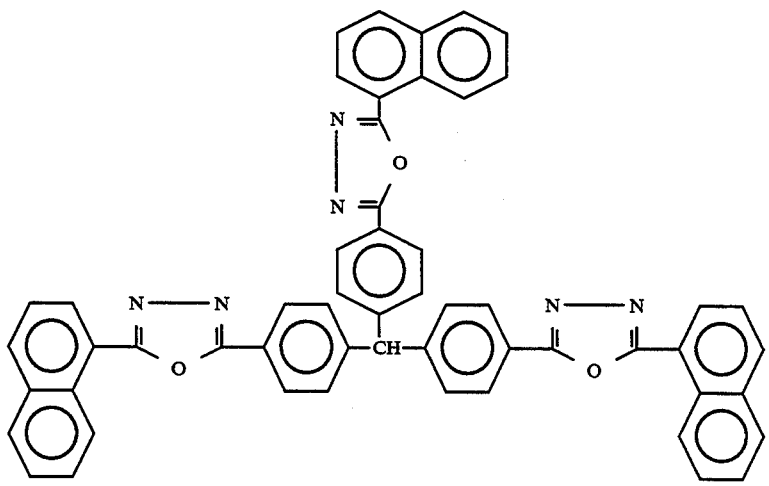
(C55)

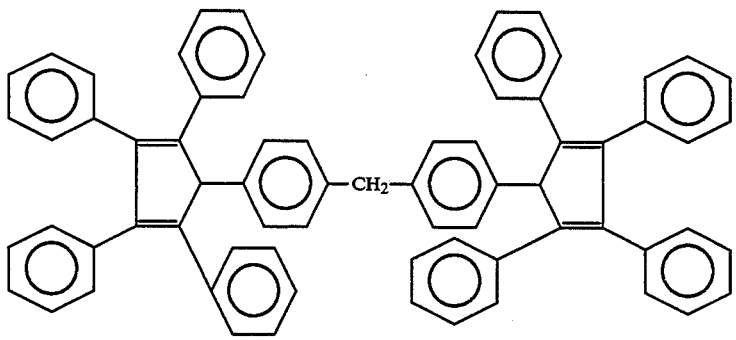
(C56)

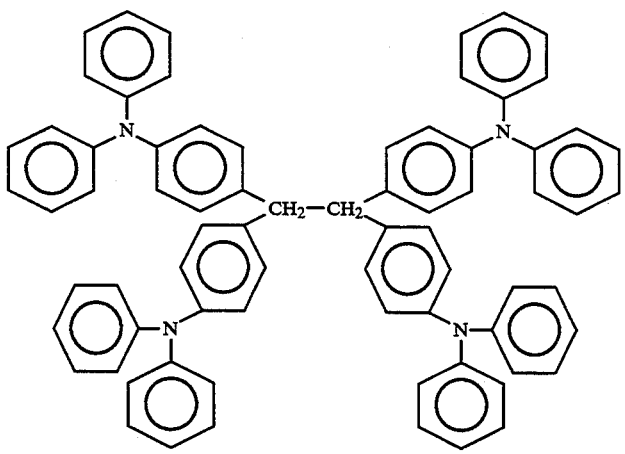
(C57)

The energy differences of the respective layers constituting this device with respect to the vacuum level are confirmed to be the following values in accordance with the displacement current method.

|  | $E_C (E_A)$ | $E_V (I_P)$ | $E_g$ |
| --- | --- | --- | --- |
| Al electrode | $E_{M1}$ = 4.2 eV | | |
| $O_{19}$ | 3.9 eV | 6.4 eV | 2.5 eV |
| $O_{20}$ | 3.4 eV | 6.1 eV | 2.7 eV |
| $O_{21}$ | 3.0 eV | 6.5 eV | 3.5 eV |
| L' | 2.6 eV | 5.8 eV | 3.2 eV |
| $O_{23}$ | 1.5 eV | 5.4 eV | 3.9 eV |
| ITO electrode | $E_{M2}$ = 4.8 eV | | |

Figure 49:
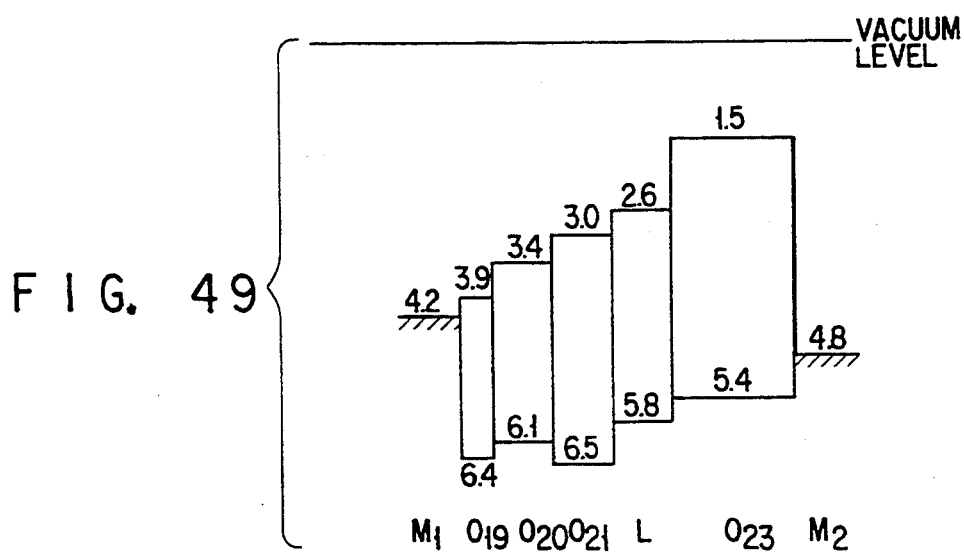
FIG. 49 is a band diagram at a flat band bias in the organic EL device in FIG. 48.

The band gaps of the organic film $O_{19}$ adjacent to the electron injection Al electrode and the organic film $O_{20}$ adjacent thereto are narrower than that of the light-emitting layer. The flat band diagram obtained when these layers form junctions with to each other is shown in FIG. 49.

Figure 50:
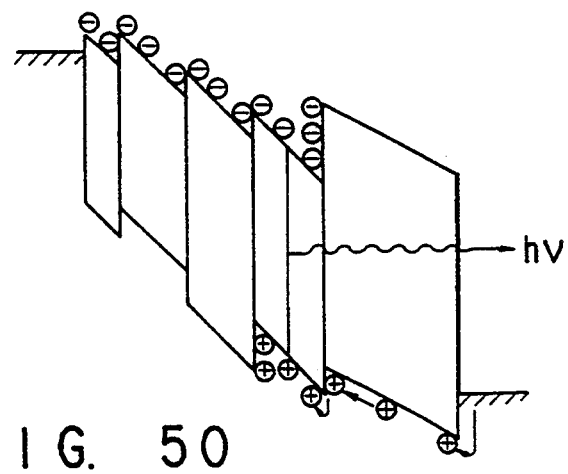
FIG. 50 is a band diagram for explaining the principle of operation in the device in FIG. 48.

This device is operated in accordance with the principle shown in FIG. 50. A bias voltage is applied to the device such that the ITO electrode is positive. At this time, the electrons are injected from the Al electrode to the organic film $O_{19}$. The electrons are subsequently injected into the organic films $O_{20}$ and $O_{21}$ while forming space-charge layers. At this time, since the barrier against electron injection between the adjacent organic films is low, electron injection can be performed without degrading the efficiency. The electrons injected in the organic film $O_{21}$ are injected in the light-emitting layer L' beyond the low barrier. However, since the barrier between the light-emitting layer L and the organic film $O_{23}$ is high, the electrons are stored in the light-emitting film L. On the other hand, the holes are injected from the ITO electrode to the organic film 023. The holes injected in the organic films $O_{23}$ are injected in the light-emitting layer L' beyond the low barrier and recombined with the stored electrons, thereby emitting light.

In this device, when a bias voltage is applied such that the ITO electrode is positive, emission having a luminance of 1,000 cd/cm² is obtained at a voltage of 7 V and a current density of 20 mA/cm². At this time, the emission wavelength is 480 nm which corresponds to the band gap of the light-emitting layer L'. The life time of this device is measured to be about 1,000 hours while being operated at a current density of 10 mA/cm².

EXAMPLE 30

Figure 51:
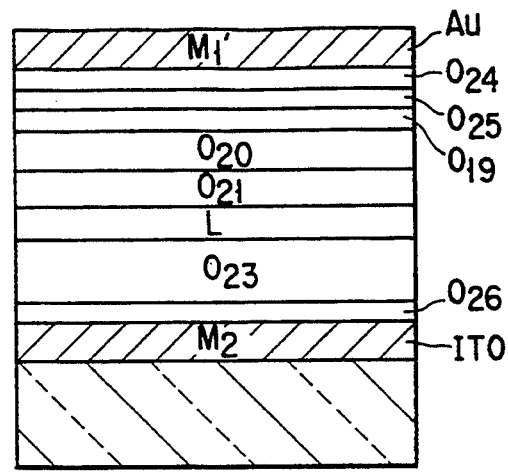
FIG. 51 is a sectional view showing the structure of the organic EL device of Example 30 in the present invention.

An organic EL device shown in FIG. 51 is manufactured in this example. This device comprises an Au electrode ($M_1'$) for electron injection, an organic film ($O_{24}$) consisting of an organic compound represented by (C58), an organic film ($O_{25}$) consisting of an organic compound represented by (C59), an organic film ($O_{19}$) consisting of an organic compound represented by (C53), an organic film ($O_{20}$) consisting of an organic compound represented by (C54), an organic film ($O_{21}$) consisting of an organic compound represented by (C55), a light-emitting film (L) consisting of an organic compound represented by (C56), an organic film ($O_{23}$) consisting of an organic compound represented by (C57), an organic film ($O_{26}$) consisting of an organic compound represented by (C60), and an ITO electrode ($M_2$) for hole injection, when viewed from the top. This device is obtained by adding to the device in Example 29 the organic film $O_{24}$ and the organic film $O_{25}$ on the Au electrode side, and the organic film $O_{26}$ on the ITO electrode side. The film thickness of each additional organic film is 5 nm.

Figure 52:
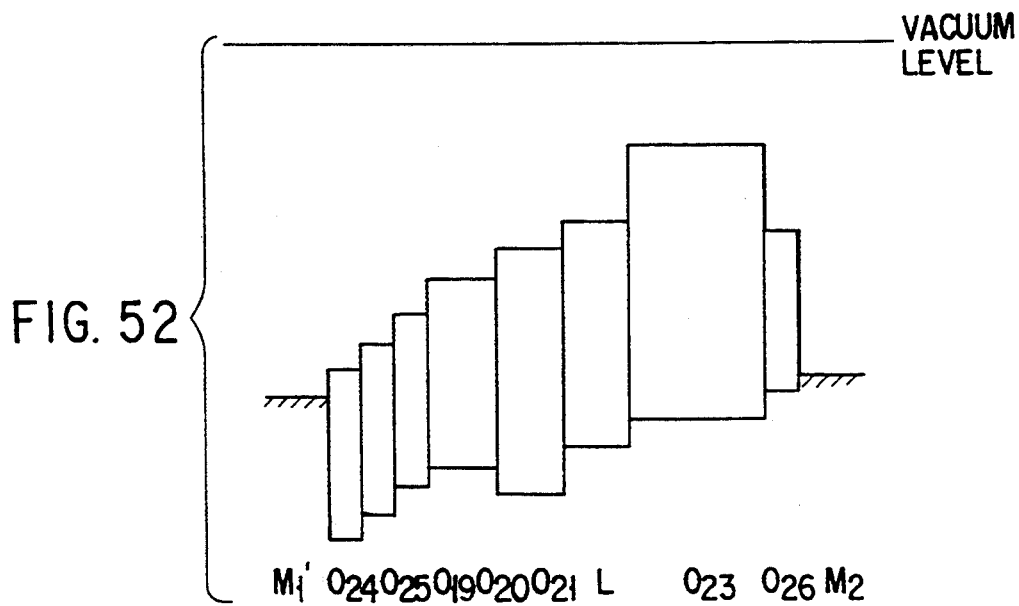
FIG. 52 is a band diagram at a flat band bias in the organic EL device in FIG. 51.

The flat band diagram obtained when these layers form junctions with each other is shown in FIG. 52. The principle of operation is shown in FIG. 53.

In this device, when a bias voltage is applied such that the ITO electrode is positive, emission having a luminance of 500 cd/cm² is obtained at a voltage of 8 V and a current density of 30 mA/cm². At this time, the emission wavelength is 480 nm which corresponds to the band gap of the light-emitting film L'.

Since the metal (Au) having a high work function is used as the electrode for electron injection, chemical changes in electrode can be prevented to prolong the life time of the device. In practice, even if this device is left in air for one or more month, changes in characteristics are not found. The life time of this device is measured to be about 10,000 hours while being operated at a current density of 10 mA/cm².

COMPARATIVE EXAMPLE 7

Emission having a luminance of 700 cd/m² is obtained at a drive voltage of 10 V and a current density of 100 mA/cm² in a device having an organic three-layered structure of Mg·Ag/PBD (electron transport film)/tetraphenylbutadiene (light-emitting film)/TDA (positive hole transport film)/ITO, described in C. Adachi, T. Tsutsui, S. Saito, Appl. Phys. Lett., 56,799 (1990).

No description about the life time is made in the reference. However, the life time of 10 to 1,000 hours is generally given at a current density of 10 mA/cm² when an Mg·Ag electrode is used.

When Au or Cu is used as the electrode for electron injection in a conventional structure, a current density of 1 mA/cm² or more cannot be obtained even with an application of a drive voltage of 50 V, and no emission occurs. When a drive voltage exceeds 50 V, the device is short-circuited and broken.

As compared with the characteristics of this conventional device, the organic EL devices according to the present invention are excellent in at least one of the drive voltage, luminance, and life time characteristics.

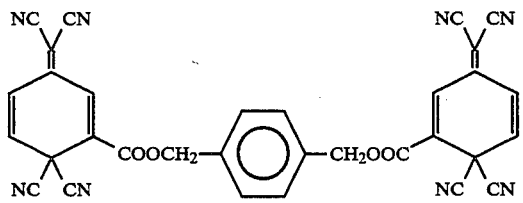

(C58)

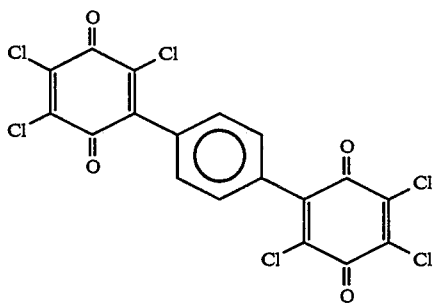

(C59)

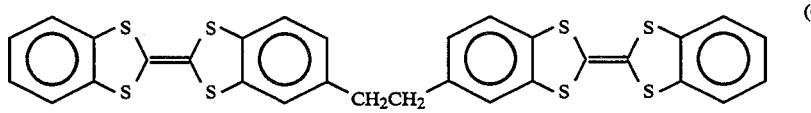

(C60)

EXAMPLE 31

An organic EL device having a multilayered structure having four organic films as in FIG. 35 is manufactured in this example. This device comprises an Al electrode ($M_1$) for electron injection, an organic film consisting of an oxadiazole derivative represented by (C61), an organic film consisting of a tetraphenylethylene derivative represented by (C62), an organic film consisting of a tetraphenylethylene-triphenylamine represented by (C63), an organic film consisting of a triphenylamine derivative represented by (C64), and ITO electrode ($M_2$) for hole injection, when viewed from the top. Light is detected on the side of the glass substrate.

The ITO electrode is formed by a sputtering method and has a sheet resistance of 10 $\Omega/cm^2$. The respective organic films are sequentially formed at a degree of vacuum of about $10^{-6}$ Torr in accordance with a vacuum sublimation method and have a film thickness of 30 nm. The Al electrode is formed by a vacuum deposition method and has a film thickness of 100 nm.

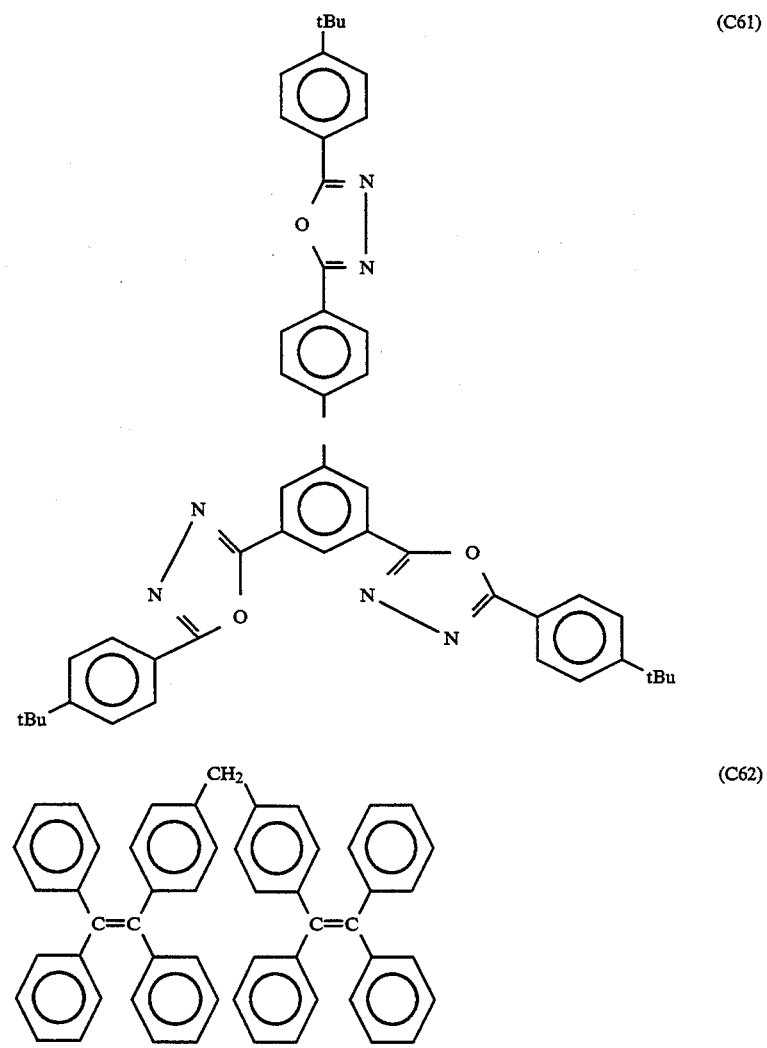

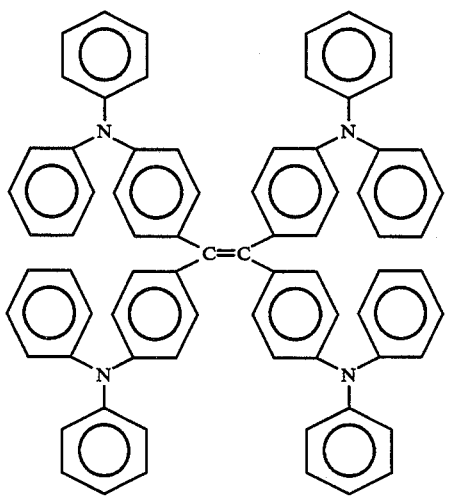
(C63)

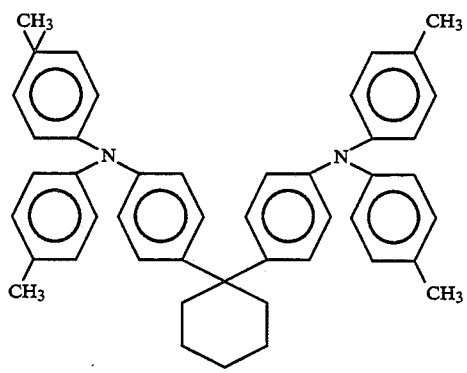
(C64)

In this device, when a bias voltage is applied such that the ITO electrode is positive, green emission having a luminance of 2,000 cd/cm² is obtained at a voltage of 10 V and a current density of 100 mA/cm². At this time, green emission having an emission peak wavelength of 540 nm is obtained. The emission spectrum corresponds to the emission spectrum caused by photoexcitation of the organic film $O_3$.

EXAMPLE 32

An organic EL device having a multilayered structure having five organic films is manufactured in this Example. This device comprises an Al electrode ($M_1$) for electron injection, an organic film consisting of an N-phenylnaphthalenediimide derivative represented by (C65), an organic film consisting of an N-phenylnaphthalenediimide-oxadiazole derivative represented by (C66), an organic film consisting of an oxadiazole derivative represented by (C61), an organic film consisting of a PPCP derivative represented by (C67), an organic film consisting of a triphenylamine derivative represented by (C64), and an ITO electrode ($M_2$) for hole injection, when viewed from the top.

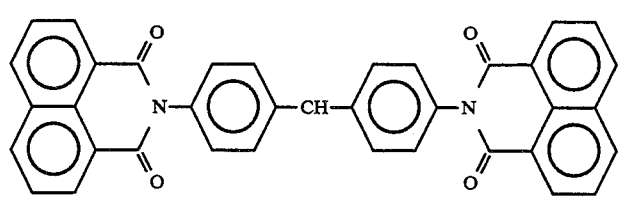
(C65)

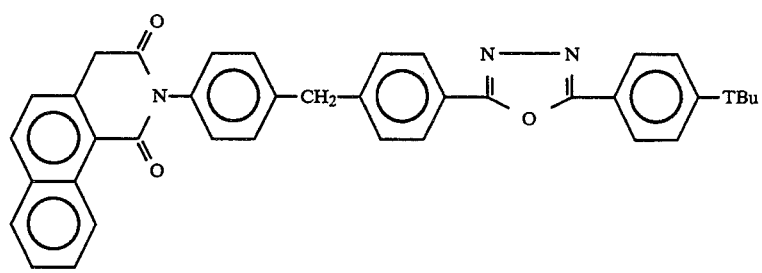
(C66)

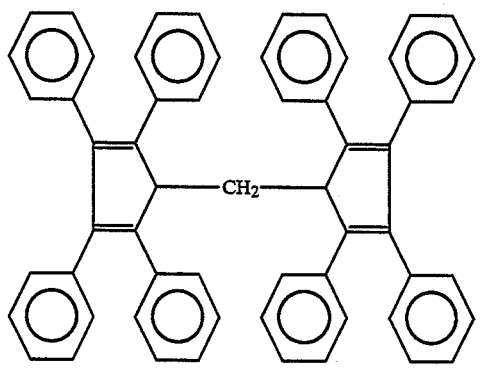

(C67)

In this device, when a bias voltage is applied such that the ITO electrode is positive, blue emission having a luminance of 1,000 cd/cm$^2$ and an emission peak wavelength of 450 nm is obtained at a voltage of 7 V and a current density of 100 mA/cm$^2$. The emission spectrum corresponds to the emission spectrum caused by photo-excitation of the organic film O$_4$.

EXAMPLE 33

An organic EL device having a multilayered structure consisting of five organic films is manufactured in this example. This device comprises an Al electrode (M$_1$) for electron injection, an organic film consisting of an oxadiazole derivative represented by (C68), an organic film consisting of an oxadiazole derivative represented by (C69), an organic film consisting of an oxadiazole derivative represented by (C61), an organic film consisting of a PPCP derivative represented by (C67), an organic film consisting of a triphenylamine derivative represented by (C64), and a an ITO electrode (M$_2$) for hole injection, when viewed from the top.

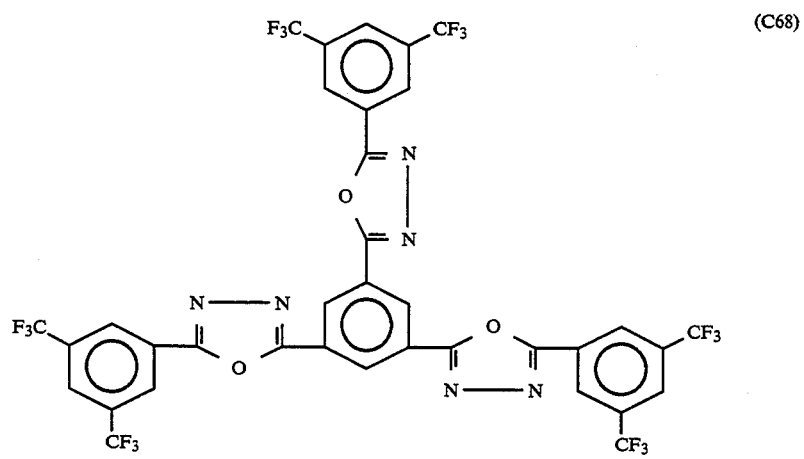

(C68)

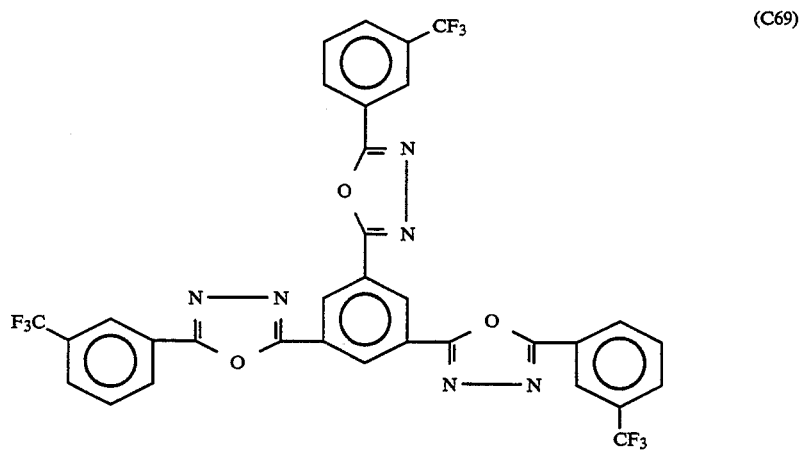

(C69)

The oxadiazole derivatives represented by (C68) and (C69) have different numbers in substituent group-CF$_3$.

In this device, when a bias voltage is applied such that the ITO electrode is positive, blue emission having a luminance of 1,000 cd/cm$^2$ and an emission peak wavelength of 450 nm is obtained at a voltage of 9 V and a current density of 100 mA/cm$^2$. The emission spectrum corresponds to the emission spectrum caused by photo-excitation of the organic film O$_4$.

EXAMPLE 34

First, an organic EL device having a multilayered structure consisting of four organic films is manufactured. This device comprises Cu·Al electrode for electron injection, a first organic film consisting of an organic compound represented by (C70), a second organic film consisting of an organic compound represented by (C71), a third organic film consisting of an organic compound represented by (C72), a fourth organic film consisting of an organic compound represented by (C73), and an ITO electrode for hole injection, when viewed from the top. The respective organic films are sequentially formed by a vacuum sublimation method at a degree of vacuum of about $10^{-6}$ Torr, and each film has a film thickness of 30 nm. The Cu·Al electrode is formed by a vacuum deposition method and had a film thickness of 100 nm. In this device, the electron injection barrier at the interface between the first organic film and the second organic film exceeds 0.6 eV. Even when a bias voltage is applied to this device such that the ITO electrode is positive, it is difficult to increase the current density enough to obtain a sufficiently high emission luminance.

Then, a fifth organic film consisting of (C75) or (C76) and a sixth organic film consisting of (C77) are inserted between the first and second organic films. In (C75) or (C76), three naphthylimide skeletons serving as the basic skeletons for exhibiting electron injection properties in (C70) of the first organic film are combined through benzene or triphenylmethane groups to weaken the electron injection properties (the conduction band level is lowered). The sixth organic film (C77) has a structure in which a naphthylimide skeleton is combined with an oxadiazole group serving as the basic skeleton of the second organic film (C71) through a benzene group. The conduction band level of the sixth organic film is positioned between the fifth and second organic films. By adding the fifth and sixth organic films, blue emission having a luminance of 1,000 cd/m$^2$ and an emission peak wavelength of 450 nm is obtained at a current density of 100 mA/cm$^2$ although an operating voltage is as high as 25 V.

In this device, the barrier against electron injection at the interface between the second and third organic films is close to 0.6 eV. Further, a seventh organic film consisting of (C78) is inserted between the second and third organic films. The (C78) molecule is obtained by combining the oxadiazole group serving as the basic skeleton of the second organic film (C71) and the cyclopentadiene group serving as the basic skeleton of the molecule (C72) of the third organic film. The conduction band level of the seventh organic film can be positioned between the second and third organic films to decrease the electron injection barrier. By adding the seventh organic film, the drive voltage is decreased as low as 15 V, and the luminance is increased to 2,000 cd/m$^2$ at a current density of 100 mA/cm$^2$.

Still further, a device is manufactured such that (C74) is used in place of the first organic film (C70), (C80) is used in place of the fifth organic film (C75) or (C76), and (C80) is used in place of the sixth organic film (C77).

As a result, the drive voltage is decreased as low as 10 V, and the luminance is increased to 4,000 cd/m$^2$ at a current density of 100 mA/cm$^2$.

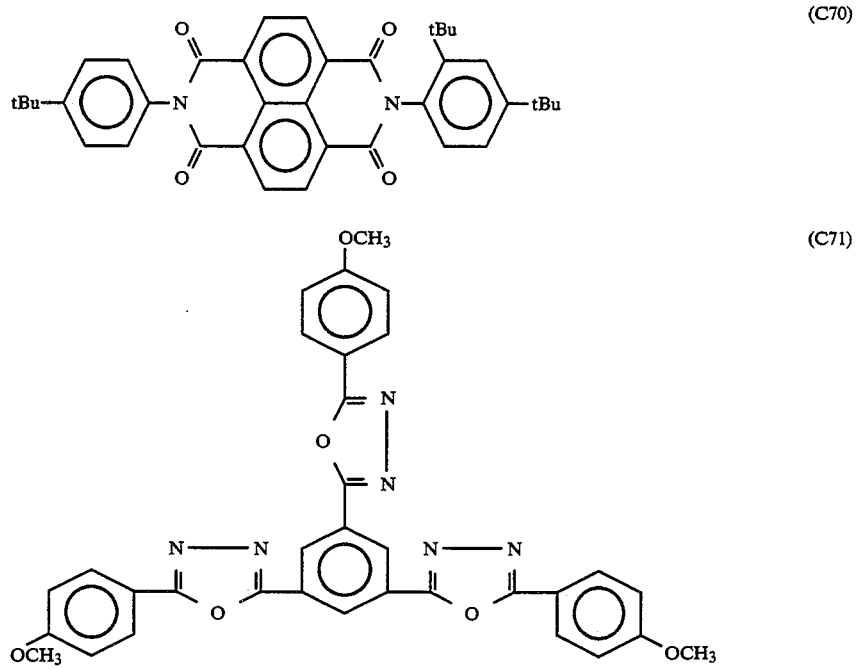

-continued
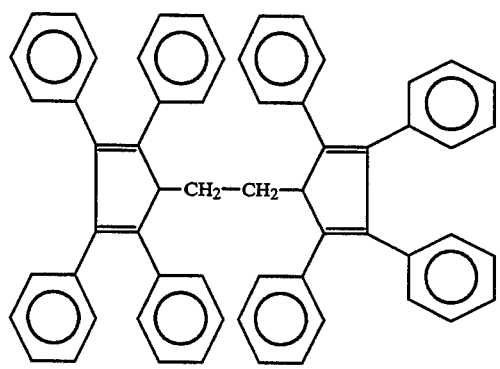 (C72)
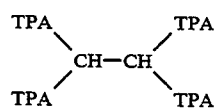 (C73)
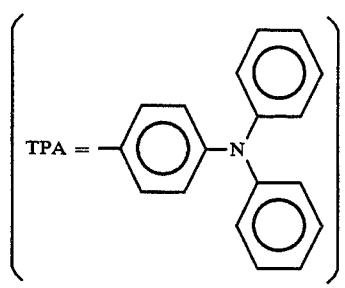
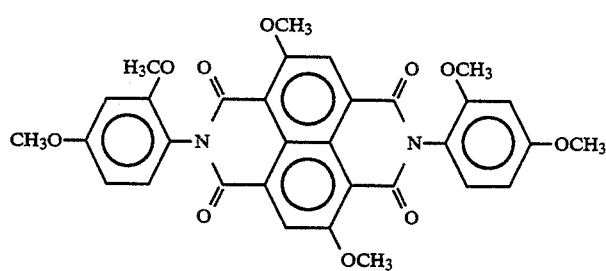 (C74)
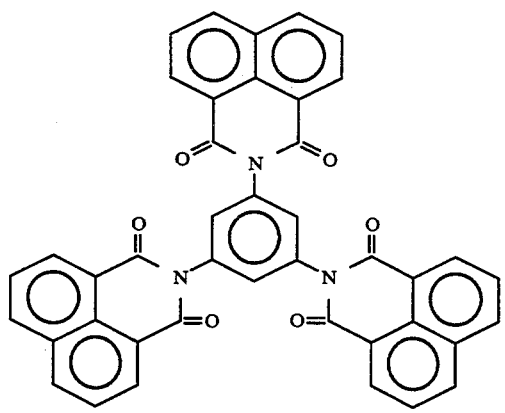 (C75)

-continued
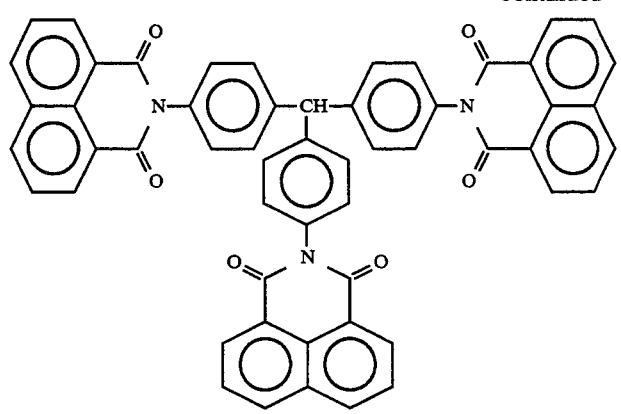
(C76)
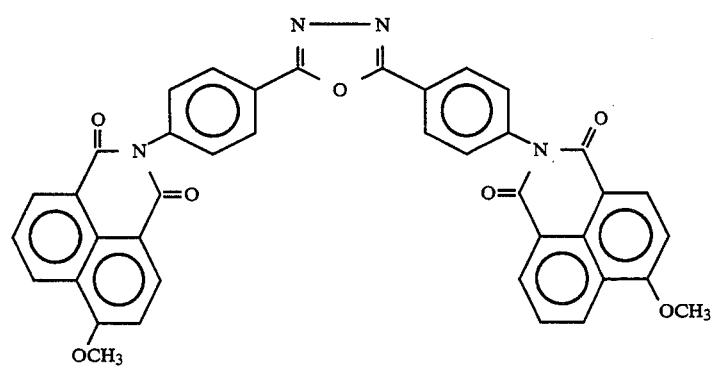
(C77)
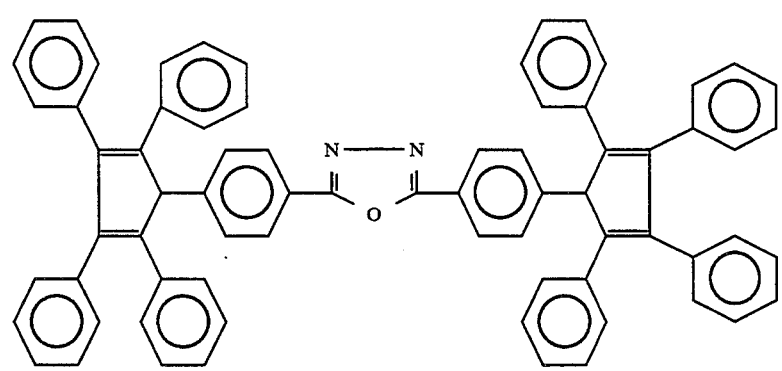
(C78)
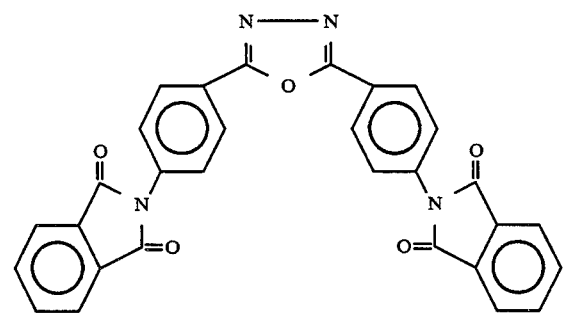
(C79)
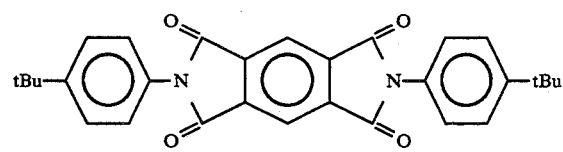
(C80)
EXAMPLE 35
An organic EL device having a structure shown in FIG. 21 is manufactured in this example. This device has three regions, by using an organic compound represented by (C81), i.e., an electron injection layer (EIL) 2 having a crystalline structure, a light-emitting layer (LEL) 3 having an amorphous structure, and a hole injection layer (HIL) having a crystalline structure, between a first electrode 16 consisting of an Al·Ag alloy and a second electrode 12 consisting of an ITO film.

The first electrode 16 is filled like a filament in the first electron injection layer 2 having a crystalline structure to form a field emission electrode.

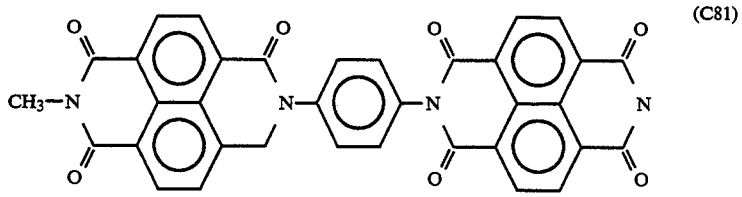
(C81)

This device is manufactured as follows. A 200-nm thick ITO film is formed on a glass substrate 11 which does not contain any alkali component, in accordance with a sputtering method. The substrate having the ITO film is set in an MBE apparatus, and the MBE apparatus is evacuated at a high vacuum of $10^{-10}$ Torr. An organic compound represented by (C81) is deposited on the ITO film at a deposition rate of 0.01 nm/sec. At this time, a 50-nm thick crystalline film is formed at a substrate temperature of 40° C., a 20-nm thick amorphous film is formed by changing the substrate temperature to $-30°$ C., and the substrate temperature is returned to 40° C. to form a 50-nm thick crystalline film again. Finally, a 100-nm thick Al·Ag alloy is formed by the vacuum deposition method.

Crystalline and amorphous films of the organic compound represented by (C81) are formed in advance, and the mobilities of the carriers (electrons and positive holes) are measured by the TOF method. The mobility in the crystalline film is about $10^{-4}$ cm$^2$/V·sec, and the mobility in the amorphous film is about $10^{-10}$ cm$^2$/V·sec.

When a voltage of 15 V is applied to this device, bluish green emission having a wavelength of 500 nm and a luminance of 1,000 cd/m$^2$ is obtained at a current density of 100 mA/cm$^2$.

As a comparative example, a device having a 150-nm thick single-layered organic film having an amorphous structure using the organic compound of (C81) between first and second electrodes is manufactured. This organic EL device requires an drive voltage almost three times that of the device of Example 35 to obtain the same current density. In addition, the device of the comparative example has a lower emission luminance than that of the device of Example 35. The device of the comparative example has a higher short-circuiting probability. Even if short-circuiting does not occur, the life time is greatly shortened.

EXAMPLE 36

An organic EL device shown in FIG. 54 is manufactured in this example. This device comprises a first electrode M$_1$ 36 consisting of Al, a first organic film O$_1$ consisting of an organic compound of (C82) and serving as an electron injection layer 35, a second organic film O$_2$ consisting of an organic compound of (C83) and serving as a light-emitting layer 34, a third organic film O$_3$ consisting of an organic film of (C84) and serving as a hole injection layer 33, a second electrode M$_2$ 32 consisting of an ITO film, and a glass substrate 31, when viewed from the top.

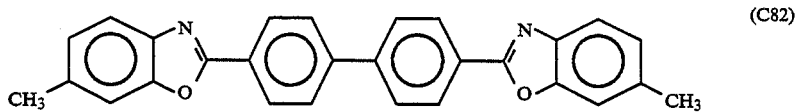
(C82)

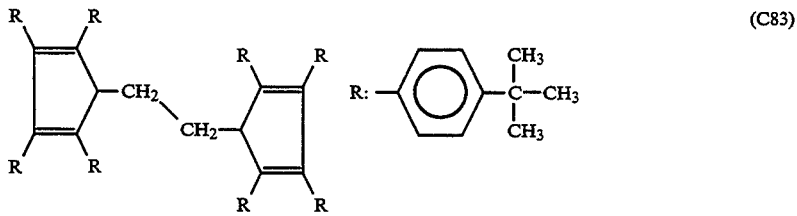
(C83)

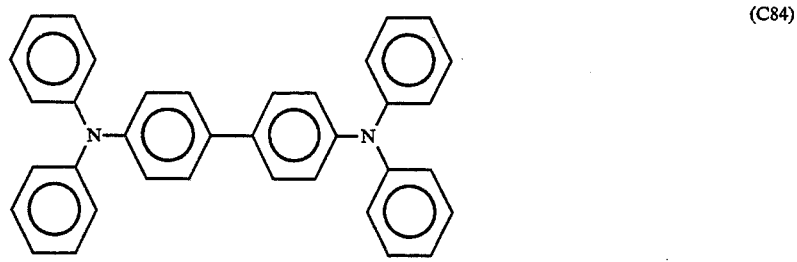
(C84)

This device is manufactured as follows. A 200-nm thick ITO film is formed on a glass substrate 31 which does not contain any alkali component, in accordance with a sputtering method. The substrate having the ITO film is set in a high vacuum deposition apparatus, and the high vacuum deposition apparatus is evacuated at a high vacuum of $10^{-8}$ Torr. The organic compound represented by (C84) is deposited on the ITO to a thickness of 50 nm at a substrate temperature of 25° C. at a rate of 0.01 nm/sec. The organic compound represented by (C83) is formed to a thickness of 30 nm. The organic compound represented by (C82) is formed to a thickness of 50 nm.

Then, a photoresist is formed on the first organic film $O_1$ to a film thickness of 50 nm by a spin coating method and is exposed using a photomask having a dot pattern consisting of dots having a pitch of 15 μm and each having a diameter of 5 μm and developed, thereby forming pin holes each having a diameter of 5 μm in the photoresist. A 100-nm thick Al film is formed by a vacuum deposition method. The metal is filled like a filament having a diameter of 5 μm in the first organic film.

The mobilities of the carriers (electrons and positive holes) are measured by the TOF method in advance. The electron mobility in the first organic film $O_1$ is about $10^{-3}$ cm$^2$/V·sec, the electron mobility in the second organic film $O_2$ is about $10^{-8}$ cm$^2$/V·sec, the hole mobility in the second organic film $O_2$ was about $10^{-10}$ cm$^2$/V·sec, and the hole mobility in the third organic film $O_3$ is about $10^{-4}$ cm$^2$/V·sec.

In Example 36, the energy level at each junction interface with respect to the second electrode $M_2$ and the organic films is optimized in consideration of the electron injection and the hole injection, except the junction interface between the first electrode $M_1$ serves as a field emission electrode and the first organic film $O_1$, as will be described below. Assume that the work functions of the first and second electrodes $M_1$ and $M_2$ are defined as $E_{M1}$ and $E_{M2}$, that the band gap of the first organic film $O_1$ is defined as $E_{g1}$, that the energy differences of the valence and conduction bands from the vacuum level are defined as $E_{V1}$ and $E_{C1}$, that the band gap or the second organic film $O_2$ is defined as $E_{g2}$, that the energy differences of the valence and conduction bands from the vacuum level are defined as $E_{V2}$ and $E_{C2}$, that the band gap of the third organic film $O_3$ is defined as $E_{g3}$, and that the energy differences of the valence and conduction bands from the vacuum level are defined as $E_{V3}$ and $E_{C3}$.

Figure 56:
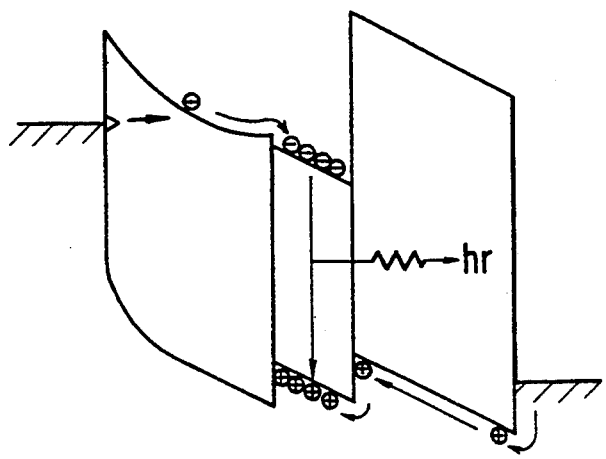
FIG. 56 is a band diagram for explaining the principle of operation in the device in FIG. 54.

FIG. 55 shows Junction states of the device of this example. Although a condition $E_{M1} - E_{C1} > 0.6$ eV is established, i.e., the junction barrier at the interface between the first electrode $M_1$ and the first organic film $O_1$, electrons tend to be injected from the first electrode to the first organic film by applying field emission. In addition, a condition $E_{C1} - E_{C2} \leq 0.6$ eV is satisfied, and the electrons tend to be injected from the first organic film $O_1$ to the second organic film $O_2$. Further, conditions $E_{V3} - E_{M2} \leq 0.6$ eV and $E_{V2} - E_{V3} \leq 0.6$ eV are established, and the positive holes tend to be injected from the second electrode $M_2$ to the second organic film $O_2$ through the third organic film $O_3$. Thus, as shown in FIG. 56, emission also occurs based on the above-mentioned principle in this device.

When a voltage of 10 V is applied to this device, bluish green emission having a wavelength of 500 nm and a luminance of 2,000 cd/m$^2$ is obtained at a current density of 100 mA/cm$^2$.

EXAMPLE 37

An organic EL device obtained by crystallizing the first organic film $O_1$ and the third organic film $O_3$ in Example 36 is manufactured. More specifically, the substrate temperature is raised to 50° C. and the deposition rate is reduced to 0.002 nm/sec in formation of the first and third organic films $O_1$ and $O_3$, thereby slowly growing the films.

The carrier mobilities of the organic films formed under the above conditions are measured by the TOF method in advance. The electron mobility in the first organic film $O_1$ is about 1 cm$^2$/V·sec, and the hole mobility in the third organic film $O_3$ is about $10^{-1}$ cm$^2$/V·sec.

In this device, the drive voltage can be reduced to about ½ that of Example 36.

EXAMPLE 38

Figure 57:
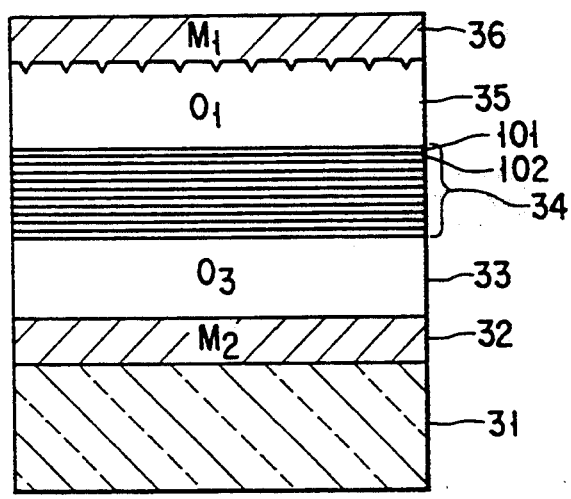
FIG. 57 is a sectional view showing the structure of the organic EL device of Example 38 in the present invention.

An organic EL device shown in FIG. 57 is manufactured in this example. This device comprises a first electrode $M_1$ 36 consisting of Al, a first organic film $O_1$ consisting of an organic compound of (C82) and serving as an electron injection layer 35, a light-emitting layer 34 obtained by alternately stacking an organic film 101 consisting of an organic compound of (C85) and an organic film 102 consisting of an organic compound of (C86), a third organic film $O_3$ consisting of an organic compound of (C84) and serving as a hole injection layer 33, a second electrode $M_2$ 32 consisting of an ITO film, and a glass substrate 31, when viewed form the top.

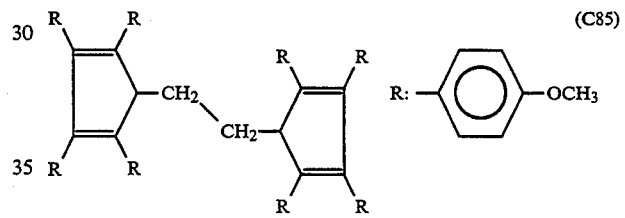

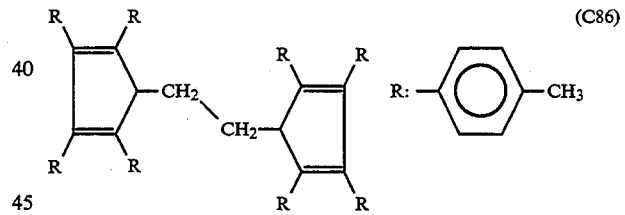

This device is manufactured following the same procedures as in Example 37 except for the light-emitting layer 34. The light-emitting layer 34 is manufactured as follows. A 3-nm thick organic film 101 and then a 3-nm thick organic film 102 are formed at a deposition rate of 0.01 nm/sec, and this process is repeated five times. In addition, a 3-nm thick organic film 101 is formed. The resultant light-emitting layer 34 has a crystalline structure. The electron or hole mobility in each of the two different organic films 101 and 102 constituting the light-emitting layer 34 is about $10^{-2}$ cm$^2$/V·sec.

FIG. 58 shows junction states of the device of this example. The band gaps of the two different organic films 101 and 102 constituting the light-emitting layer are defined as $E_{g1}$ and $E_{g2}$, and the energy differences of the valence and conduction bands from the vacuum level are defined as $E_{V1}$, $E_{C1}$, $E_{V2}$, and $E_{C2}$. In the device of this example, $E_{g1} = 2.1$ eV, $E_{g2} = 2.5$ eV, $E_{V1} = 5.8$ eV, $E_{C1} = 3.7$ eV, $E_{V2} = 6.0$ eV, and $E_{C2} = 3.5$ eV. That is, the band of the light-emitting layer forms a continuous shallow well potential structure. The mobilities of the carriers (electrons and holes) in the light-emitting layer having the continuous well potential structure are measured by the TOF method in advance. Each of the electron and hole mobilities is $10^{-6}$ cm$^2$/V·sec. As shown in FIG. 59, emission also occurs in this device in accordance with the above-mentioned principle.

When a voltage of 5 V is applied to this device, green emission having a wavelength of 550 nm and a luminance of 3,000 cd/m$^2$ is obtained at a current density of 50 mA/cm$^2$.

As a comparative example, a device having a light-emitting layer constituted by only organic film 101 is manufactured. In this organic EL device, an almost identical current density can be obtained when the same voltage as in Example 38 is applied, but the emission luminance is greatly reduced to 200 cd/m$^2$ due to the following reason. In this device, an effect of causing the carriers to reside in the light-emitting layer cannot be obtained, and a probability of causing the carriers to flow in the opposite electrode without recombination is increased.

What is claimed is:

1. An organic electroluminescent device, comprising a multilayered structure consisting of an organic film for electron injection and an organic film for hole injection, at least one of which consists of a plurality of layers, and an organic film serving as a light-emitting layer interposed therebetween, a first electrode for electron injection formed on the side of the organic film for electron injection of the multilayered structure, and a second electrode for hole injection formed on the side of the organic film for hole injection of the multilayered structure, wherein a barrier height against electron injection at each interface between layers present from the first electrode to the organic film serving as the light-emitting layer is not more than 0.6 eV, and a barrier height against hole injection at each interface between layers present from the second electrode to the organic film serving as the light-emitting layer is not more than 0.6 eV.

2. The device according to claim 1, wherein a carrier mobility $\mu_{LEL}$ in the organic film serving as a light-emitting layer and a carrier mobility $\mu_{CIL}$ in the organic film serving as a carrier injection layer satisfy condition $\mu_{CIL}/\mu_{LEL} > 10^4$.

3. The device according to claim 1, wherein a carrier mobility $\mu_{LEL}$ in the organic film serving as a light-emitting layer and a carrier mobility $\mu_{CIL}$ in the organic film serving as a carrier injection layer satisfy condition $\mu_{CIL}/\mu_{LEL} > 10^4$.

4. The device according to claim 1, wherein the barrier height against electron injection at each interface between layers present from the first electrode for electron injection to the organic film serving as the light-emitting layer is not more than 0.4 eV, and the barrier height against hole injection at each interface between layers present from the second electrode for hole injection to the organic film serving as the light-emitting layer is not more than 0.4 eV.

5. The device according to claim 1, wherein a barrier height against electron injection between the organic film serving as the light-emitting layer and the organic film on the side of the second electrode, which directly forms junction with the said organic film serving as the light-emitting layer is not less than 0.6 eV.

6. The device according to claim 1, wherein a barrier height against hole injection between the organic film serving as the light-emitting layer and the organic film on the side of the first electrode, which directly forms junction with the organic film serving as the light-emitting layer is not less than 0.6 eV.

7. The device according to claim 1, wherein a carrier mobility $\mu_{LEL}$ in said light-emitting layer and a carrier mobility $\mu_{CIL}$ in a carrier injection layer satisfy condition $\mu_{CIL}/\mu_{LEL} > 10^4$.

8. The device according to claim 7, wherein the carrier mobility $\mu_{CIL}$ in the carrier injection layer is higher than $10^{-2}$ cm$^2$/V·sec.

9. The device of claim 1, wherein each of said light-emitting film, the adjacent electron injection film and the adjacent hole injection film have a band gap, and said band gap of said light-emitting film is narrower than each of said band gaps of said adjacent electron injection film and said adjacent hole injection film.

10. The device of claim 1, wherein each of a first end organic film, a central organic film thereof and a second end organic film is comprised of a molecule having a basic skeleton, wherein said first end organic film is comprised of a molecule having a first basic skeleton, said second end organic film is comprised of a molecule containing a second basic skeleton, and said central organic film is comprised of a molecule containing both said first basic skeleton and said second basic skeleton.

* * * * *